(12) United States Patent
Onozawa et al.

(10) Patent No.: US 7,719,588 B2
(45) Date of Patent: May 18, 2010

(54) SOLID-STATE IMAGING DEVICE AND CAMERA

(75) Inventors: Kazutoshi Onozawa, Osaka (JP); Kenichi Matsuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 336 days.

(21) Appl. No.: 11/836,265

(22) Filed: Aug. 9, 2007

(65) Prior Publication Data

US 2008/0291303 A1 Nov. 27, 2008

(30) Foreign Application Priority Data

Aug. 10, 2006 (JP) ............... 2006-218838
Apr. 27, 2007 (JP) ............... 2007-119258

(51) Int. Cl.
  *H04N 3/14* (2006.01)
  *H04N 5/335* (2006.01)
  *H01L 21/44* (2006.01)
(52) U.S. Cl. .................. 348/302; 348/294; 438/609
(58) Field of Classification Search ......... 348/294–324; 438/142–308; 257/213–413
  See application file for complete search history.

(56) References Cited

U.S. PATENT DOCUMENTS

| | | | |
|---|---|---|---|
| 6,670,600 B2 * | 12/2003 | Terano et al. | 250/214.1 |
| 7,470,608 B2 * | 12/2008 | Ishibashi et al. | 438/609 |
| 7,515,187 B2 * | 4/2009 | Suzuki | 348/296 |
| 7,529,102 B2 * | 5/2009 | Miyazawa | 361/760 |
| 7,535,509 B2 * | 5/2009 | Takayama | 348/340 |
| 7,575,965 B2 * | 8/2009 | Kuwabara et al. | 438/151 |
| 2005/0275746 A1 | 12/2005 | Nishida et al. | |
| 2006/0077268 A1 * | 4/2006 | Yokozawa | 348/272 |

FOREIGN PATENT DOCUMENTS

JP 2006-032886 2/2006

OTHER PUBLICATIONS

English language Abstract of JP 2006-032886.

* cited by examiner

*Primary Examiner*—Jason Chan
*Assistant Examiner*—Pritham Prabhakher
(74) *Attorney, Agent, or Firm*—Greenblum & Bernstein, P.L.C.

(57) ABSTRACT

Provided is a solid-state imaging device which is able to achieve reductions in size and in thickness of the device, while being also able to have an auxiliary function of imaging lenses, an infrared cut filter, an antireflection function, a dust preventing function for downsizing of packaging, and an infrared light imaging function for capturing images at night. The solid-state imaging device includes: a light-collecting element which collects incident light; and a transparent thin film formed above the light-collecting element, and an air gap is formed between the light-collecting element and the transparent thin film. On the transparent thin film, the auxiliary function of imaging lenses, the infrared cut filter, the antireflection function, the dust preventing function for downsizing of packaging, and the infrared light imaging function for capturing images at night are integrated.

15 Claims, 48 Drawing Sheets

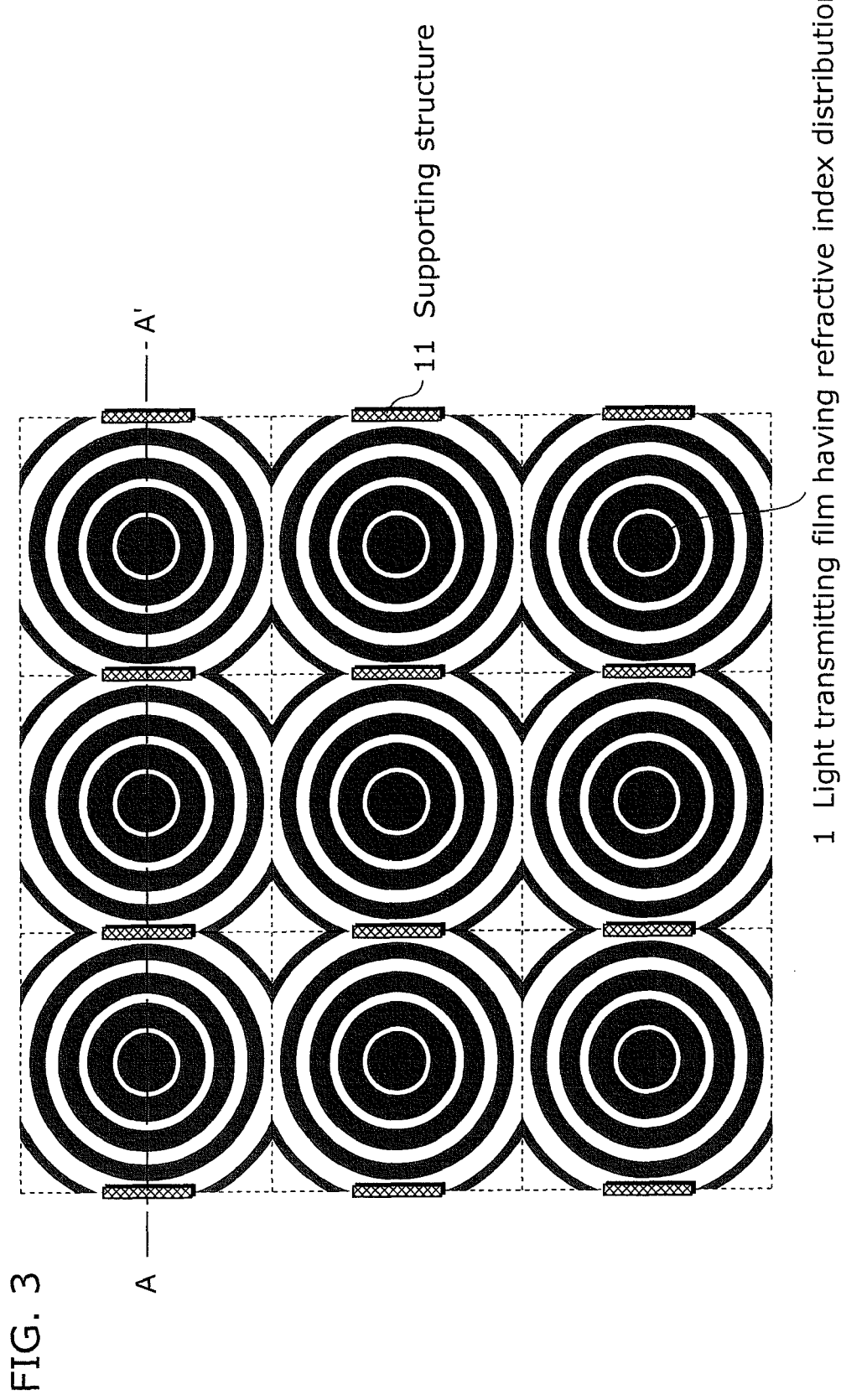

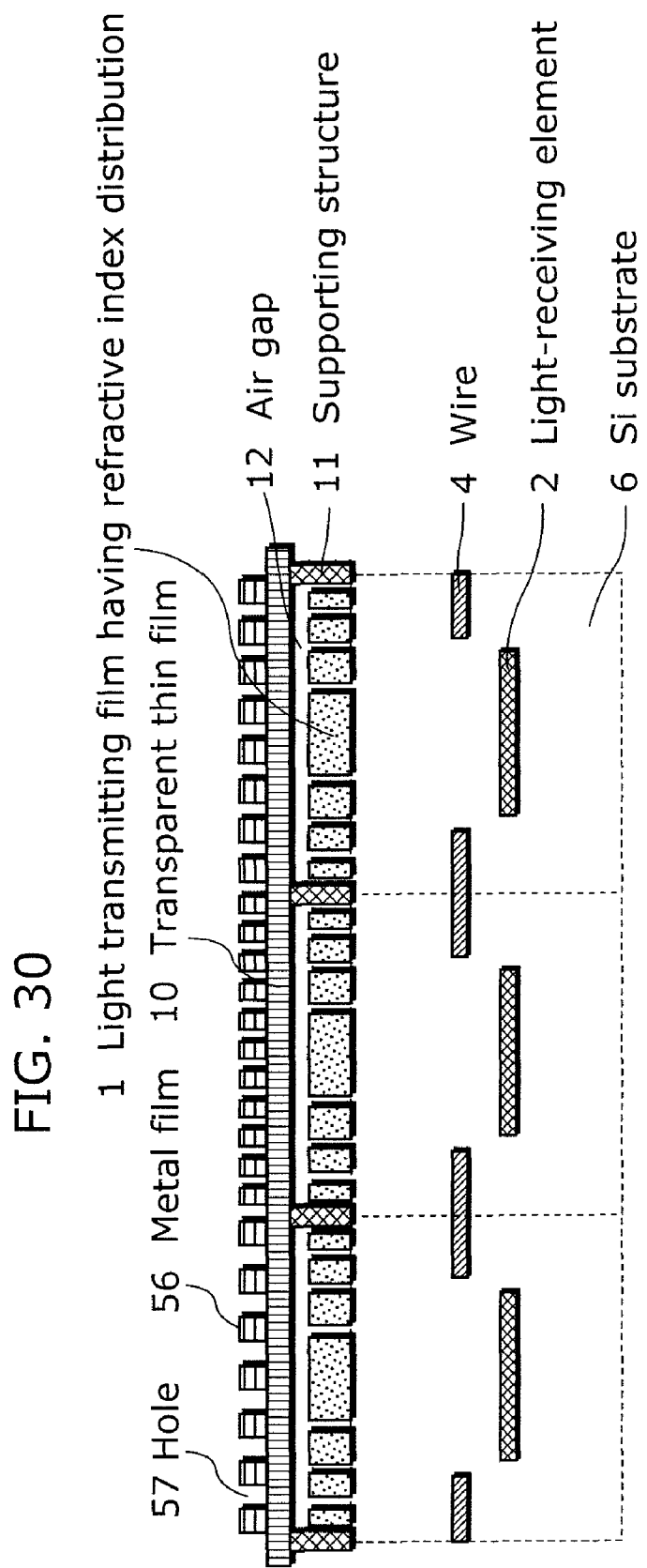

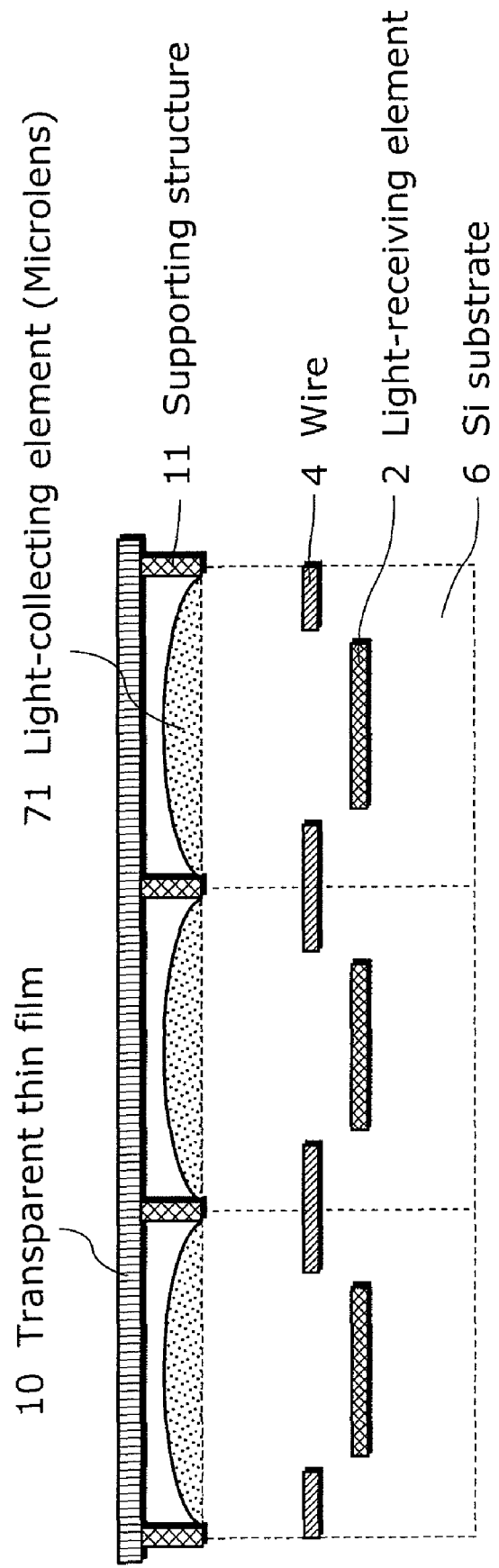

24 Hole
23 Second supporting structure
61 Sealing structure

63 Slit
64 Outflow preventing unit
61 Sealing structure

63 Slit
64 Outflow preventing unit
61 Sealing structure

62 Sealant

SOLID-STATE IMAGING DEVICE AND CAMERA

BACKGROUND OF THE INVENTION (1) Field of the Invention

The present invention relates to a solid-state imaging device which is used in a digital still camera and the like.

(2) Description of the Related Art

Rapid spread of digital still cameras and mobile phones having a built-in camera has permitted a remarkable expansion of the market size of solid-state imaging devices (see FIG. 1). Further, there are increasing demands for reductions in size and in thickness and for an increased number of functions of such digital still cameras and mobile phones having a built-in camera. For example, the reduction in thickness of digital still cameras or mobile phones having a built-in camera requires a reduction in thickness of camera modules of the cameras or mobile phones. The reduction in thickness of the camera modules in turn requires a reduction in the number of imaging lenses, a reduction of infrared cut filters, a reduction of antireflection filters, a reduction in size of packaging, and the like. At the same time, the solid-state imaging devices which are used in various imaging apparatuses used to perform monitoring or to be installed on vehicles, for example, are required to have multi-functions for capturing images at any time of day or night.

Patent Reference 1, Japanese Unexamined Patent Application Publication No. 2006-32886, is an prior art which discloses a solid-state imaging device in which an infrared cut filter and an antireflection filter are integrated on a cover glass of the solid-state imaging device for downsizing its packaging.

However, mere reductions of the number of imaging lenses, the infrared cut filters, or the antireflection filters lead to a degradation of characteristics of the camera module, and thus cannot be achieved easily. Furthermore, since an imaging device which can capture images at night has a different structure, it is extremely difficult to achieve capturing of images day and night with the same device. Moreover, even the technology described in the above mentioned Patent Reference 1 does not achieve a sufficient downsizing of the solid-state imaging device.

SUMMARY OF THE INVENTION

The present invention has been conceived considering the aforementioned problems, and one object of the present invention is to provide a solid-state imaging device which includes an auxiliary function of imaging lenses, an infrared cut filter, an antireflection function, a dust preventing function for downsizing packaging, or an infrared light imaging function for capturing images at night, while being able to achieve a reduction in size and in thickness of the solid-state imaging device.

In order to solve the aforementioned problems, the solid-state imaging device according to the present invention is a solid-state imaging device including: a light-collecting element which collects incident light; and a transparent thin film formed above the light-collecting element, in which an air gap is formed between the light-collecting element and the transparent thin film.

With this structure, since the light-collecting element is protected by the transparent thin film, adhesion of dust and the like to the light-collecting element can be prevented, and also a solid-state imaging device having various functions such as an auxiliary function of imaging lenses on the transparent thin film can be obtained by an integration technology.

Further, the light-collecting element is a light transmitting film having a concentric structure divided by a linewidth equal to or less than a wavelength of the incident light. Therefore, a distributed index type light-collecting element can be obtained in which an effective refractive index can be changed by changing total linewidths of the light transmitting film having the concentric structure.

Also, the transparent thin film further includes at least two or more holes through which a gas flows into or out of the air gap. With this structure, the holes facilitate the supply and discharge of an etching gas to and from a sacrificial layer, which in turn facilitates to form an air gap between the in-plane transparent thin film and the in-plane light transmitting film of unit pixels.

Further, the air gap may be a vacuum or filled with an inert gas, and the holes of the transparent thin film are sealed. Accordingly, it is possible to prevent dew and the like from being formed even when the solid-state imaging device is used at a low temperature.

Furthermore, a thin film is formed on the transparent thin film, the thin film having a refractive index different from a refractive index of the transparent thin film. With this structure, the thin film prevents the reflection from the in-plane transparent thin film of unit pixels.

Further, a multilayer structure is formed on the transparent thin film, the multilayer structure including three or more layers. This structure allows a function of selecting a wavelength to be added to the in-plane transparent thin film of unit pixels.

In addition, cone structures are formed on the transparent thin film, the cone structures each having a diameter smaller than a wavelength of the incident light. With this structure, the antireflection function can be integrated.

Moreover, the solid-state imaging device further includes a supporting structure which is bonded to the transparent thin film and has a height higher than a height of the light-collecting element. This structure facilitates forming of the air gap between the in-plane transparent thin film and the in-plane light-collecting element of unit pixels.

Furthermore, the supporting structure is made of metal. With this structure, selective etching can be performed when etching a metal and a sacrificial layer, and thus forming of the air gap is facilitated between the in-plane transparent thin film and in-plane the light-collecting element of unit pixels. In addition, since metal has a high light blocking effect, light crosstalk and color mixture between pixels can be prevented.

In addition, the supporting structure is made of a dielectric material (especially a dielectric material having a plurality of holes each having a diameter smaller than a wavelength of the incident light). This structure allows a photonic band, that is a forbidden band of light, to be formed, and prevents light crosstalk and color mixture between unit pixels.

Furthermore, the supporting structure is made of a piezoelectric material, and the supporting structure is connected to an oscillator. This structure causes the transparent thin film to vibrate via the supporting structure, so that any dust adhered to the surface can be removed by the vibration.

Moreover, the piezoelectric material may be a ferroelectric material, and a transparent electrode may be formed under the transparent thin film. The piezoelectric material may be a ferroelectric material, or a transparent electrode provided under the transparent thin film.

The present invention may be embodied as a camera that has the above described solid-state imaging device.

A solid-state imaging device of the present invention has an auxiliary function of imaging lenses, an infrared cut filter, an antireflection function, and an infrared light imaging function for capturing images at night, and at the same time has a dust preventing function which is required for downsizing its packaging, and therefore a solid-state imaging device which exhibits extremely high performance while achieving reductions in its size and thickness can be embodied. Furthermore, a digital still camera or a mobile phone having a built-in camera which have the solid-state imaging device can be embodied.

FURTHER INFORMATION ABOUT TECHNICAL BACKGROUND TO THIS APPLICATION

The disclosures of Japanese Patent Application No. 2006-218838 filed on Aug. 10, 2006 and Japanese Patent Application No. 2007-119258 filed on Apr. 27, 2007 including specifications, drawings and claims are incorporated herein by reference in their entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 3 is a diagram showing a schematic top view of the solid-state imaging device according to the first embodiment;

FIG. 30 is a cross-sectional view showing an example of the solid-state imaging device which is colorized using a metal thin film, according to the second embodiment;

FIG. 31 is a diagram showing a basic structure of a solid-state imaging device according to a fifth embodiment;

DESCRIPTION OF PREFERRED EMBODIMENT(S)

Hereinafter, embodiments according to the present invention will be described in detail below with reference to the drawings. Note that the present invention will be explained by way of the following the embodiments and the accompanying drawings, but the explanation is provided only for illustration, and is not intended in any way of limiting the present invention.

First Embodiment

Figure 1:
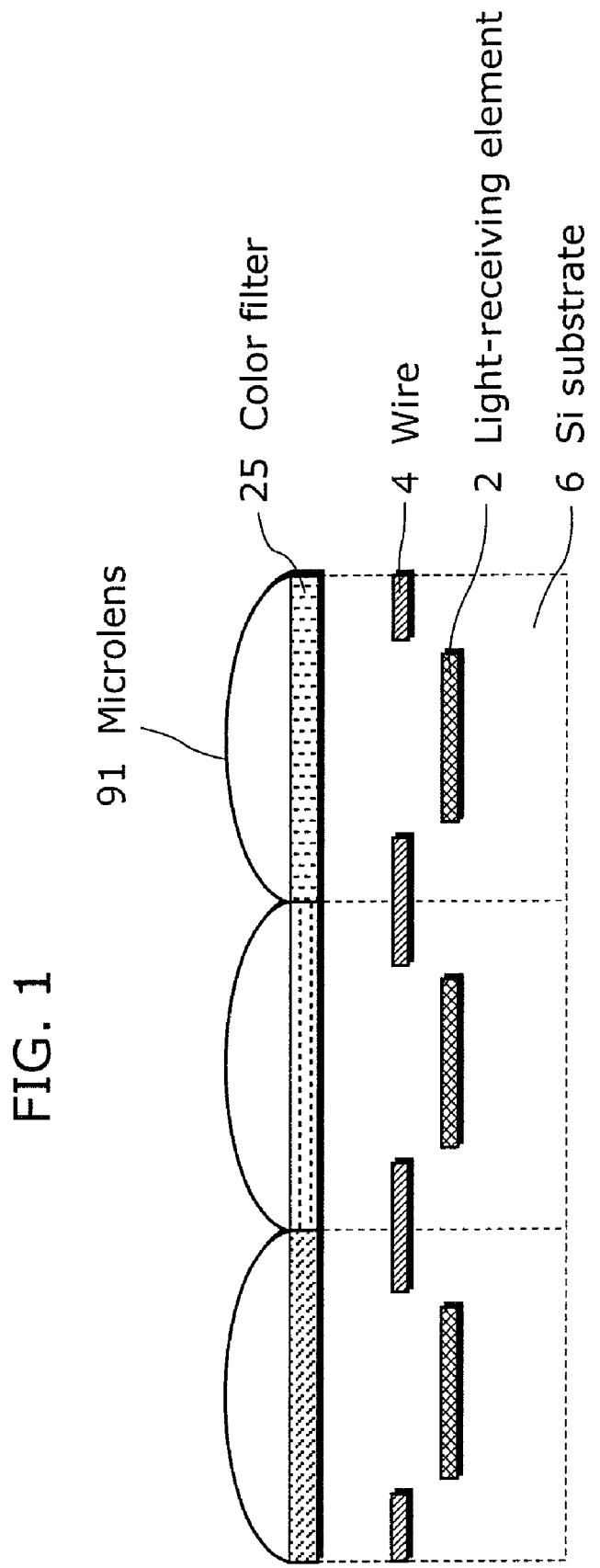
FIG. 1 is a schematic cross-sectional view showing a basic structure of a general solid-state imaging device.
Figure 2:
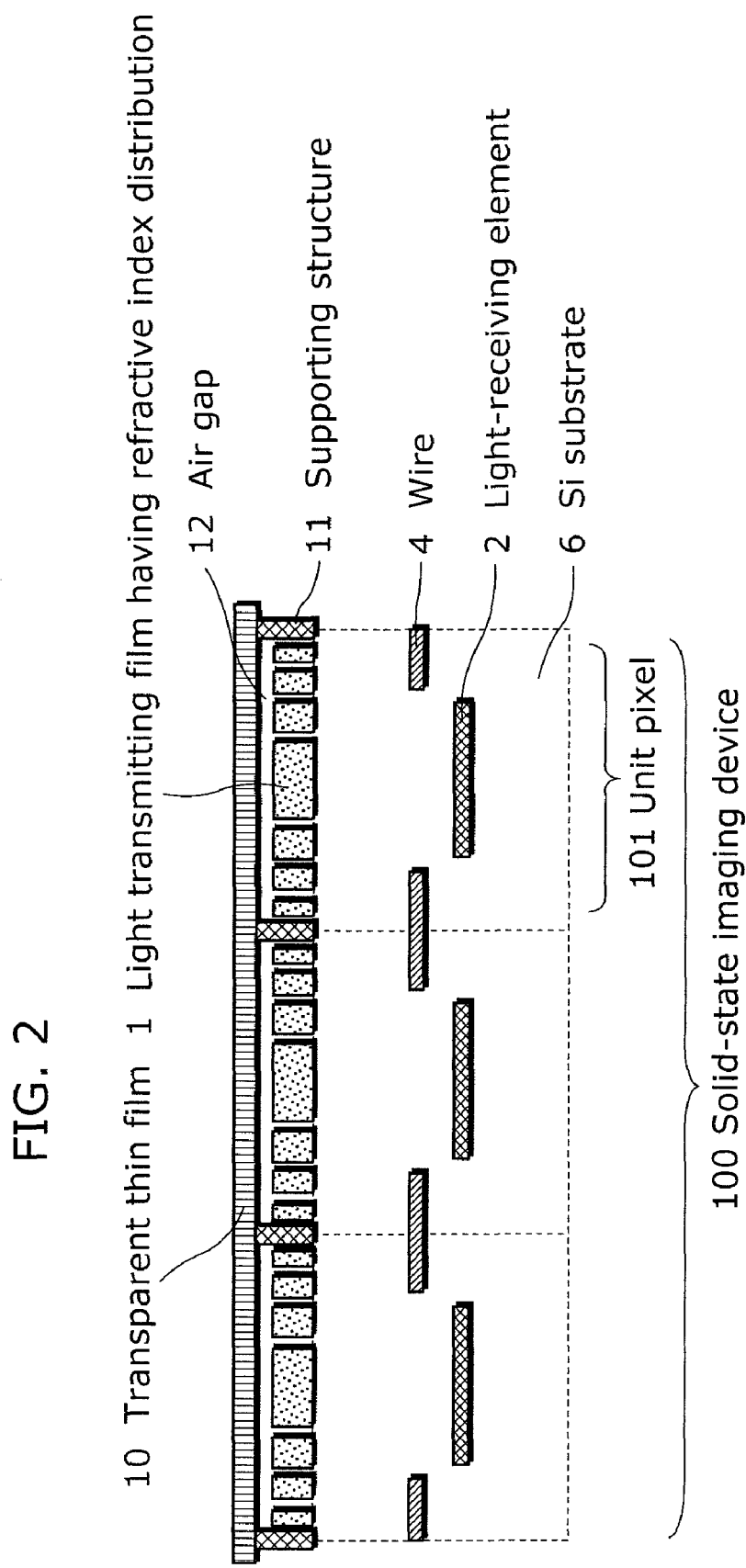
FIG. 2 is a schematic cross-sectional view showing a solid-state imaging device according to a first embodiment.

FIG. 2 is a schematic cross-sectional view showing a solid-state imaging device 100 according to the present embodiment. The solid-state imaging device 100 is an imaging device which is applied to a digital still camera or a mobile phone having a built-in camera for example, and includes unit pixels 101 which are two-dimensionally arrayed (pixel size □ 2.2 μm). Each of the unit pixels 101 has a light transmitting film 1 having a refractive index distribution, a light-receiving element (Si photodiode) 2, a wire 4, an Si substrate 6, a transparent thin film 10, and a supporting structure 11.

As shown in FIG. 2, the light transmitting film 1 having the refractive index distribution is protected by the transparent thin film 10 formed above the film 1, so that adhesion of dust and the like to the light transmitting film 1 having the refractive index distribution can be prevented, and even when any dust is adhered to the light transmitting film at the time of equipping the film with an imaging apparatus, the dust can be easily removed by cleaning the surface of the transparent thin film 10. In addition, an air gap 12 is provided between the transparent thin film 10 and the light transmitting film 1 having the refractive index distribution, thereby any influence of the transparent thin film 10 on the refractive index distribution of the light transmitting film 1 having the refractive index distribution is prevented.

In addition, since the transparent thin film 10 is formed above the light transmitting film 1 having the refractive index distribution, various function elements can be formed on the transparent thin film 10. Furthermore, the light transmitting film 1 having the refractive index distribution, the transparent thin film 10, and the supporting structure 11 are formed in a semiconductor manufacturing process, and thus an assembly process is unnecessary, and the air gap 12 between the transparent thin film 10 and the light transmitting film 1 having the refractive index distribution can be accurately formed. Furthermore, the supporting structure 11 is made of a piezoelectric material so as to cause the transparent thin film 10 to vibrate, and consequently, any dust adhered to the surface can be removed by the vibration. In this case, it is assumed that the supporting structure 11 is connected to an oscillator which is built in the solid-state imaging device 100.

FIG. 3 is a top view showing unit pixels 101 (pixel size □ 2.2 μm) that are two dimensionally arranged. Note that FIG. 2 is a cross-sectional view showing the solid-state imaging device 100 taken along the line A-A' in FIG. 3.

As shown in FIG. 3, the light transmitting film 1 having the refractive index distribution is a distributed index type light-collecting element which is formed in a concentric pattern to have the refractive index distribution so that by changing total linewidths of the patterned light transmitting film, an effective refractive index of the light-collecting element can be changed. The linewidth in this case is equal to or less than a wavelength of incident light.

Next, with reference to FIGS. 4A to 4M, a method for forming the transparent thin film 10 on the light transmitting film 1 having the refractive index distribution will be explained.

Figure 4A:
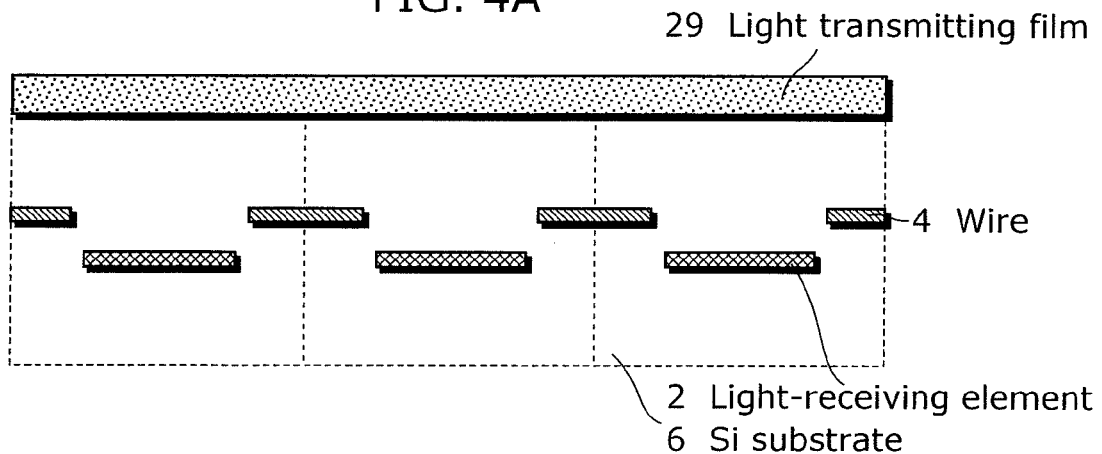
FIG. 4A is a schematic view showing a process of integrating a function element onto the solid-state imaging device according to the first embodiment.

FIG. 4A is a diagram showing a light transmitting film 29 formed on the Si substrate 6 which has basic functions of the solid-state imaging device 100 such as the light-receiving element (Si photodiode) 2 and the wire 4. As the light transmitting film 29, a plasma TEOS ($SiO_2$) film is used, and it is assumed that its a thickness is 1.2 μm.

Figure 4B:
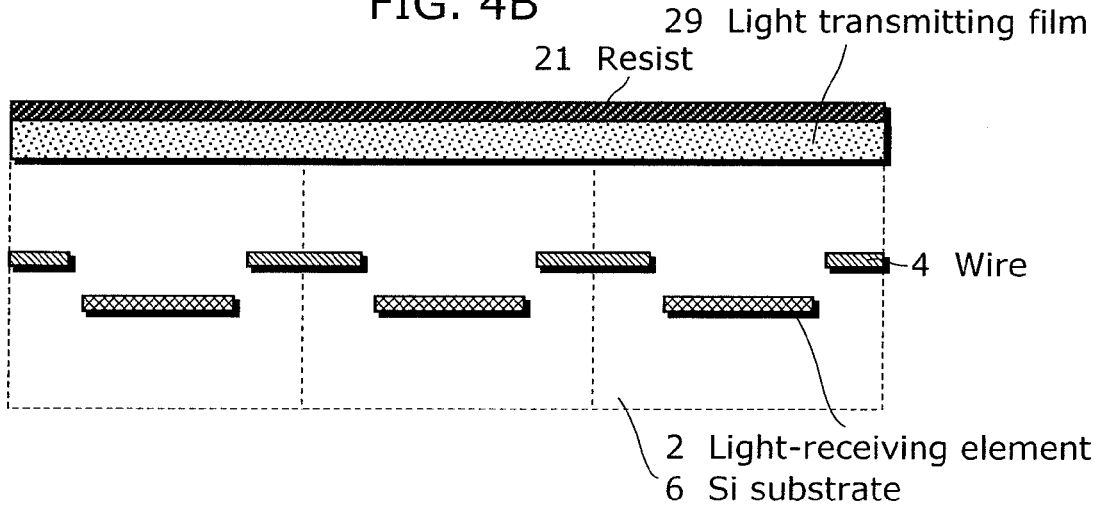
FIG. 4B is a schematic view showing a process of integrating a function element onto the solid-state imaging device according to the first embodiment.
Figure 4C:
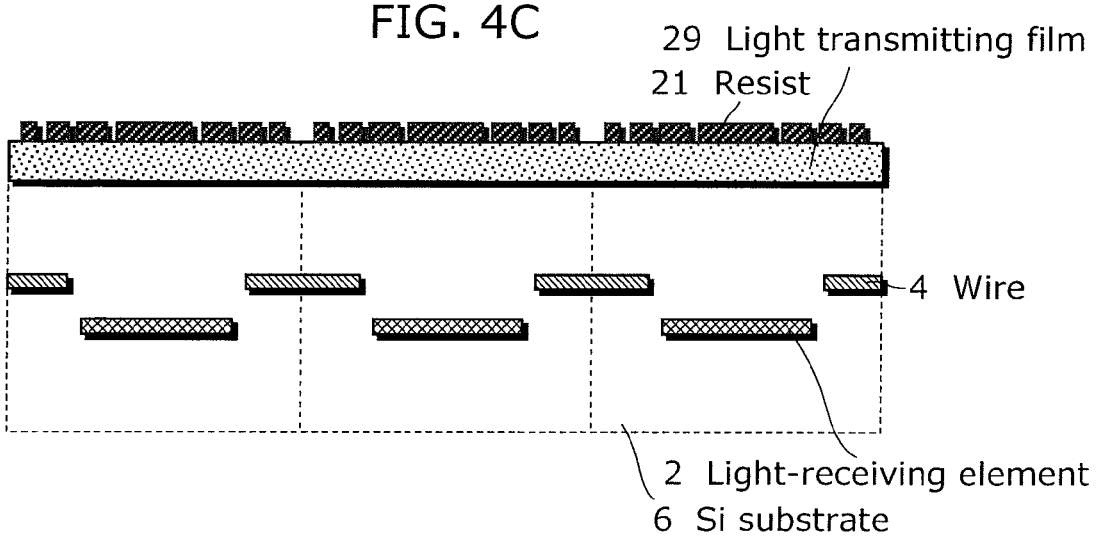
FIG. 4C is a schematic view showing a process of integrating a function element onto the solid-state imaging device according to the first embodiment.
Figure 4D:
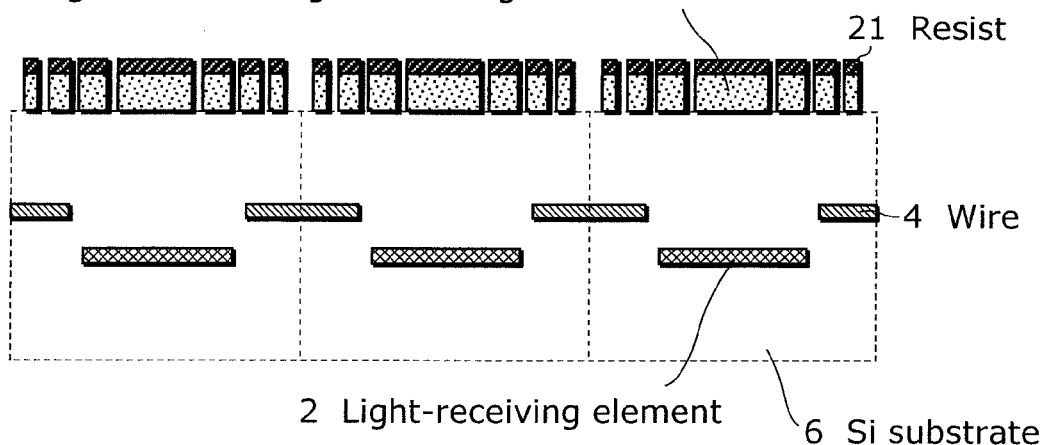
FIG. 4D is a schematic view showing a process of integrating a function element onto the solid-state imaging device according to the first embodiment.
Figure 4E:
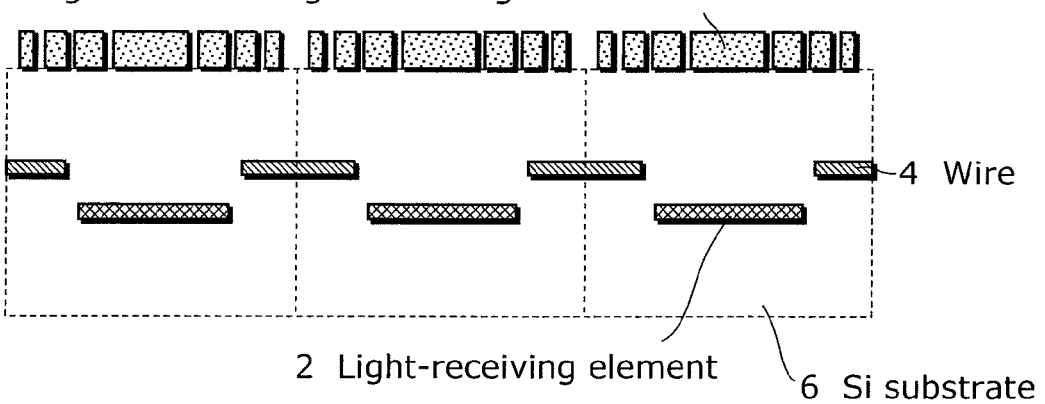
FIG. 4E is a schematic view showing a process of integrating a function element onto the solid-state imaging device according to the first embodiment.

Next, in order to provide the light transmitting film 29 with the refractive index distribution by patterning, as shown in FIG. 4B and FIG. 4C, the light transmitting film 29 is coated with a resist 21, and the resist 21 is patterned by lithography. Then, as shown in FIG. 4D and FIG. 4E, the plasma TEOS film ($SiO_2$) is dry etched with the patterned resist 21 as a mask, using a CF based gas, and the resist is removed. In this way, a light transmitting film having a desired refractive index distribution can be obtained.

Figure 4F:
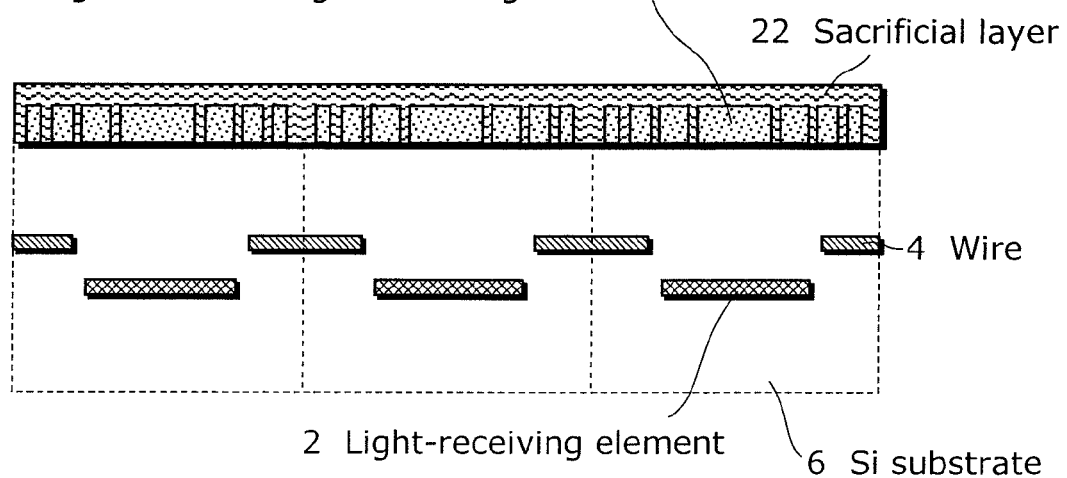
FIG. 4F is a schematic view showing a process of integrating a function element onto the solid-state imaging device according to the first embodiment.
Figure 4G:
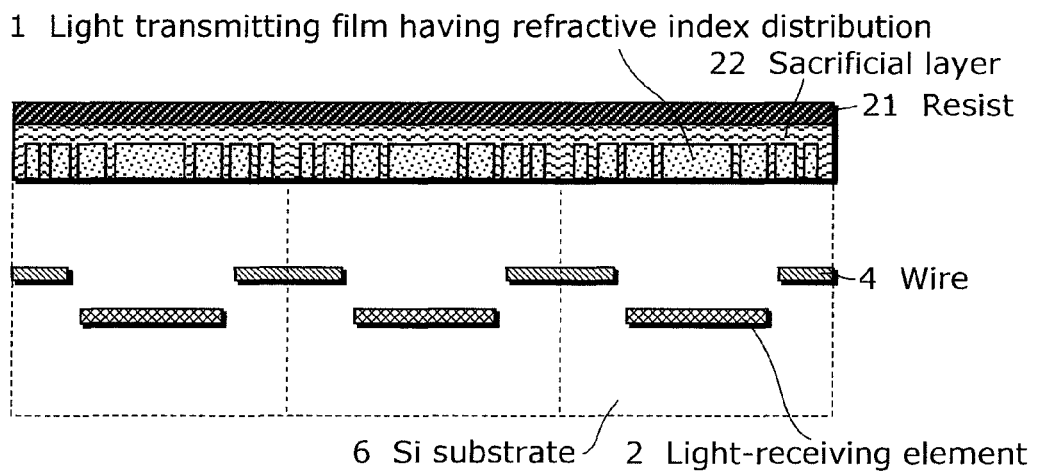
FIG. 4G is a schematic view showing a process of integrating a function element onto the solid-state imaging device according to the first embodiment.
Figure 4H:
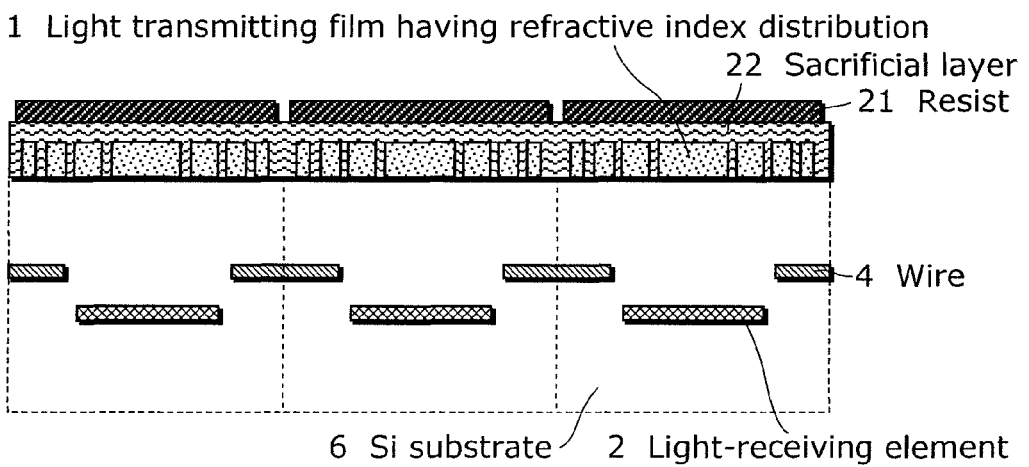
FIG. 4H is a schematic view showing a process of integrating a function element onto the solid-state imaging device according to the first embodiment.
Figure 4I:
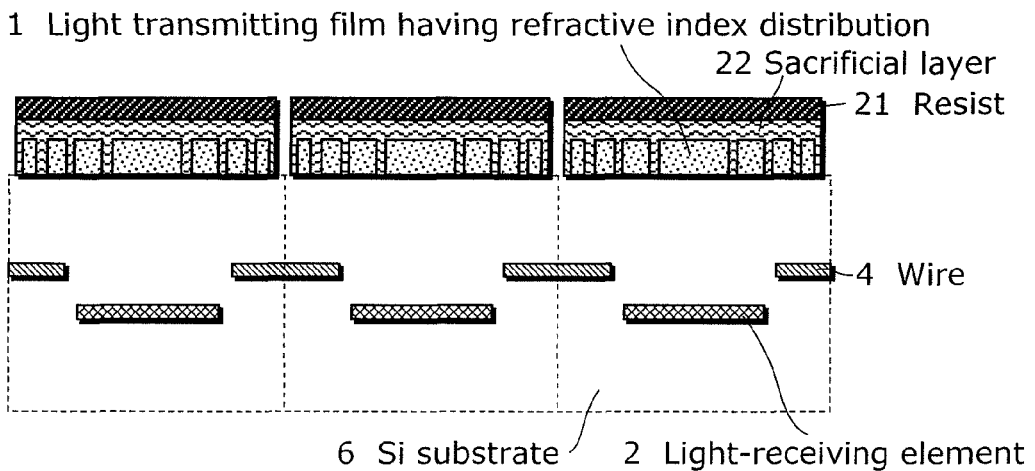
FIG. 4I is a schematic view showing a process of integrating a function element onto the solid-state imaging device according to the first embodiment.
Figure 4J:
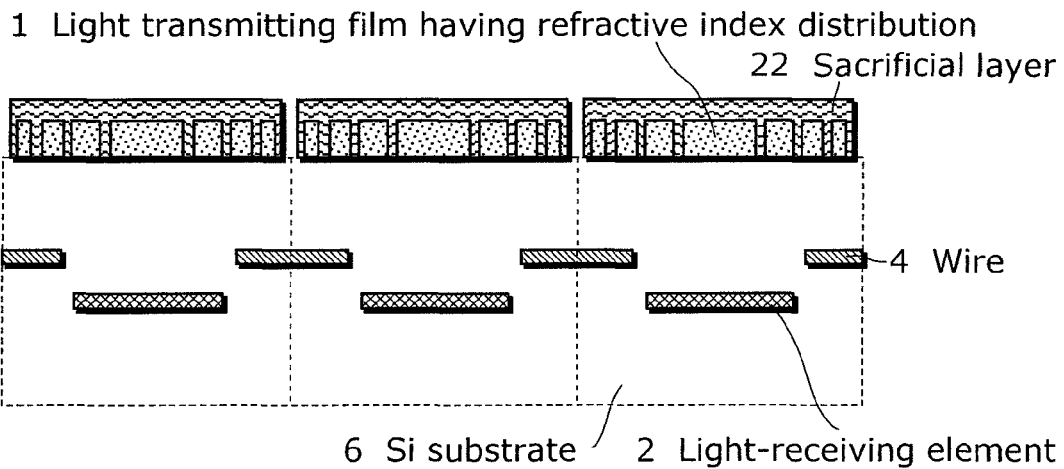
FIG. 4J is a schematic view showing a process of integrating a function element onto the solid-state imaging device according to the first embodiment.
Figure 4K:
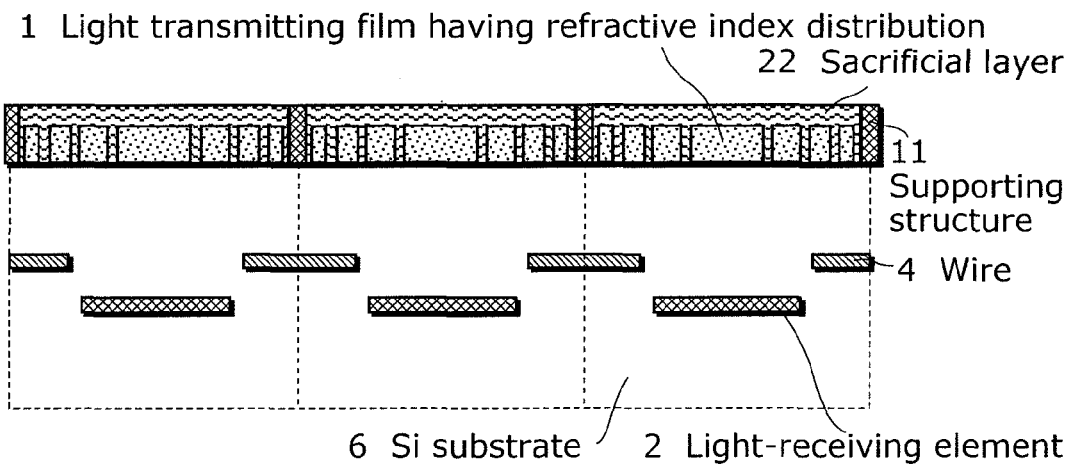
FIG. 4K is a schematic view showing a process of integrating a function element onto the solid-state imaging device according to the first embodiment.

Next, a sacrificial layer 22 is formed on the light transmitting film 1 having the refractive index distribution so as to provide the air gap 12 between the transparent thin film 10 and the light transmitting film 1 having the refractive index distribution. The sacrificial layer 22 is made of polysilicon. As shown in FIG. 4F, the polysilicon film, as a sacrificial layer 22, is deposited on the light transmitting film 1 having the refractive index distribution by plasma Chemical Vapor Deposition (CVD), and is planarized by Chemical Mechanical Polishing (CMP).

Then, the sacrificial layer 22 is patterned so as to form the supporting structure 11. As shown in FIGS. 4G to 4J, the resist 21 is coated on the sacrificial layer 22, and is patterned by lithography. With the patterned resist 21 as a mask, the polysilicon film is dry etched using a Cl based gas or an HBr based gas for example, to form grooves for forming the supporting structure 11, and then the resist 21 is removed.

Next, a material, such as $SiO_2$, SiN, metal, a dielectric material, having a high etching selection ratio to polysilicon is formed by sputtering, CVD, or vapor deposition for example, and is planarized by CMP. In the present embodiment, the supporting structure 11 is made of $SiO_2$. it is necessary that the supporting structure 11 to be embedded has a height higher than the thickness of the light transmitting film 1 having the refractive index distribution. Also, when a piezoelectric material is formed as the supporting structure 11, it is preferable that a ferroelectric material such as PZT is used.

Figure 4L:
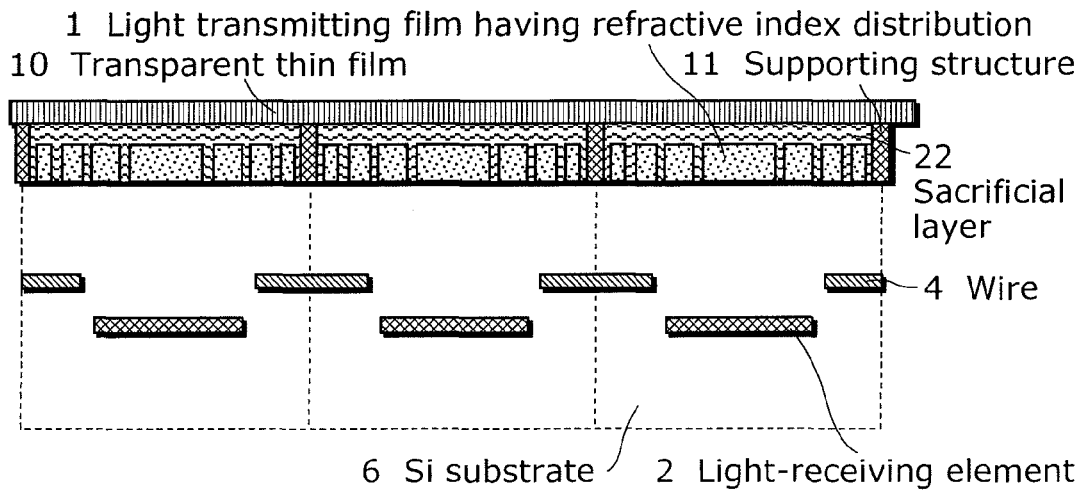
FIG. 4L is a schematic view showing a process of integrating a function element onto the solid-state imaging device according to the first embodiment.

Next, as shown in FIG. 4L, a transparent thin film 10 is formed on the sacrificial layer 22. The transparent thin film 10 is made of $SiO_2$ (n: 1.45) for example, and preferably has a thickness on the order of 0.1 to 1.0 μm.

Also, when the a piezoelectric material is used as the supporting structure 11, Indium Tin Oxide (ITO) and the like is formed as a transparent electrode before the transparent thin film 10 is formed (i.e., a transparent electrode is formed under the transparent thin film 10).

Figure 4M:
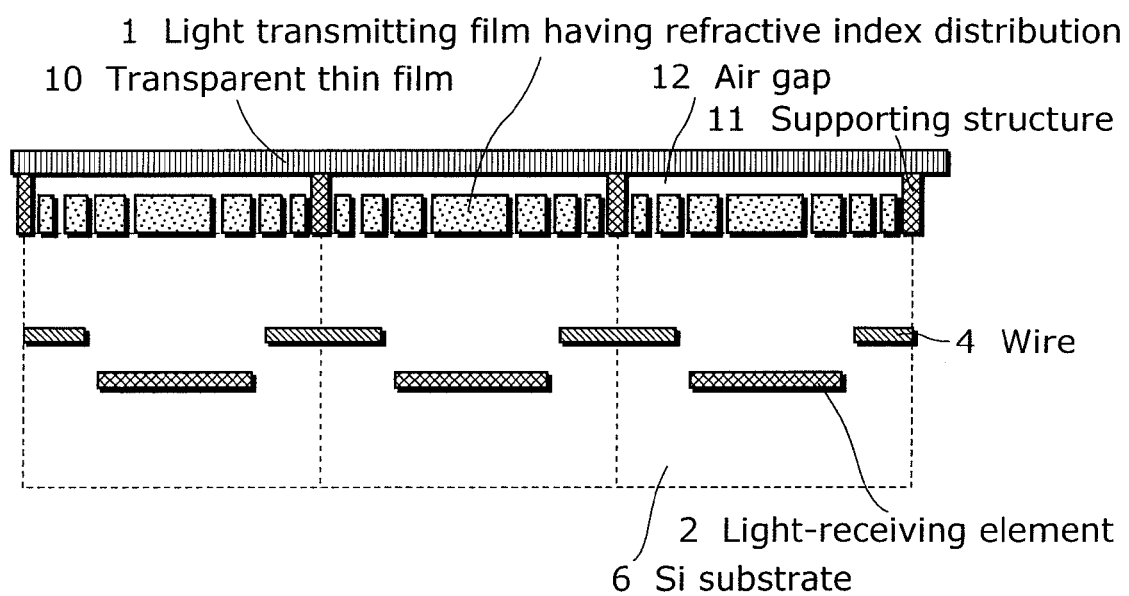
FIG. 4M is a schematic view showing a process of integrating a function element onto the solid-state imaging device according to the first embodiment.
Figure 5:
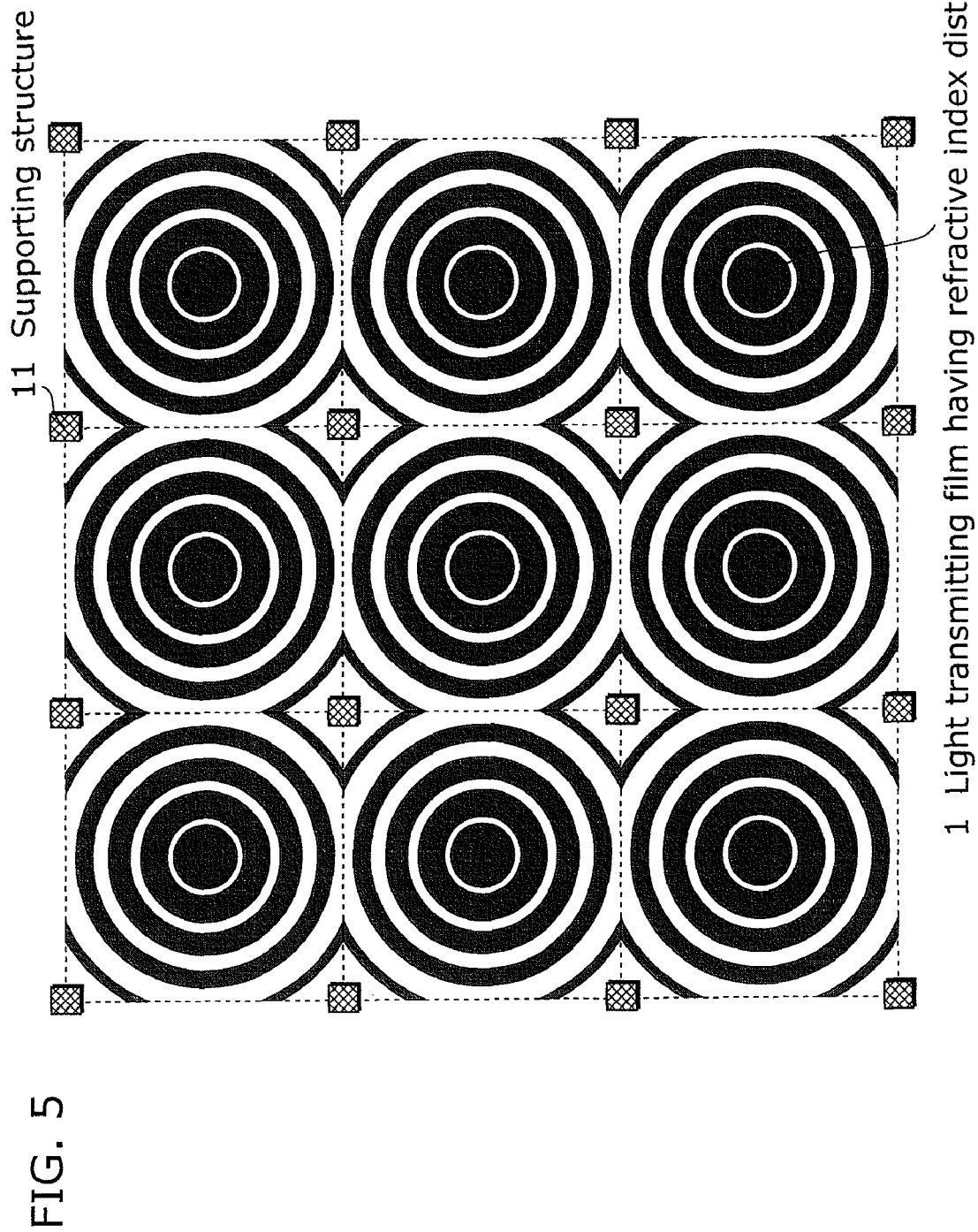
FIG. 5 is a top view showing an example of a layout of supporting structures of the solid-state imaging device according to the first embodiment.
Figure 6:
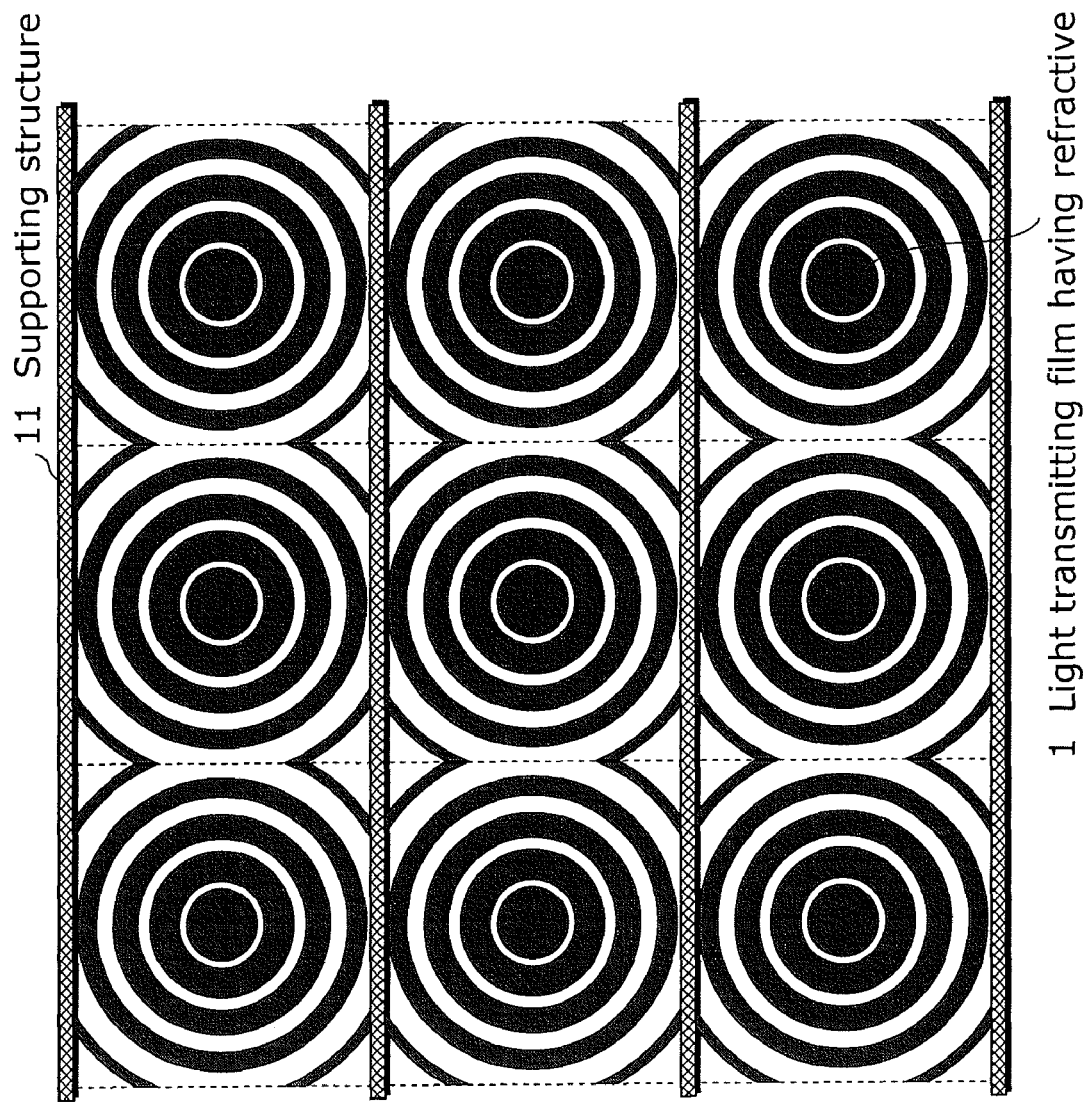
FIG. 6 is a top view showing an example of a layout of supporting structures of the solid-state imaging device according to the first embodiment.
Figure 7:
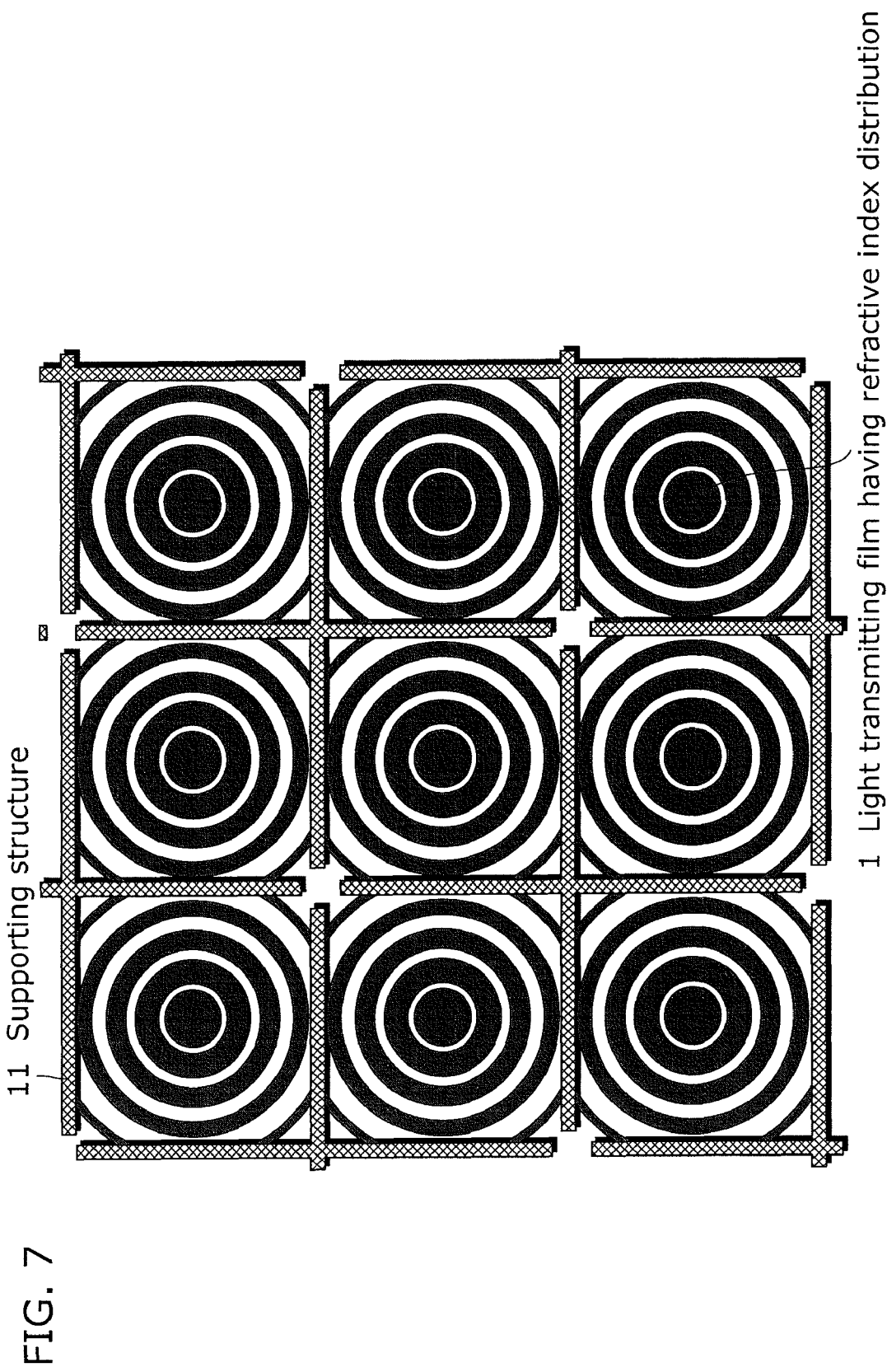
FIG. 7 is a top view showing an example of a layout of supporting structures of the solid-state imaging device according to the first embodiment.
Figure 8:
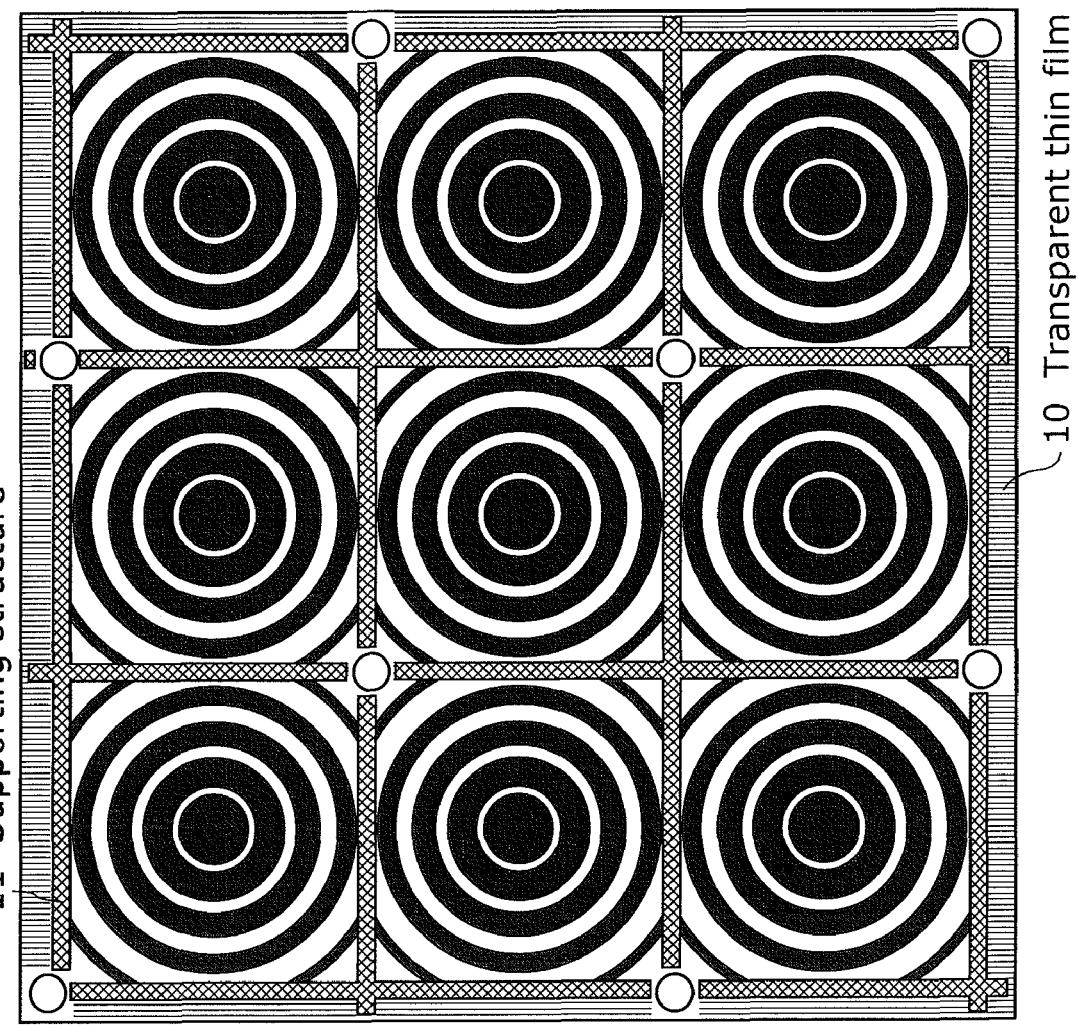
FIG. 8 is a top view showing an example of a layout of supporting structures of the solid-state imaging device according to the first embodiment.

After the transparent thin film 10 is formed, as shown in FIG. 4M, the sacrificial layer 22 is removed by isotropic dry etching so as to form the air gap 12. The gas used in the etching is preferably XeF or ClF$_3$. In addition, it is preferable that the supporting structures 11 which surround the unit pixel 101 are arranged in the layouts shown in the top views of FIGS. 5 to 8 so that the etching gas easily flows.

Figure 9:
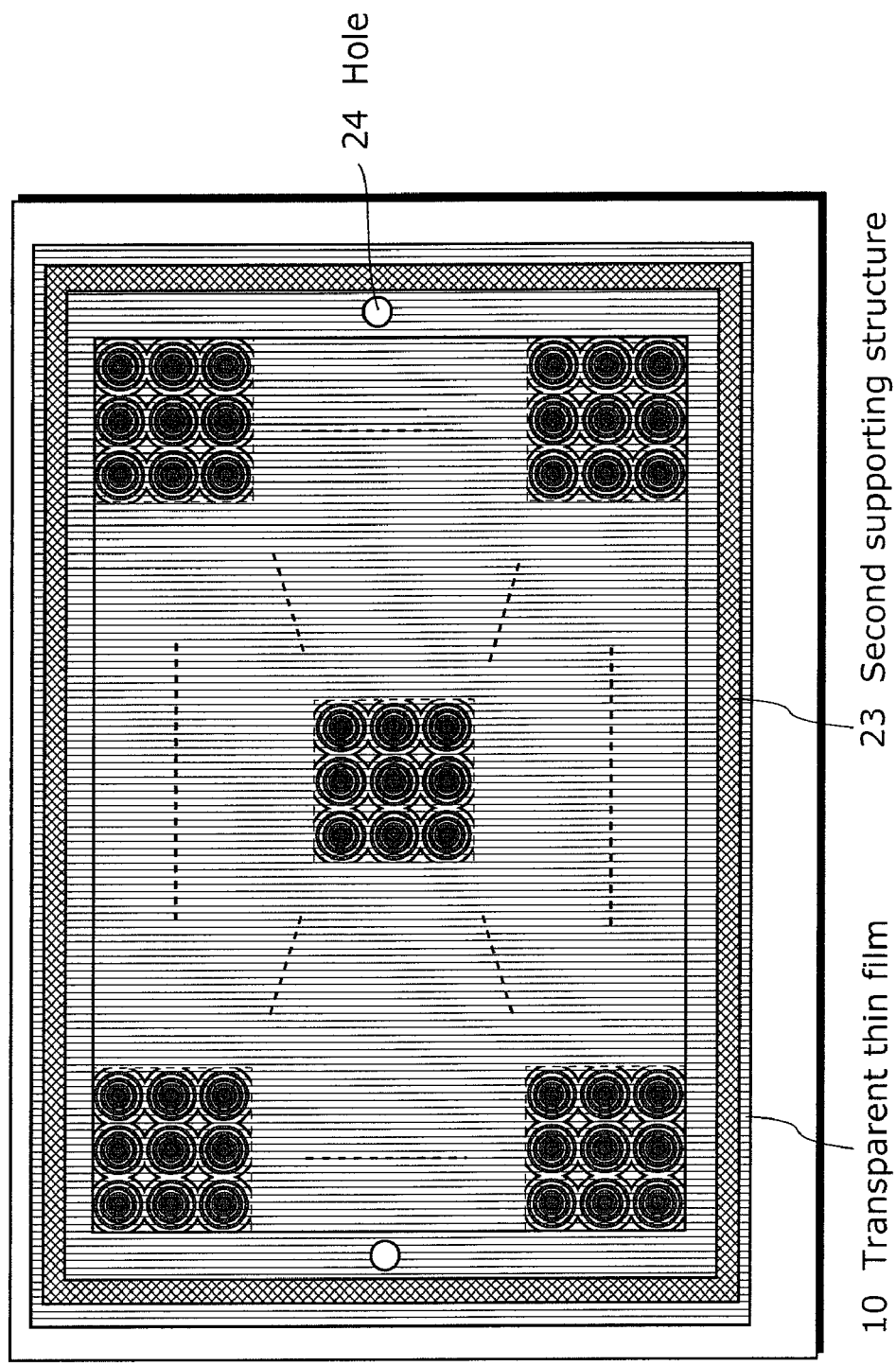
FIG. 9 is a schematic view showing holes for removing a sacrificial layer according to the first embodiment.
Figure 10:
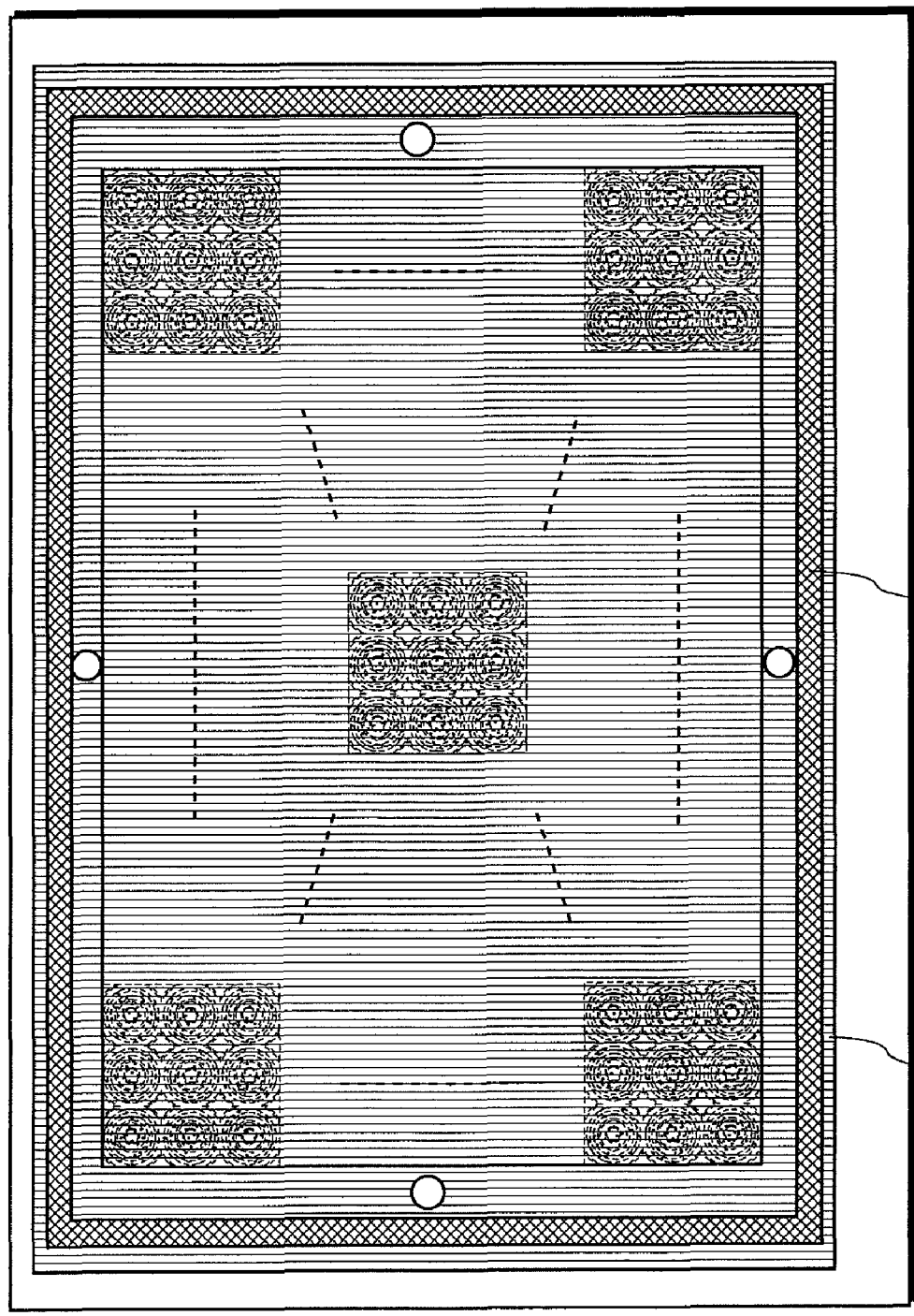
FIG. 10 is a schematic view showing holes for removing the sacrificial layer according to the first embodiment.

As shown in FIG. 9 and FIG. 10, the structure may include: a second supporting structure 23 formed at the outer periphery of an imaging region where the unit pixels 101 are collected; and at least two holes 24 formed for the transparent thin film 10 for an inflow and an outlet flow of the gas for etching the sacrificial layer 22. With such a structure, by sealing the holes 24 after the etching of the sacrificial layer 22, sticking which is caused by water when dicing can be prevented. Furthermore, with such a structure, by making the air gap 12 vacuum and sealing the holes 24 on the transparent thin film 10, formation of dew and the like can be prevented even when the solid-state imaging device 100 is used at a low temperature (equal to or less than 0 degree C). Also, even when the structure is one in which with the air gap 12 is filled with an inert gas and the holes 24 on the transparent thin film 10 are sealed, the same effect can be obtained.

Figure 35A:
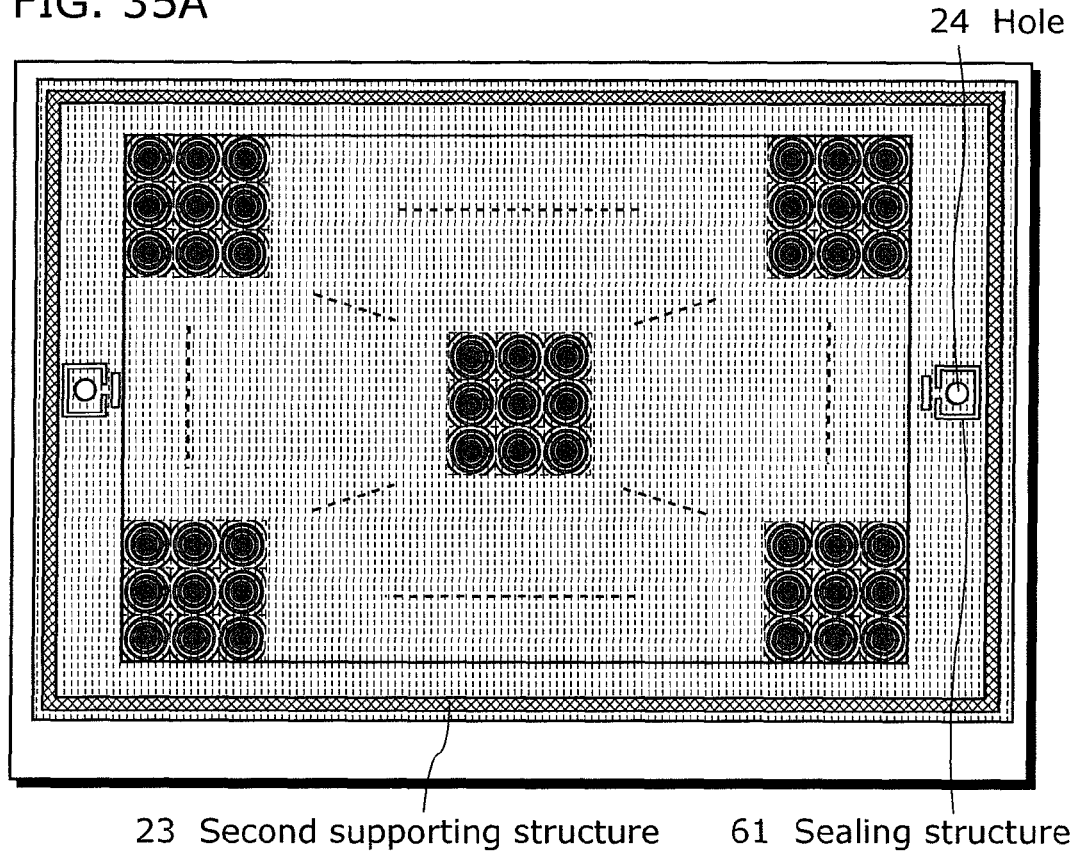
FIGS. 35 A to D are schematic views showing a sealing structure of a hole formed in the solid-state imaging device according to the first embodiment.
Figure 35B:
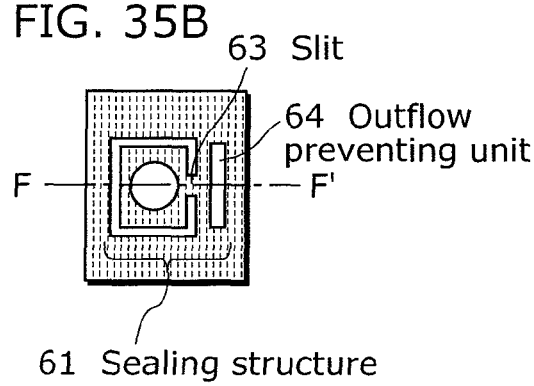
Figure 35C:
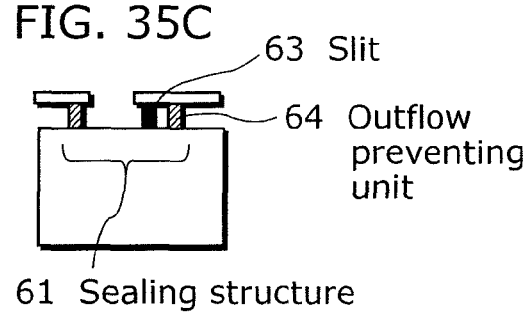

As shown in FIG. 35A, it is preferable that the holes 24 are sealed by providing a sealing structure 61 to surround each hole 24. FIG. 35B is an enlarged view showing the sealing structure 61, and FIG. 35C is a cross-sectional view showing the sealing structure 61 taken along the line F-F' in FIG. 35D. The sealing structure 61 is formed in a process which is performed in parallel with a process of forming the supporting structures 11. The sealing structures 61 can allow the inflow and outflow of a gas, and can be sealed after the inflow and outflow of the gas. As shown in the top view of FIG. 35B, each of the sealing structures 61 has a slit unit 63 at a part of its generally square wall structure, and has an outflow preventing unit 64 near the slit unit 63 for preventing the outflow of a sealant 62. Note that in the present embodiment, the sealing structure 61 is formed to have a generally square shape, but may have a different shape such as rectangular or circular.

Figure 35D:
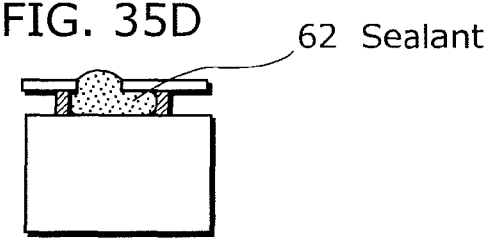

FIG. 35D is a cross-sectional view showing the sealing structure 61 which is sealed with the sealant 62. A thermosetting resin or a photosetting resin can be used as the sealant 62. The sealant 62 may be injected using a dispenser or by spin-coating, and then be set by heating or irradiating with UV light. Note that low melting metal or a low melting glass can be also used as the sealant 62.

Note that the sacrificial layer 22 may be removed by performing isotropic dry etching after the solid-state imaging device 100 is diced and mounted on a package or a circuit substrate. In this way, sticking which is caused by water when dicing can be prevented.

Figure 34:
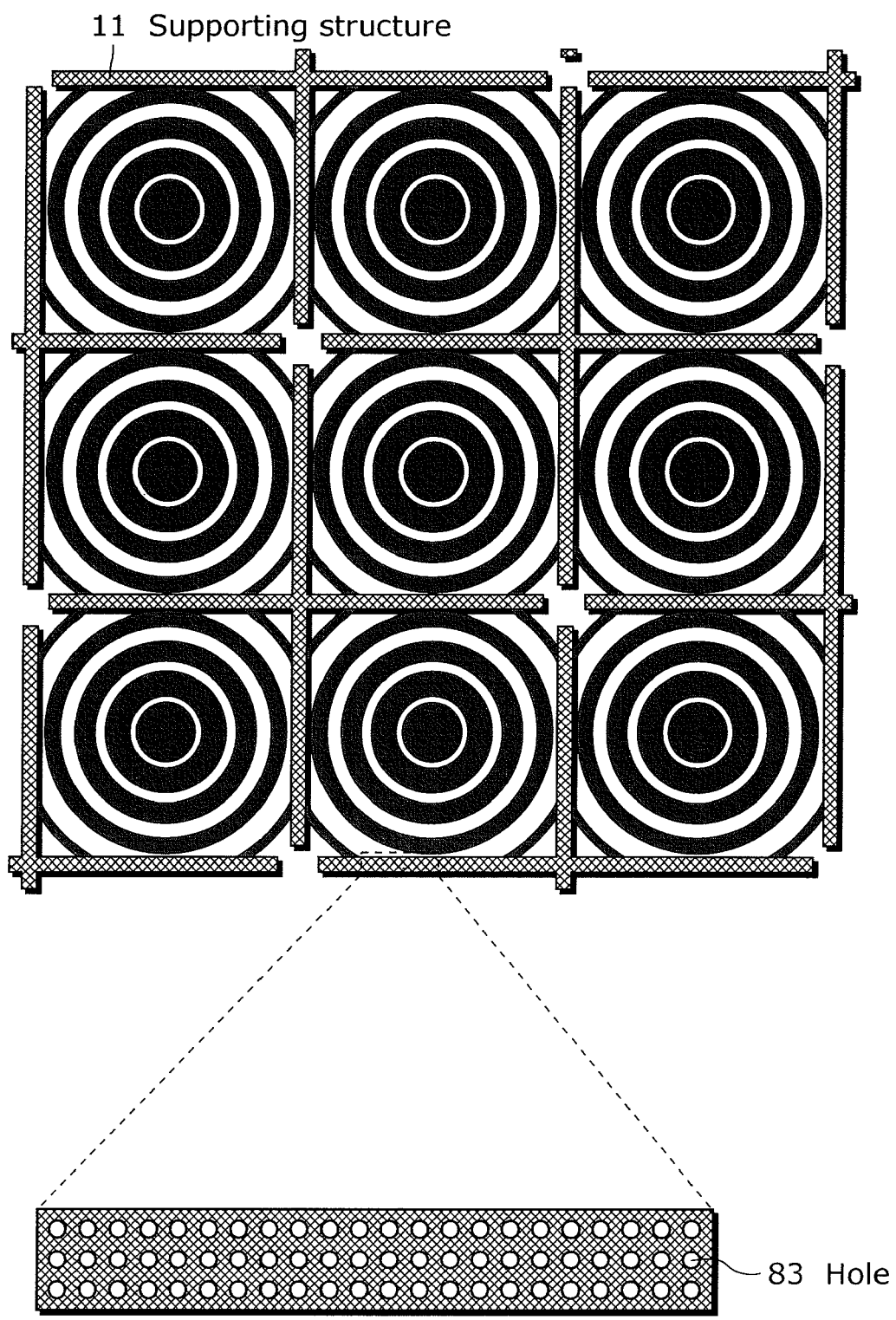
FIG. 34 is a schematic view showing holes which have a diameter smaller than a wavelength and are formed within a supporting structure of the solid-state imaging device according to the first embodiment.

Further, by regularly forming, in the supporting structures 11 (SiO$_2$), holes 83 that have a diameter smaller than the wavelength of incident light as shown in FIG. 34, a photonic band gap which is a light forbidden band can be formed, and light crosstalk and color mixture between the unit pixels 101 can be prevented.

Second Embodiment

The present embodiment will describe a structure which is added to the structure of FIG. 2 described in the first embodiment so as to achieve more functions.

Figure 11:
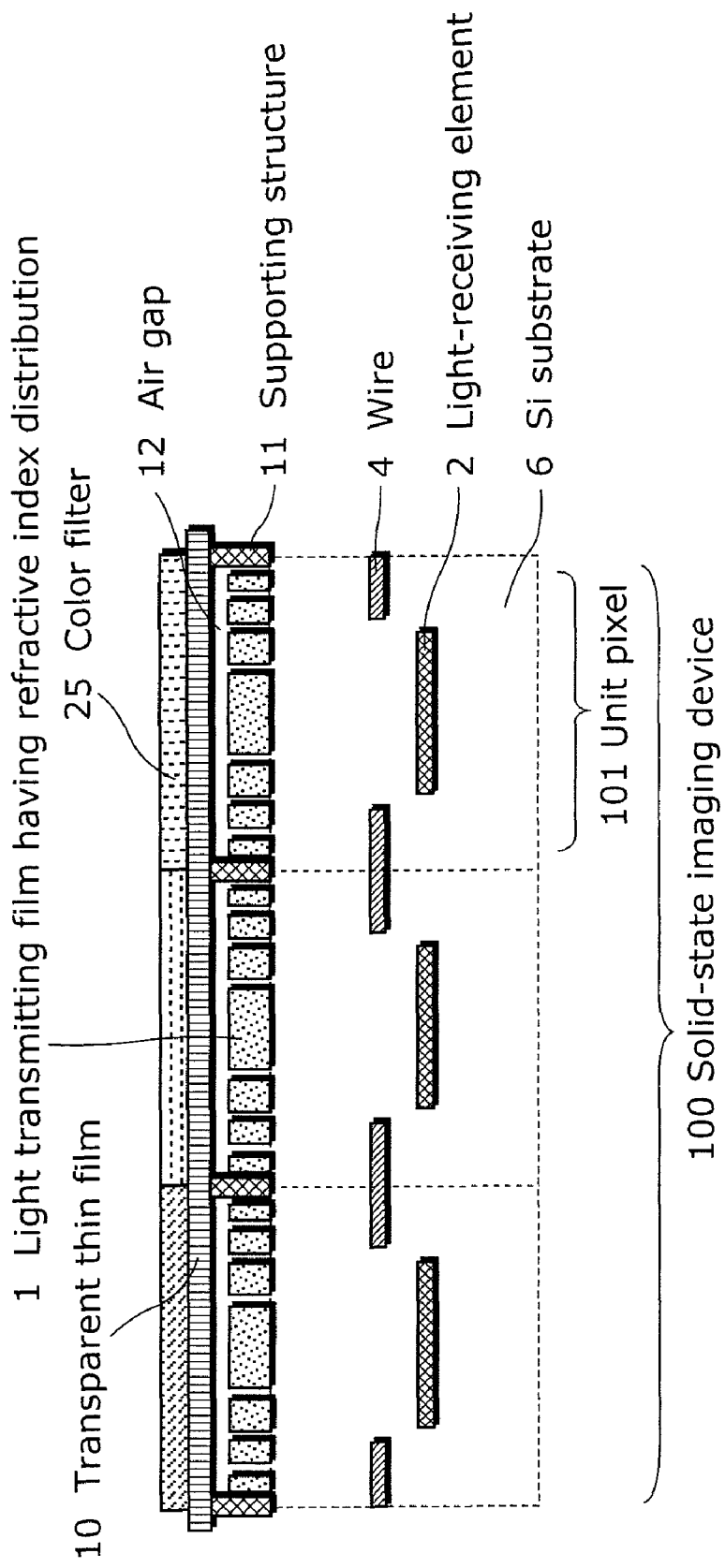
FIG. 11 is a cross-sectional view showing a structure of a colorized solid-state imaging device according to a second embodiment.
Figure 12:
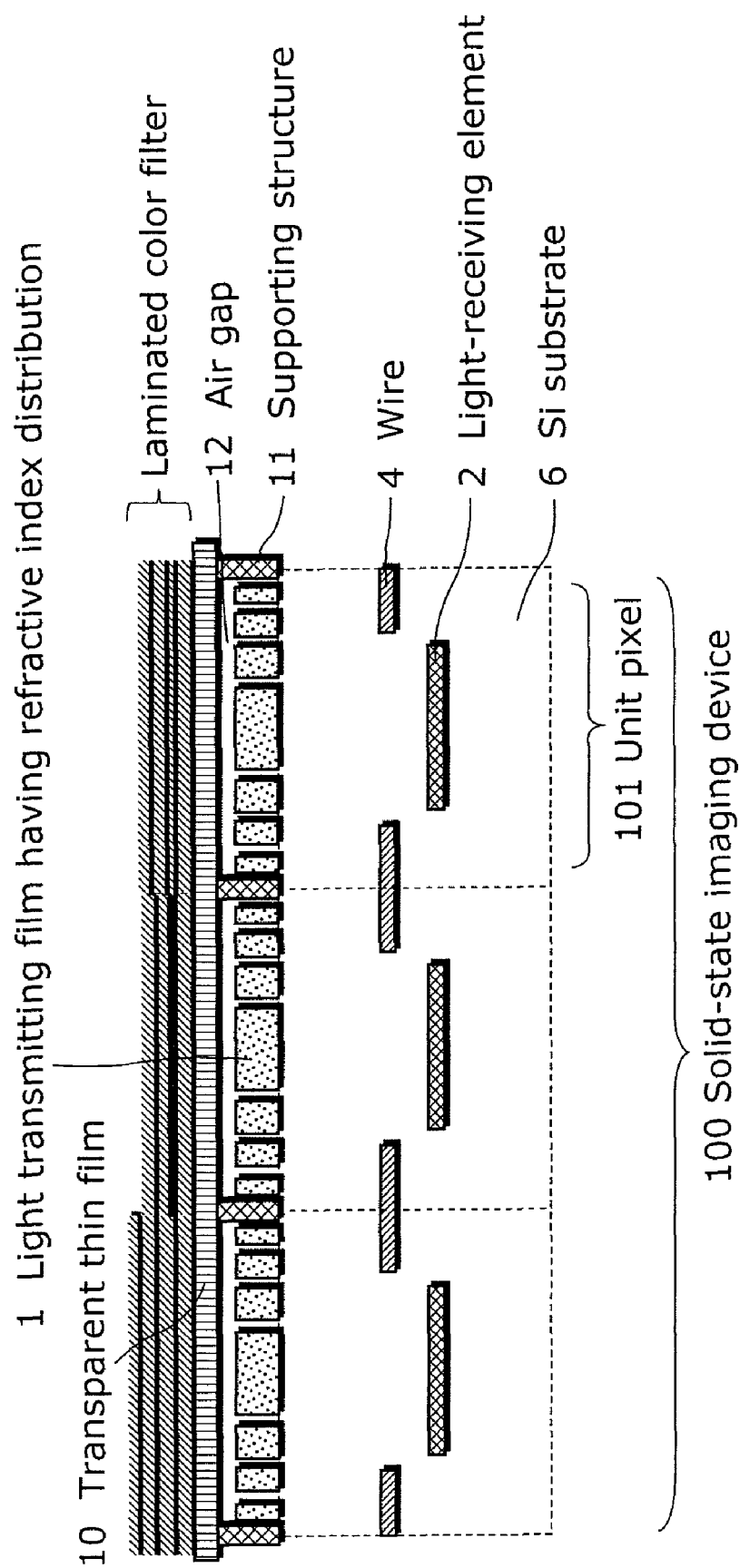
FIG. 12 is a cross-sectional view showing a structure of a colorized solid-state imaging device according to the second embodiment.
Figure 13:
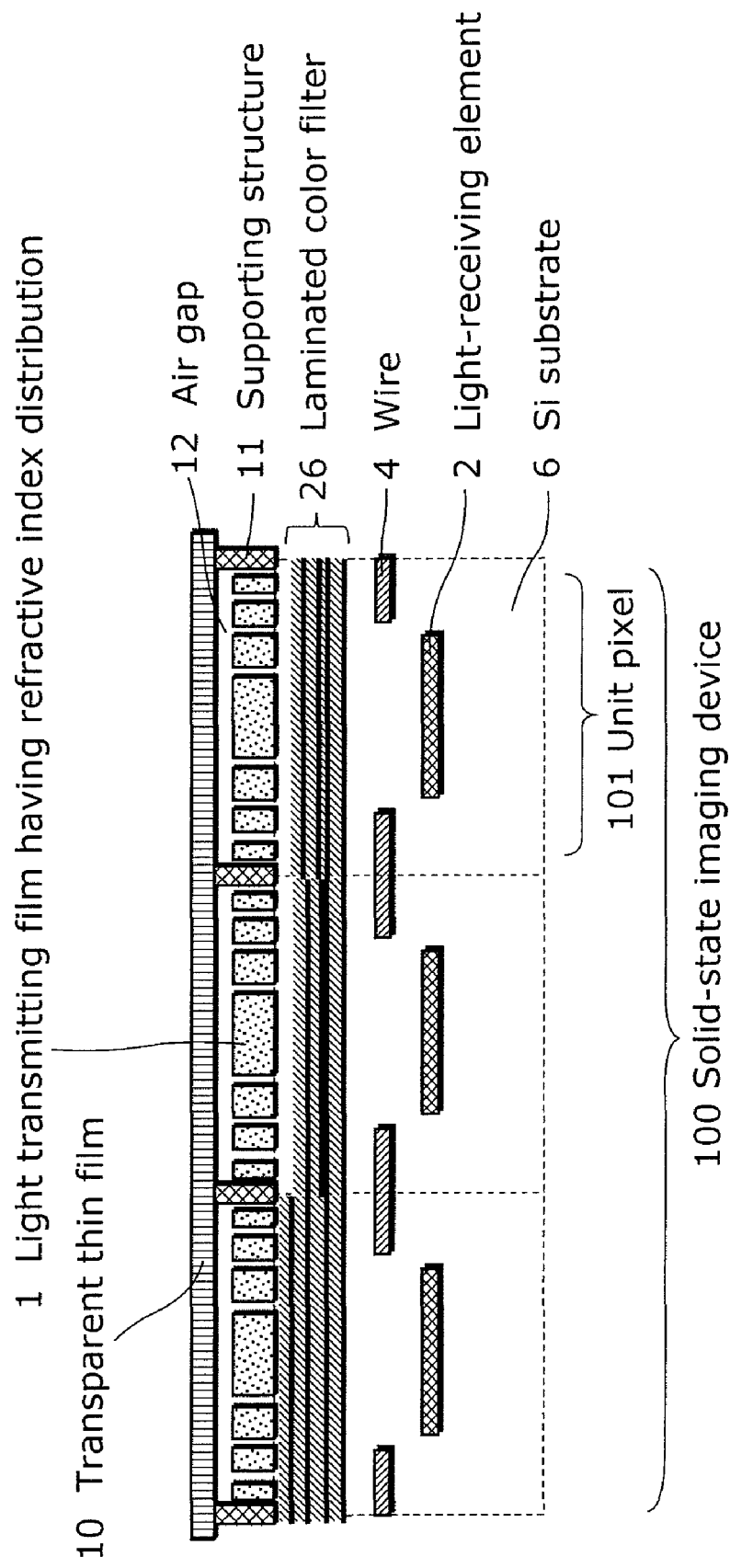
FIG. 13 is a cross-sectional view showing a structure of a colorized solid-state imaging device according to the second embodiment.

FIGS. 11 to 13 are schematic cross-sectional views showing a solid-state color imaging device 100. FIG. 11 shows a color filter 25 which is formed on the transparent thin film 10 and includes a resin as a base material, dyes, and pigments. The color filter 25 including the resin as the base material has a photosensitivity, thereby being able to be formed by spin-coating and lithography.

FIG. 12 is a diagram showing a color filter (laminated color filter 26) which is formed on the transparent thin film 10 by alternately laminating a TiO$_2$ film and an SiO$_2$ film. The laminated color filter 26 has a different film structure for a different color to be received, and for example, a region of the multilayer color filter 26 where a green light is received includes three TiO$_2$ film layers and two SiO$_2$ film layers. Further, regions where a red light and a blue light are respectively received both include four TiO$_2$ film layers and three SiO$_2$ film layers, but the middle SiO$_2$ films of these two regions have different thicknesses from each other.

Also, as shown in FIG. 30, by forming holes that have a diameter smaller than a wavelength of incident light on a metal thin film such as Ag or Au, plasmon effect is generated which enables a function of a color filter to be integrated. In addition, it is preferable that the holes have a different diameter for a different color to be received.

As shown in FIG. 13, by providing, under the light transmitting film 1 having the refractive index distribution, the laminated color filter 26 which is formed by alternately laminating a TiO$_2$ film and an SiO$_2$ film, a function element can be further formed on the transparent thin film 10.

Figure 14:
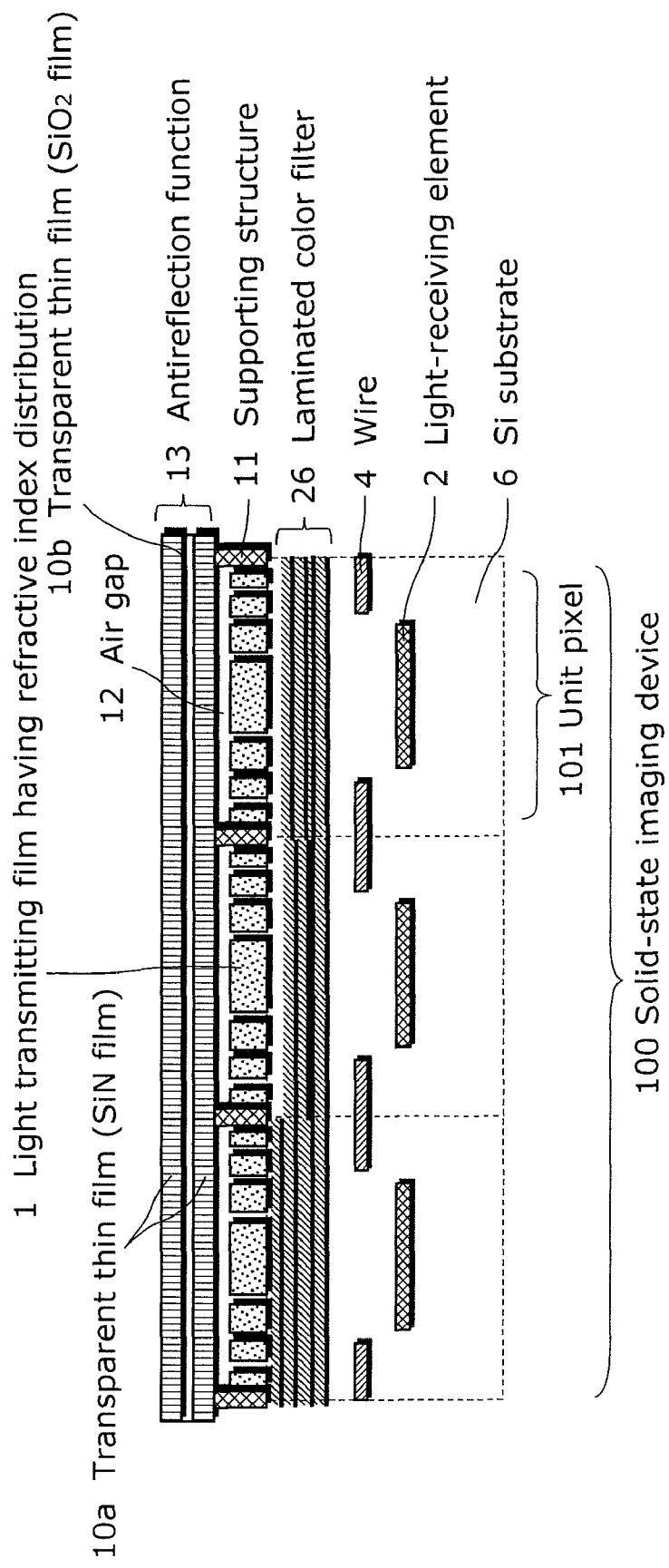
FIG. 14 is a diagram showing an example of a cross-sectional structure of the solid-state imaging device according to the second embodiment into which a laminated optical film is integrated.
Figure 15:
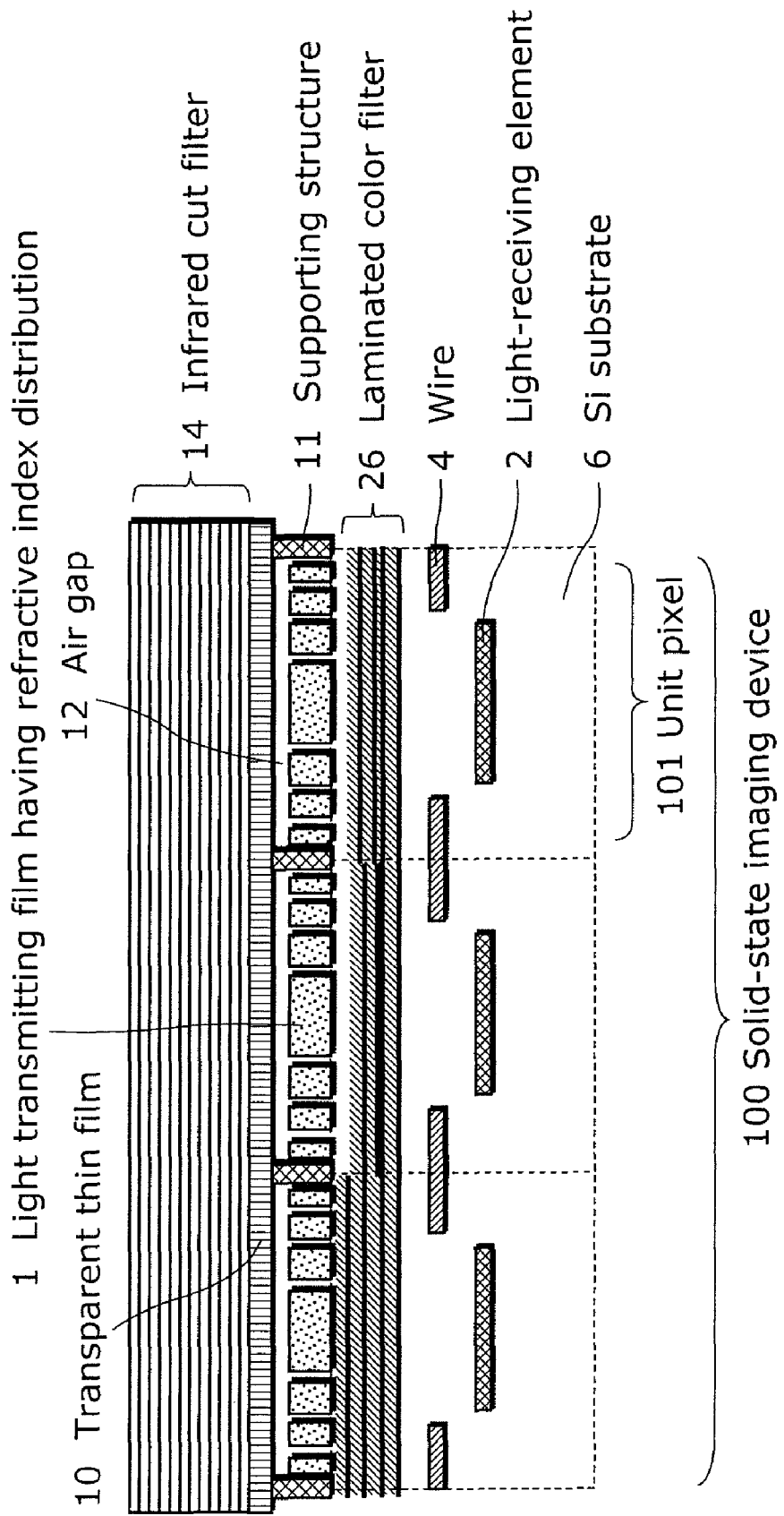
FIG. 15 is a diagram showing an example of a cross-sectional structure of the solid-state imaging device according to the second embodiment into which a laminated optical film is integrated.

As shown in cross-sectional views of FIGS. 14 and 15, an antireflection function 13 and an infrared cut filter 14 can be integrated by forming a structure in which an SiN film and an SiO$_2$ film are alternately laminated or a structure in which a TiO$_2$ film and an SiO$_2$ film are alternately laminated. With this structure, an antireflection filter or an infrared cut filter of a camera module can be eliminated, and thus it is to achieve reductions in size and in thickness of the camera module. Also, cost reduction can be achieved.

Figure 16:
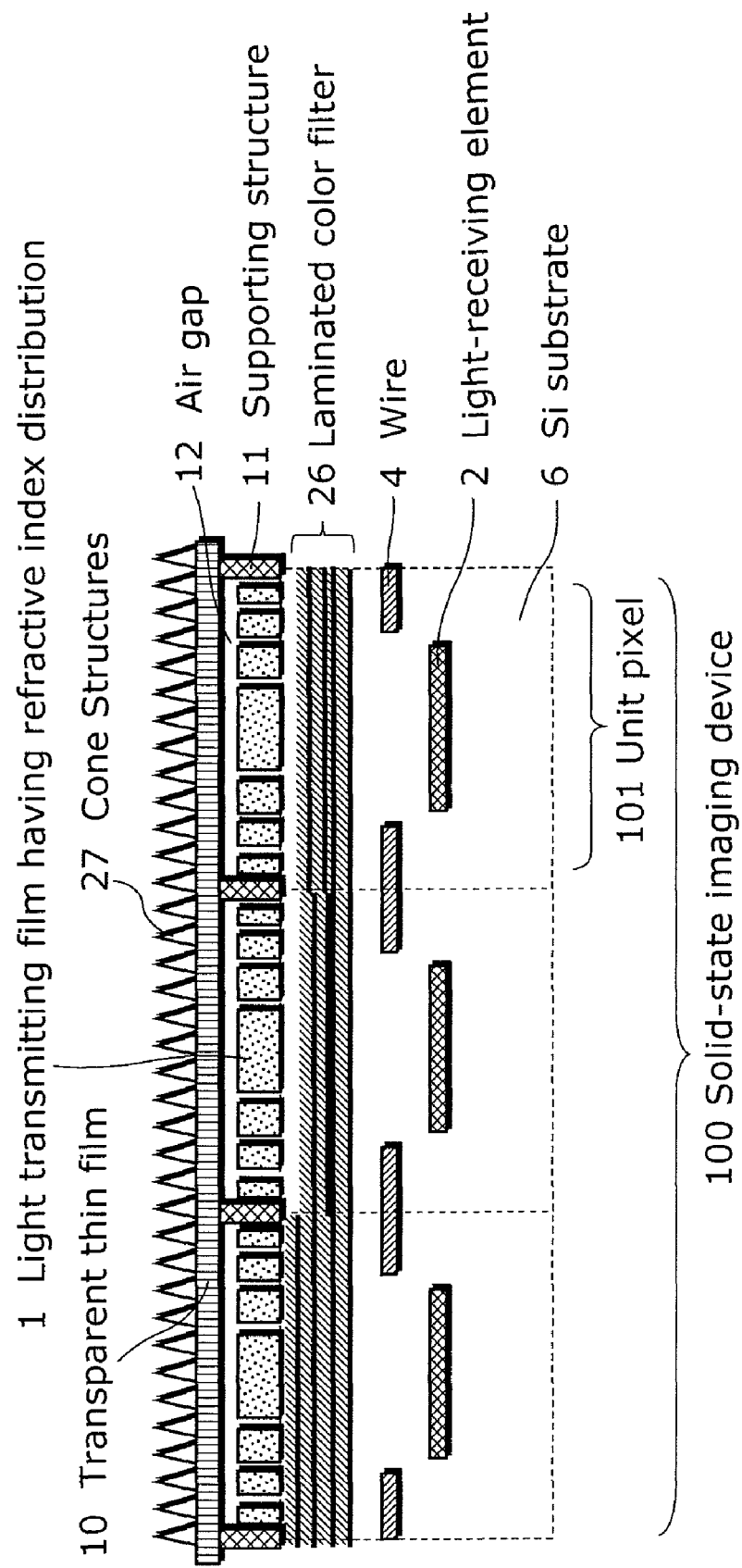
FIG. 16 is a diagram showing an example of a cross-sectional structure of the solid-state imaging device according to the second embodiment into which minute cones are integrated.

As shown in a cross-sectional view in FIG. 16, the antireflection function 13 can be integrated on the transparent thin film 10 by forming, at a uniform pitch, cone structures 27 that have a diameter smaller than a wavelength of incident light.

Figure 17:
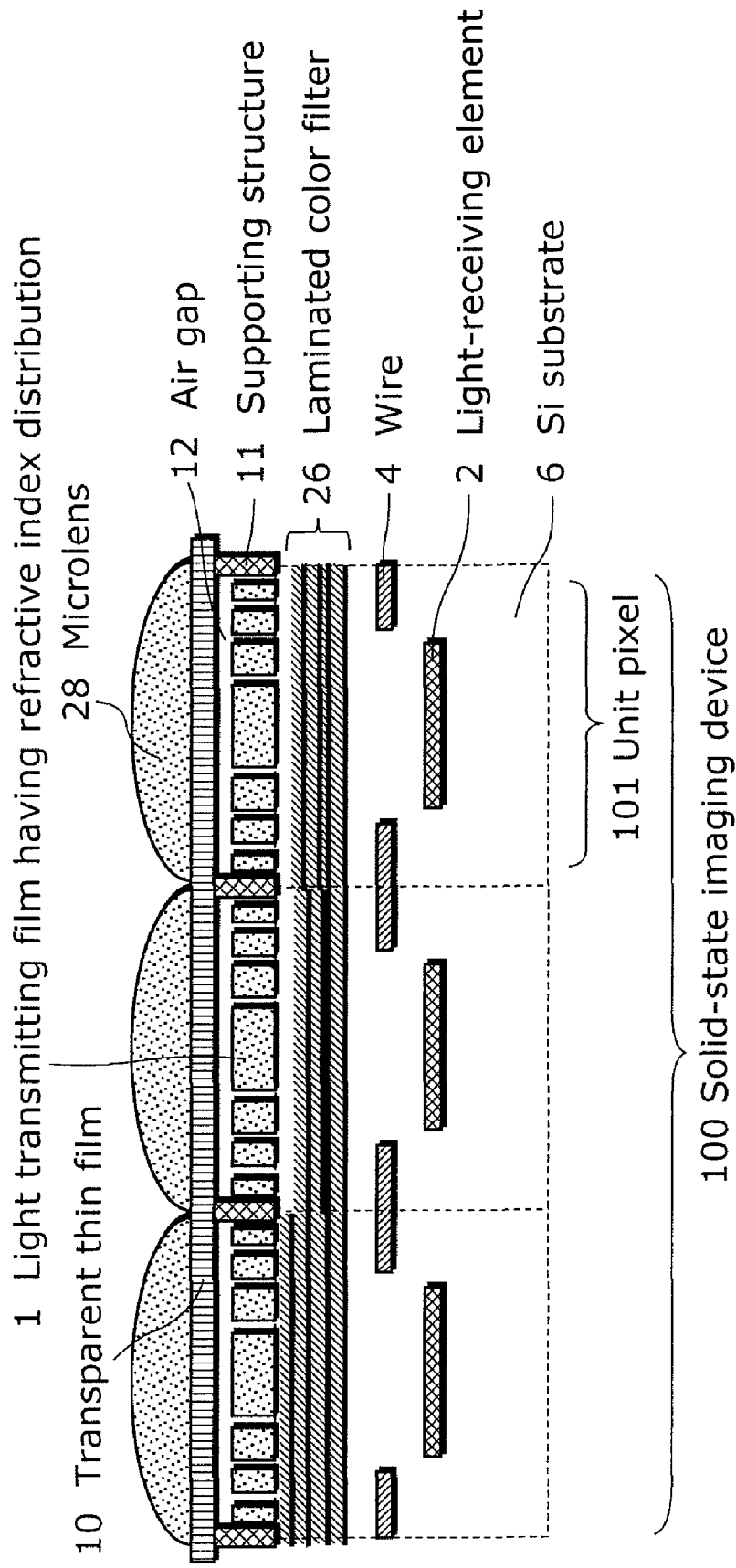
FIG. 17 is a diagram showing an example of a cross-sectional structure of the solid-state imaging device according to the second embodiment into which microlenses are integrated, the microlenses including a resin as a base material.
Figure 18B:
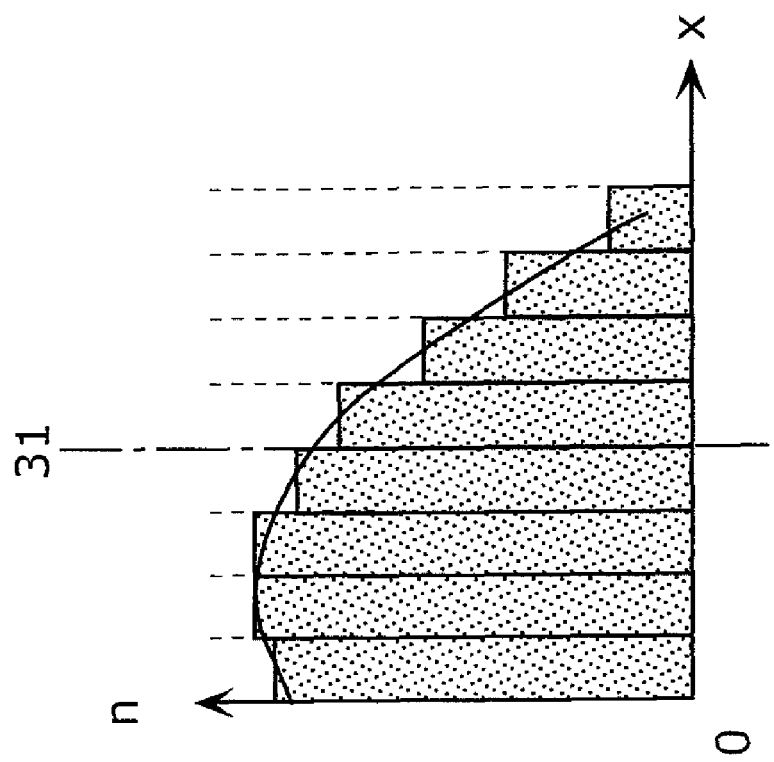
FIG. 18B is a graph showing an effective refractive index distribution of a light transmitting film which includes the light transmitting film having the refractive index distribution according to the second embodiment.

FIG. 17 is a diagram showing an example of a cross-sectional view of a structure of a solid-state imaging device 100 having microlenses 28 formed on the transparent thin film 10, the microlenses 28 including a resin as a base material. The microlenses 28 which include the resin as the base material have a photosensitivity, thereby being able to be formed by spin-coating and reflow by baking and lithography. As described, by integrating two types of microlens functions, various lens functions can be realized. For example, as shown in FIGS. 18A, 18B and 19, when the refractive index distribution of the light transmitting film 1 having the refractive index distribution is decentralized with respect to the center of a pixel, light incident even at a high angle relative to the light transmitting film 1 can enter the light-receiving element without fail.

Figure 18A:
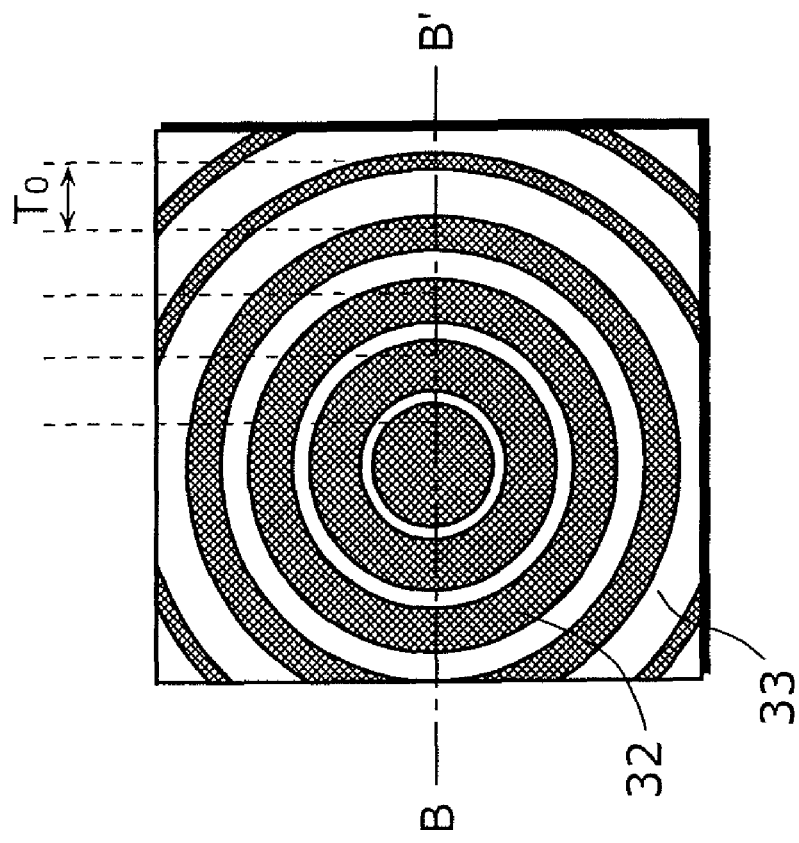
FIG. 18A is a diagram showing an example of a top view of a light transmitting film having a refractive index distribution according to the second embodiment.
Figure 19:
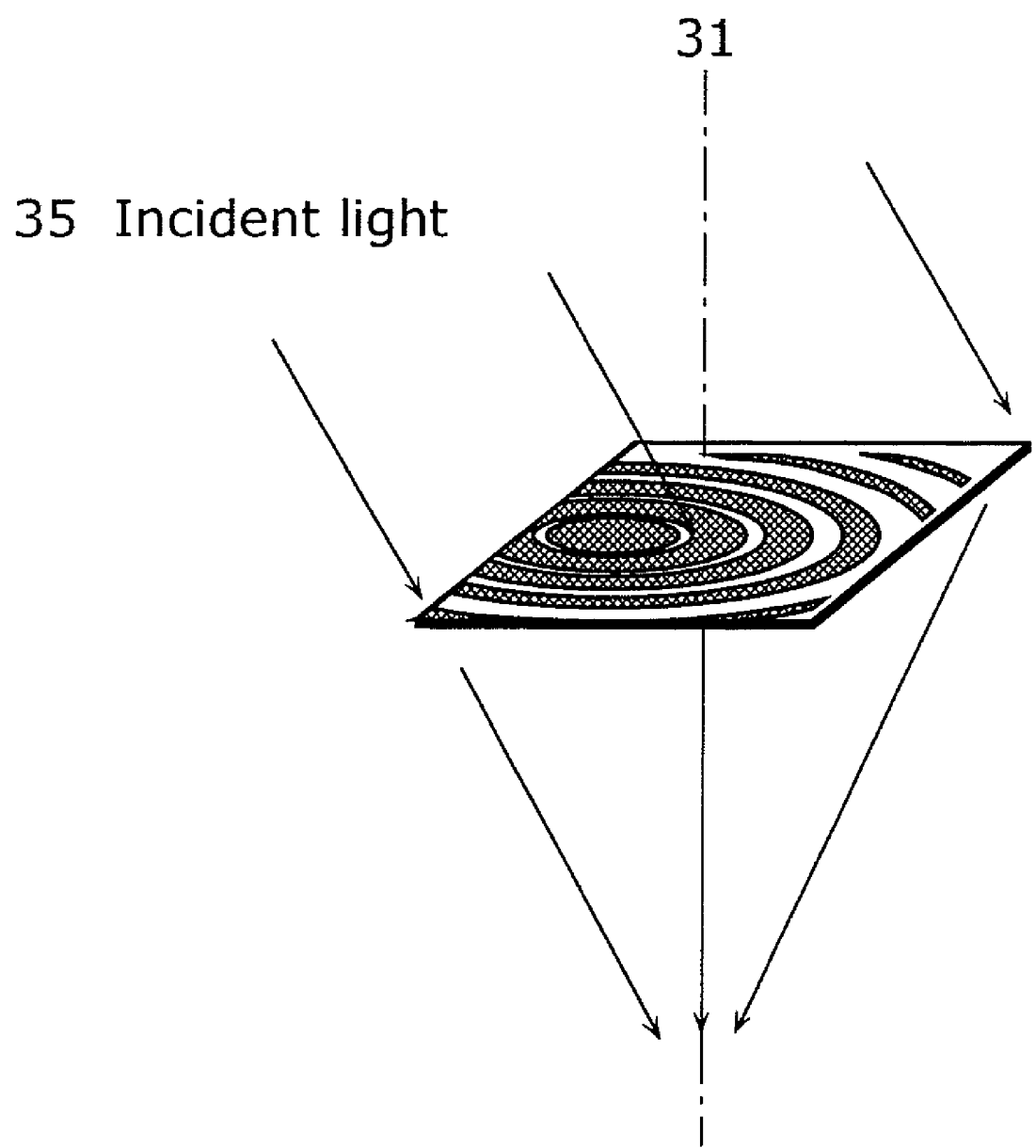
FIG. 19 is a diagram showing oblique incidence characteristics according to the second embodiment.

FIG. 18A is a diagram showing an example of a top view of the light transmitting film 1 having the refractive index distribution. The concentric structure includes a high refractive index material 32 [SiO$_2$ (n=1.65)] and a low refractive index material 33 [air (n=1.0)] which are light transmitting films, and has a pitch (T$_0$) 34 of 200 nm which is a radial difference between an outer periphery of a ring-shaped light transmitting film and an outer periphery of an adjacent ring-shaped light transmitting film. Also, the film has a thickness of 1.2 μm. The light transmitting film 1 at a cross-section taken along the line B-B' in FIG. 18A has a refractive index which changes in such a manner as shown in FIG. 18B, and the refractive index distribution is asymmetric with respect to a pixel center 31. Since the lens has a highest refractive index at its central part and lower refractive indexes toward the outer edge, such a refractive index distribution can change the direction of light incident in an oblique direction (at a wide angle), such as the incident light 35 shown in FIG. 19.

In the present invention, a refractive index distribution of a lens as shown in FIG. 18B is achieved by discretizing the high refractive index material 32 and the low refractive index material 33 in an area equal to or less than one half of an incident light wavelength.

The light transmitting film 1 having the refractive index distribution according to the present embodiment is able to have an optimal structure for each unit pixel depending on the wavelength of the incident light 35, thereby light can be efficiently collected regardless of the incident angle. A refractive index distribution for light having an incident angle of 0 degree has concentric circles the center of which is at the central part of a pixel. When the incident angle increases, the center of the circles is shifted toward the side from which the light is incident. Therefore, as shown in FIG. 19, the concentric structure of the light transmitting film 1 having the refractive index distribution is asymmetric with respect to the pixel center 31.

As described above, by changing the refractive index distribution of the light transmitting film 1 having the refractive index distribution for each unit pixel, the properties of imaging lenses such as incident angle characteristics, chromatic aberration, field curvature can be corrected, resulting in a reduction in the number of the imaging lenses.

Figure 20:
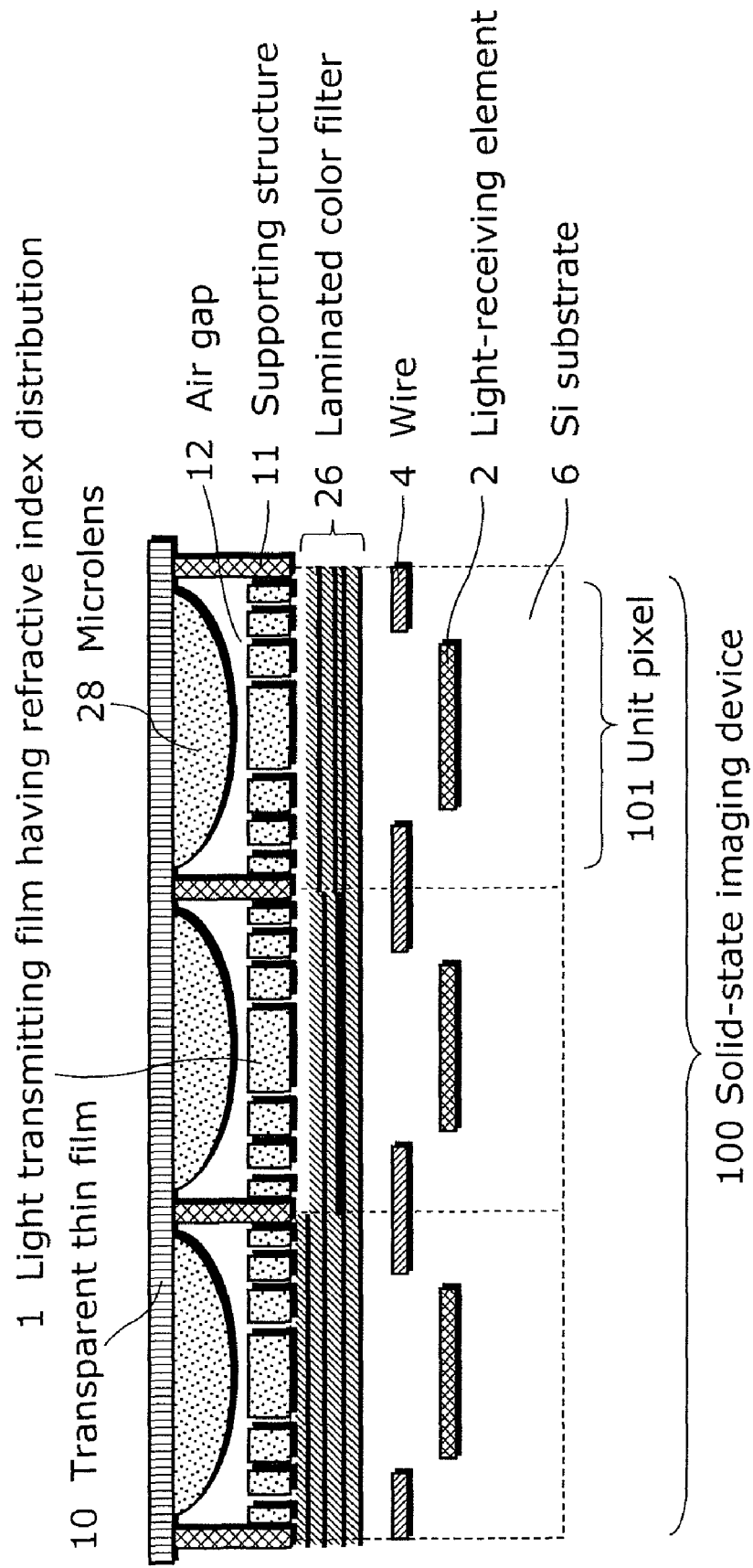
FIG. 20 is a diagram showing an example of a cross-sectional structure in which microlenses are provided below the transparent thin film according to the second embodiment.
Figure 21:
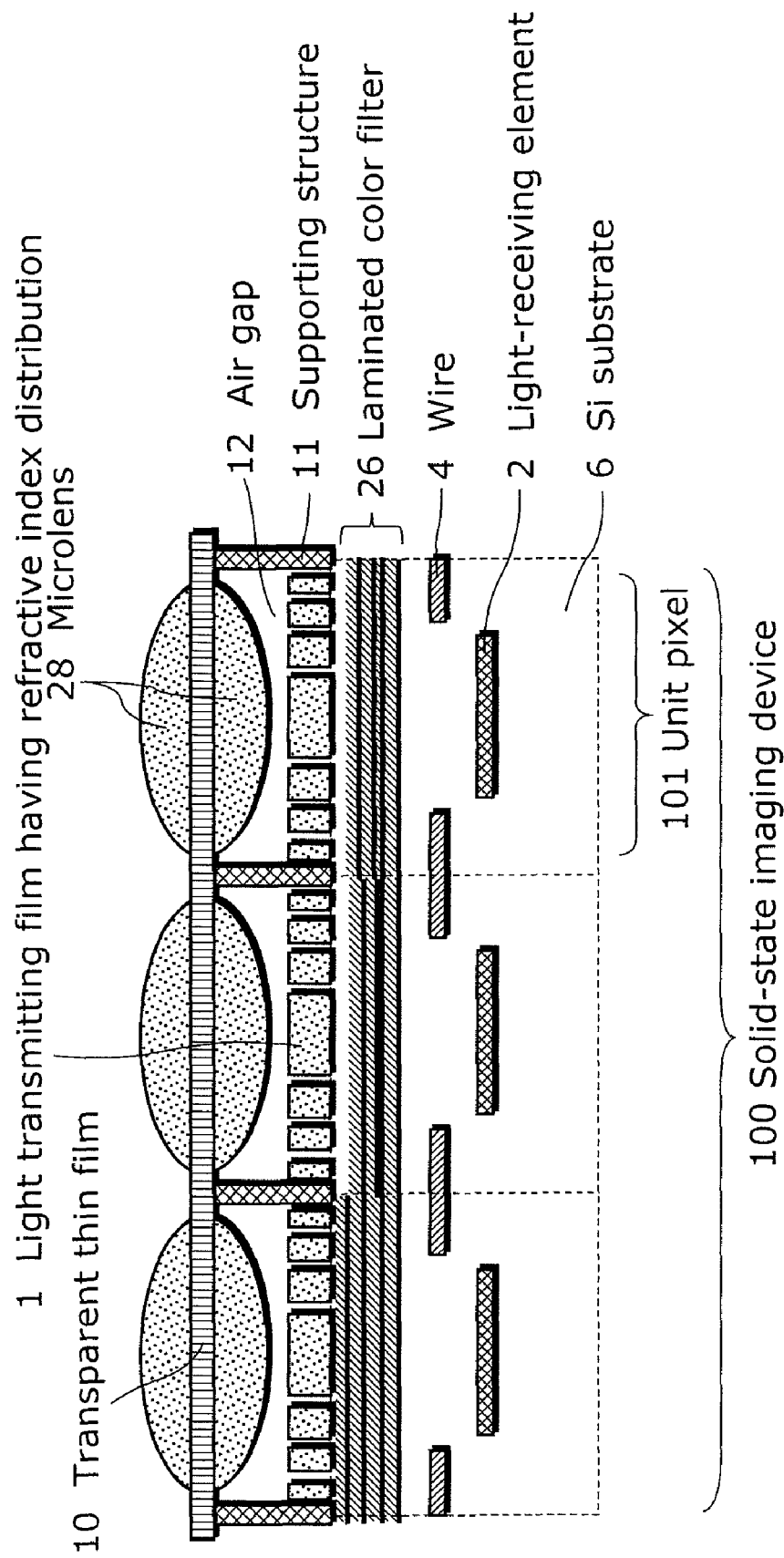
FIG. 21 is a diagram showing an example of a cross-sectional structure into which microlenses, provided below and on the transparent thin film according to the second embodiment, are integrated, the microlenses provided below the transparent thin film having the refractive index distribution, and the microlenses provided on the transparent thin film including a resin as a base material.

As shown in cross-sectional views of FIGS. 20 and 21, the microlenses 28 may be also formed under the transparent thin film 10. With reference to FIGS. 22A to 22L, a method for forming the microlenses 28 will be explained below.

Figure 22A:
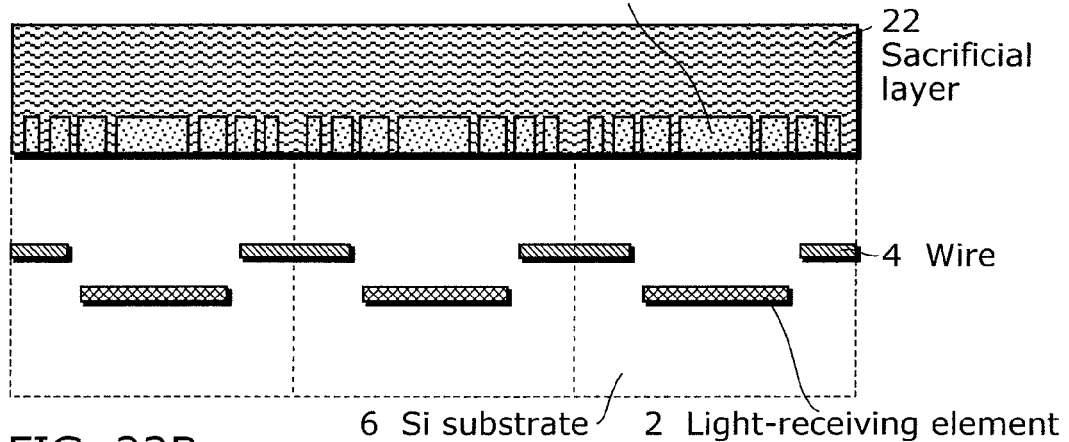
FIG. 22A is a diagram showing an example of a process of forming microlenses under the transparent thin film according to the second embodiment.

FIG. 22A is a diagram showing polysilicon formed, for forming the sacrificial layer 22, on the light transmitting film 1 having a refractive index distribution which is formed on the Si substrate 6 having basic functions of the solid-state imaging device 100 such as the light-receiving element (Si photodiode) 2 and the wire 4. It is assumed that the polysilicon has a thickness of 3.0 μm which is thicker than the sum of 1.2 μm and 1.5 μm which are the thickness of the light transmitting film 1 having the refractive index distribution and the thickness of the microlens, respectively.

Figure 22B:
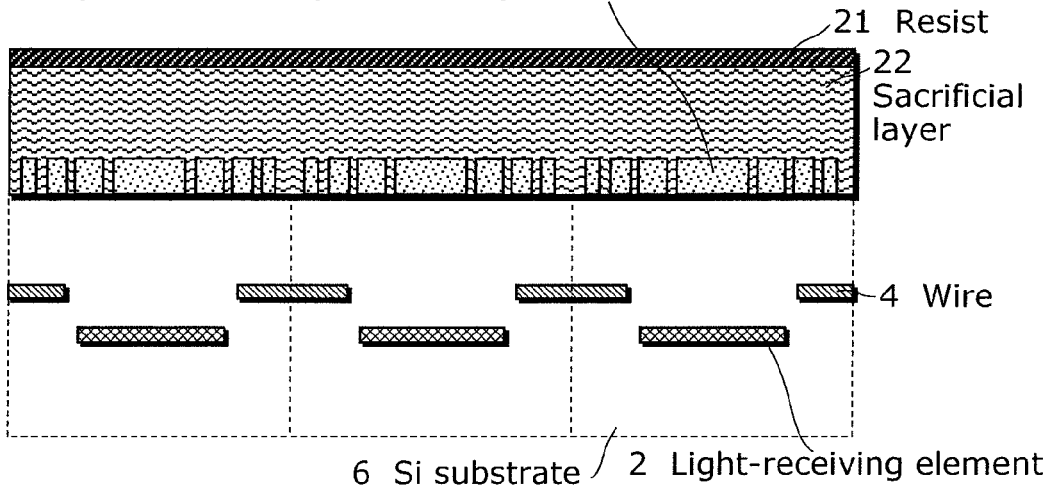
FIG. 22B is a diagram showing an example of a process of forming microlenses under the transparent thin film according to the second embodiment.
Figure 22C:
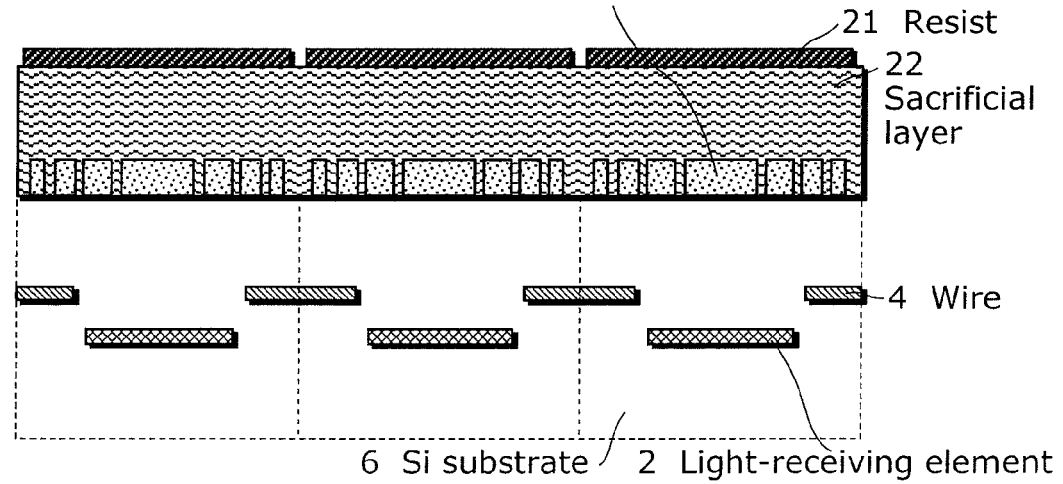
FIG. 22C is a diagram showing an example of a process of forming microlenses under the transparent thin film according to the second embodiment.
Figure 22D:
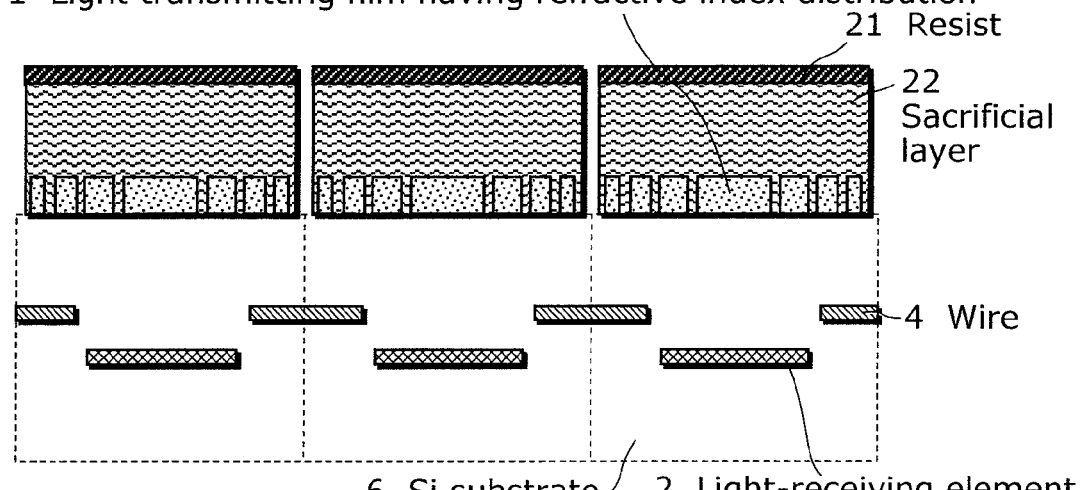
FIG. 22D is a diagram showing an example of a process of forming microlenses under the transparent thin film according to the second embodiment.
Figure 22E:
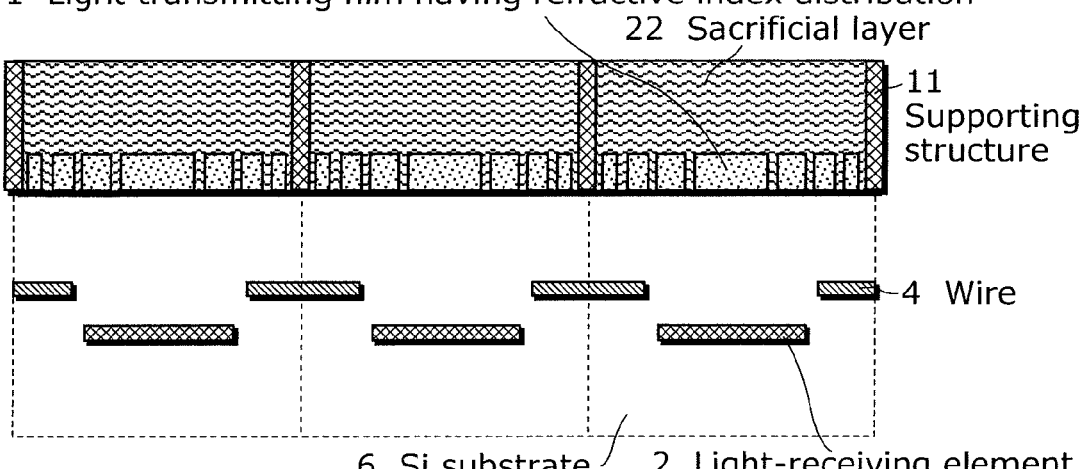
FIG. 22E is a diagram showing an example of a process of forming microlenses under the transparent thin film according to the second embodiment.

Next, in order to pattern the sacrificial layer 22 and form the supporting structures 11, as shown in FIGS. 22B and 22C, the sacrificial layer 22 is coated with the resist 21, and the resist 21 is patterned by lithography. Then, in order to form the supporting structures 11, as shown in FIGS. 22D and 22E, the polysilicon film is dry etched with the patterned resist 21 as a mask, using a Cl based gas or an HBr based gas for example, to form grooves for forming the supporting structures 11, and then the resist 21 is removed.

After the removal of the resist 21, a material, such as $SiO_2$, SiN, a metal, a dielectric material, having a high etching selection ratio to polysilicon is formed by sputtering, CVD, or vapor deposition for example, and is planarized by CMP.

Figure 22F:
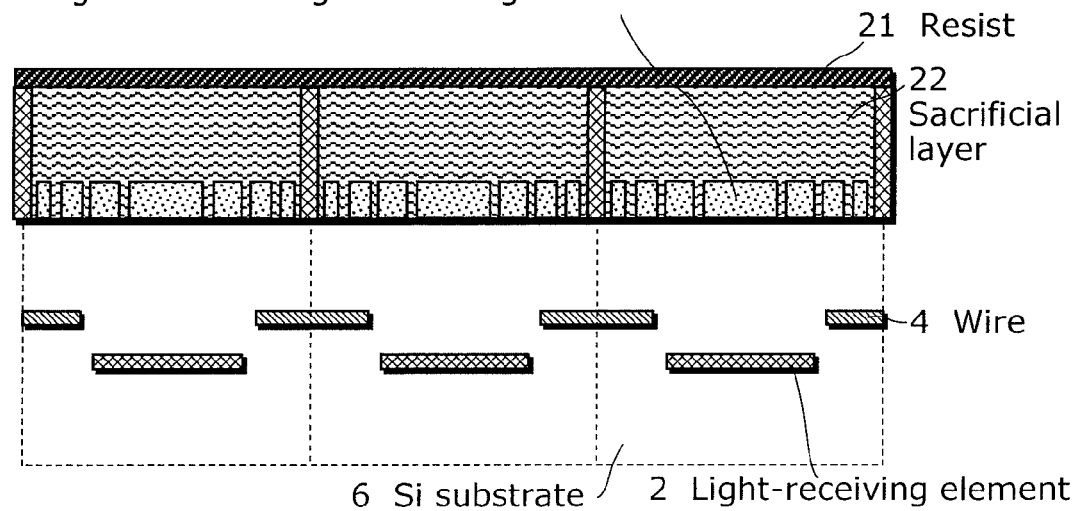
FIG. 22F is a diagram showing an example of a process of forming microlenses under the transparent thin film according to the second embodiment.
Figure 22G:
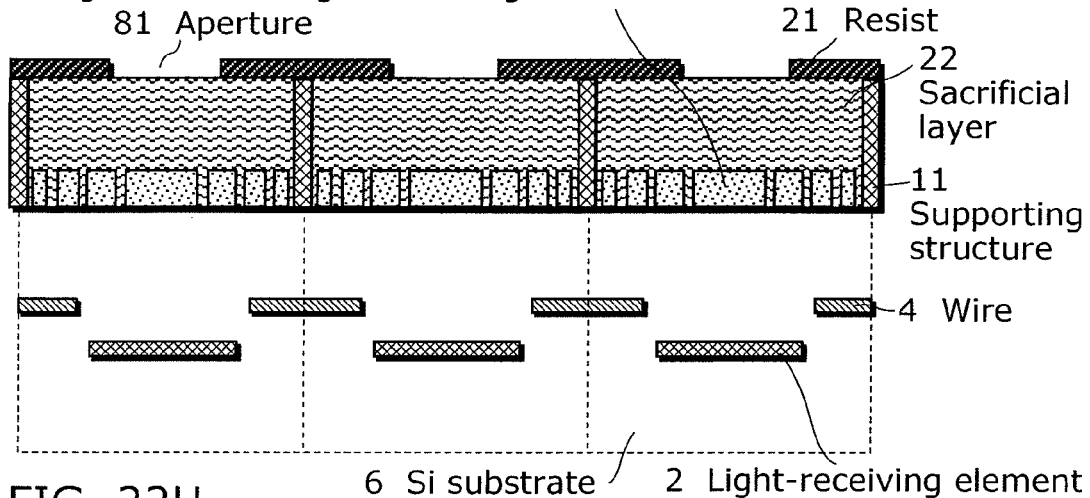
FIG. 22G is a diagram showing an example of a process of forming microlenses under the transparent thin film according to the second embodiment.

Next, in order to form cavities 82 having the microlens shape, as shown in FIG. 22F and FIG. 22G, the sacrificial layer 22 is coated with the resist 21, and the resist 21 is patterned by lithography. At this point of time, the resist has apertures 81 formed in the resist which have a diameter smaller than that of the microlenses.

Figure 22H:
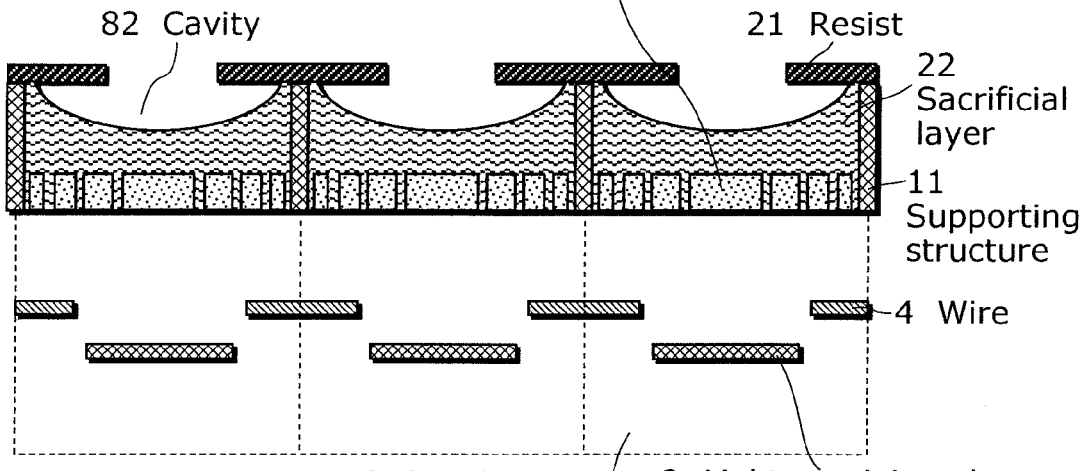
FIG. 22H is a diagram showing an example of a process of forming microlenses under the transparent thin film according to the second embodiment.
Figure 22I:
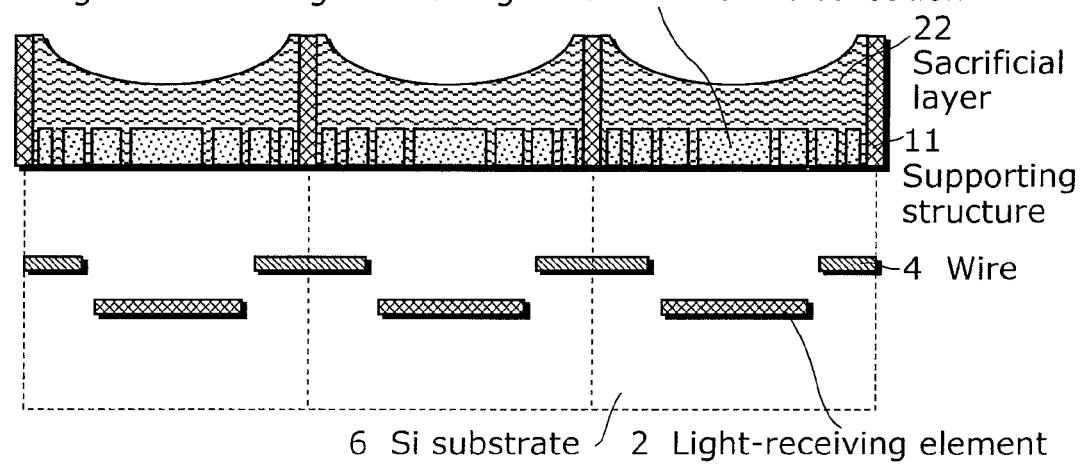
FIG. 22I is a diagram showing an example of a process of forming microlenses under the transparent thin film according to the second embodiment.

Next, as shown in FIG. 22H, the sacrificial layer 22 is removed by isotropic dry etching. It is preferable that the gas used in the etching is XeF, $ClF_3$ or the like. In this way, the cavities 82 having the microlens shape can be formed. Then as shown in FIG. 22I, the resist is removed.

Figure 22J:
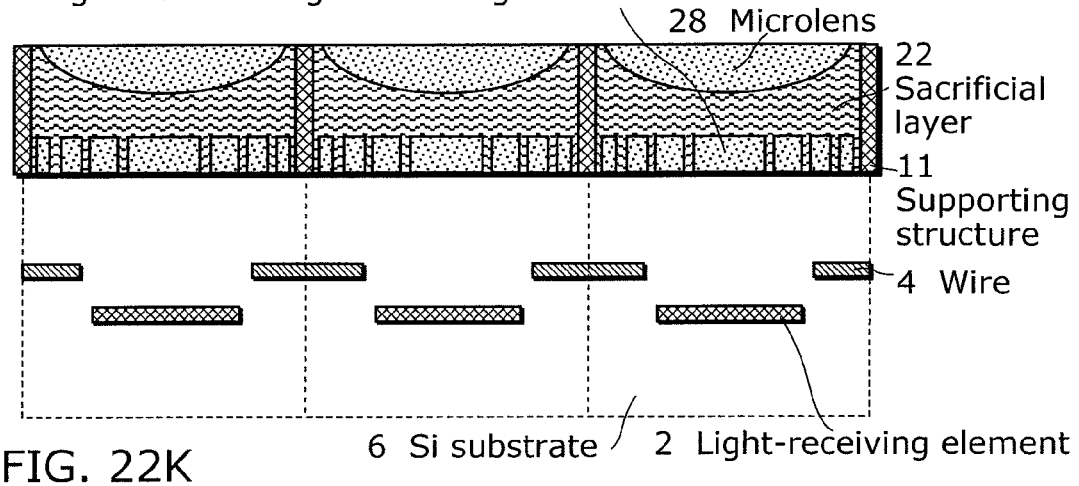
FIG. 22J is a diagram showing an example of a process of forming microlenses under the transparent thin film according to the second embodiment.

Furthermore, as shown in FIG. 22J, a lens material such as $SiO_2$ and SiN is formed by sputtering, CVD, or vapor deposition for example, and is planarized by CMP. In the present embodiment, SiN is used as the lens material.

Figure 22K:
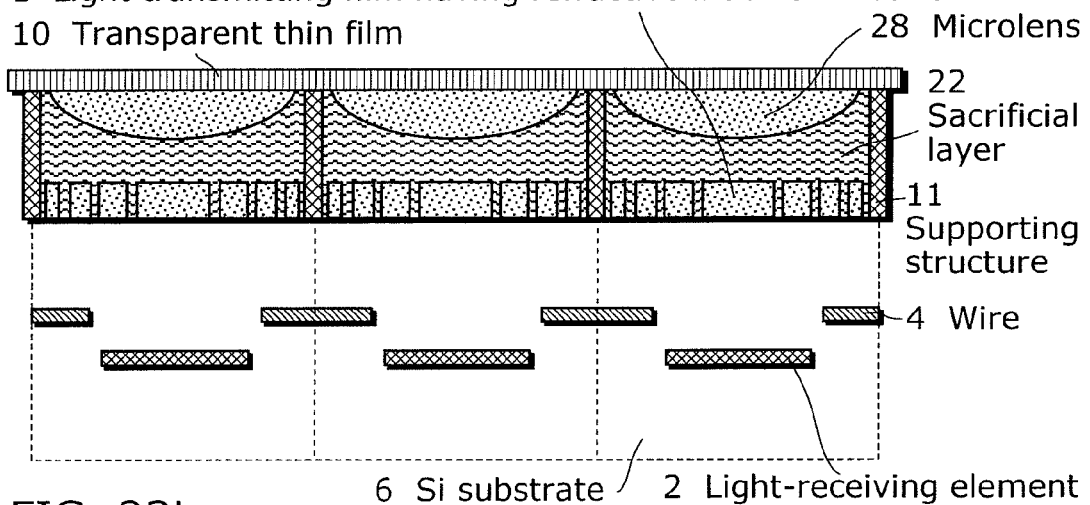
FIG. 22K is a diagram showing an example of a process of forming microlenses under the transparent thin film according to the second embodiment.

Next, as shown in FIG. 22K, a film which is to be the transparent thin film 10 is formed above the sacrificial layer 22.

Figure 22L:
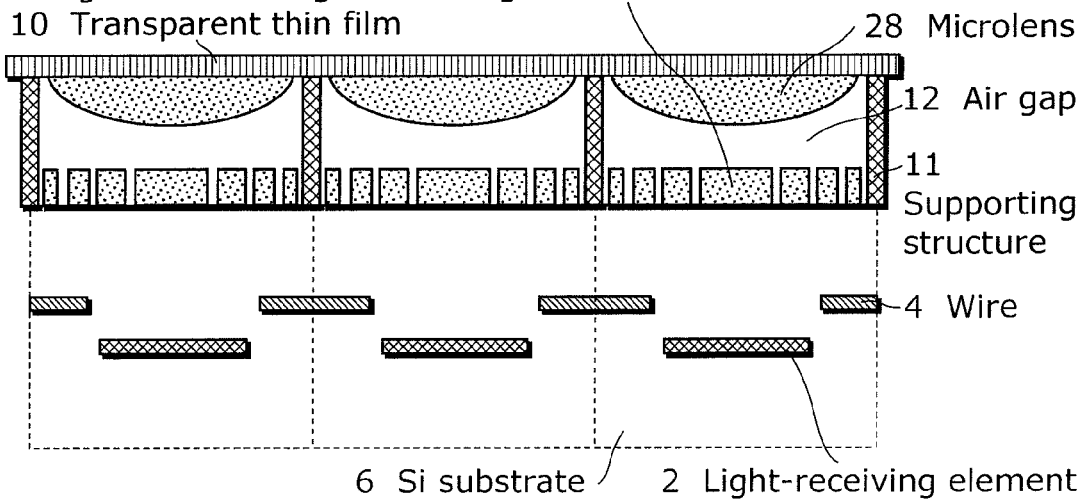
FIG. 22L is a diagram showing an example of a process of forming microlenses under the transparent thin film according to the second embodiment.

Next, as shown in FIG. 22L, the sacrificial layer 22 is removed by isotropic dry etching to form the air gap 12. It is preferable that the gas used in the etching is XeF, or $ClF_3$ or the like.

FIG. 21 is a diagram showing microlenses 28 which include a resin as a base material and are formed on the transparent thin film 10 by the above described process. The microlenses 28 including the resin as the base material have photosensitivity, thereby being able to be formed by spin-coating and reflow by lithography and baking. By integrating three types of microlens functions, various lens functions can be realized.

Third Embodiment

The present embodiment will describe a structure of a solid-state imaging device in which an infrared light imaging function for imaging at night is added to the structure of FIG. 13 described in the second embodiment.

Figure 23:
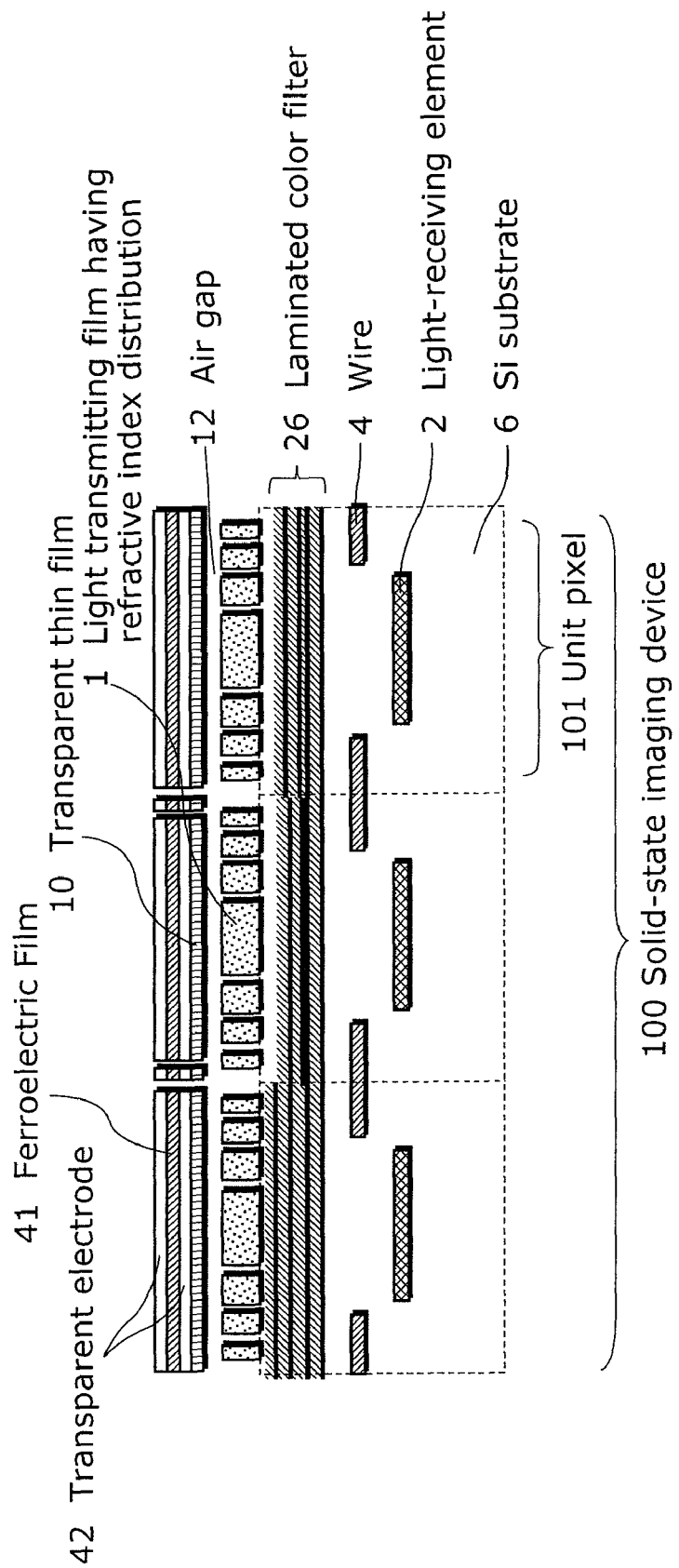
FIG. 23 is a diagram showing an example of a cross sectional view of a solid-state imaging device in which a function for detecting infrared light is integrated above a transparent thin film according to a third embodiment.
Figure 24:
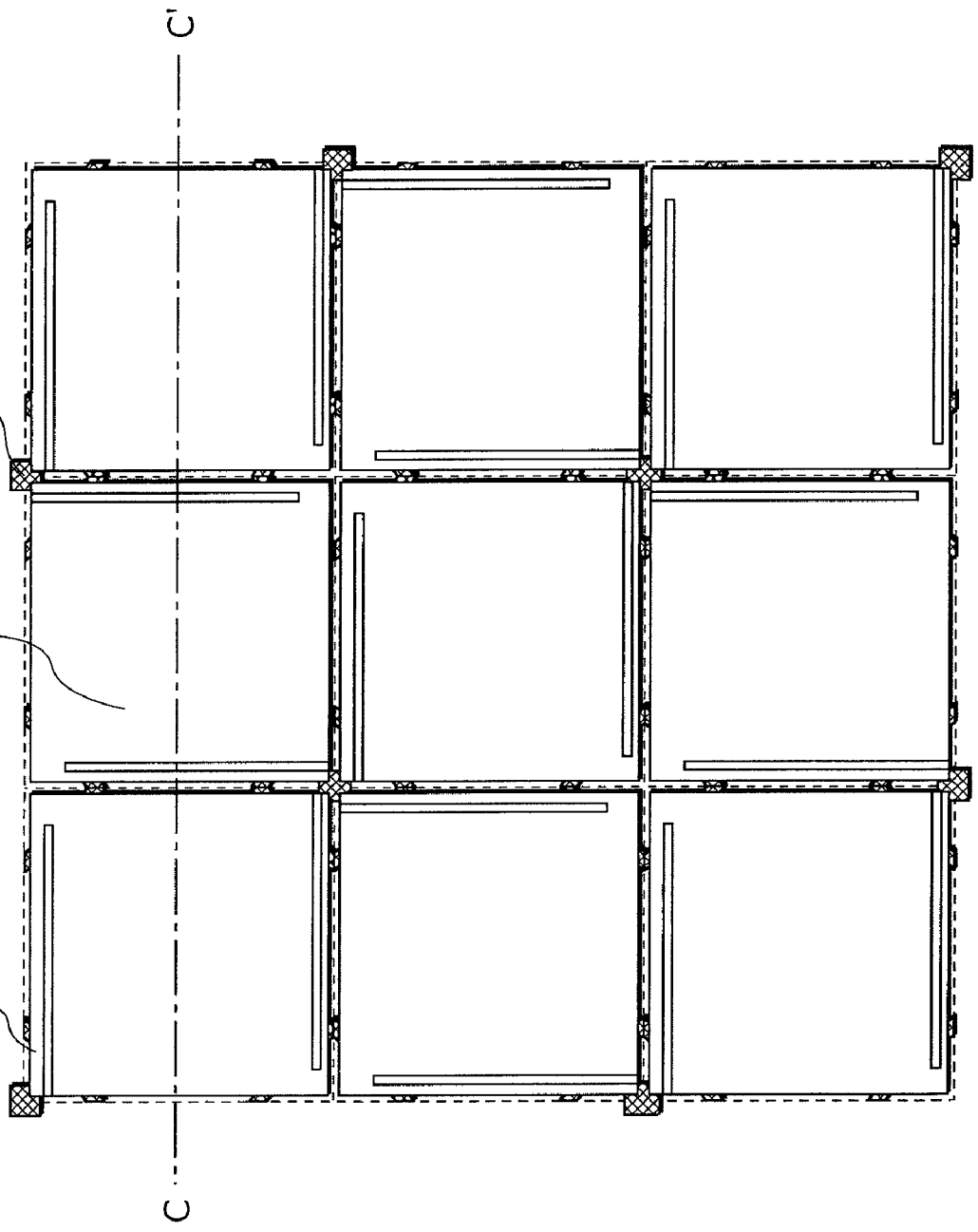
FIG. 24 is a diagram showing an example of a top view of solid-state imaging devices in which a function for detecting infrared light is integrated above the transparent thin film according to the third embodiment.
Figure 26:
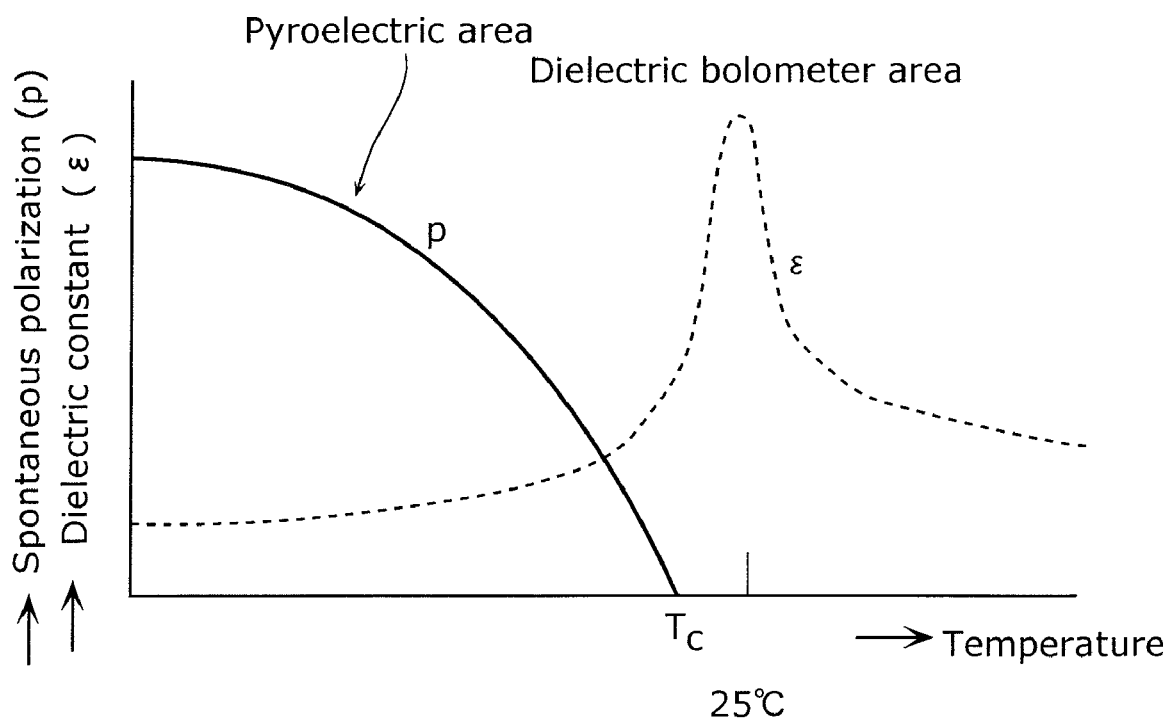
FIG. 26 is a graph schematically showing a function for detecting infrared light which is provided with a solid-state imaging device according to the third embodiment.

FIG. 23 is a schematic cross-sectional view showing a structure of a solid-state imaging device 100 having a transparent thin film 10 and a film structure in which a ferroelectric film 41 is sandwiched between transparent electrodes 42. FIG. 24 is a top view showing unit pixels 101 which are two-dimensionally arranged. Note that FIG. 23 is a cross-sectional view showing the solid-state imaging device 100 taken along the line C-C' in FIG. 24. As shown in FIG. 26, the ferroelectric film 41 has a characteristic that its dielectric constant ε changes when the temperature of the ferroelectric film 41 increases by absorption of infrared light. By converting the change into an electrical signal, radiation from a person in darkness (a band within 4 to 10 μm), for example, can be received, and the radiation can be recognized as an image.

However, even when infrared light which has a wavelength of 4 to 10 μm is received, with high thermal conductance between the pixel units and a substrate, the temperature of the pixel units does not increase and the dielectric constant ε does not change much, resulting in an insufficient signal. In order to avoid this, as shown in FIG. 24, support legs 44 are formed for a pixel unit 43 so as to reduce the thermal conductance. In addition, the supporting structures 11 have a narrow width so as to reduce the thermal conductance. In the present embodiment, as the ferroelectric film 41, Ba $(Ti_{1-x}, Sn_x) O_3$ having a dielectric constant ε which significantly changes at a temperature of about room temperature is used. Also, as the transparent electrodes 42, Indium Tin Oxide (ITO) is used, and as the supporting structures 11, tungsten (W) is used. Since light in a visible light region transmits the ferroelectric film such as Ba $(Ti_{1-x}, Sn_x) O_3$, the visible light can be received by a light-receiving element (Si photodiode) 3, and thus an image both in the infrared region and in the visible light region can be captured.

Next, with reference to FIGS. 25A to 25F, the following will describe a method of forming a film structure in which the ferroelectric film 41 is sandwiched between the transparent electrodes 42 on the transparent thin film 10.

Figure 25A:
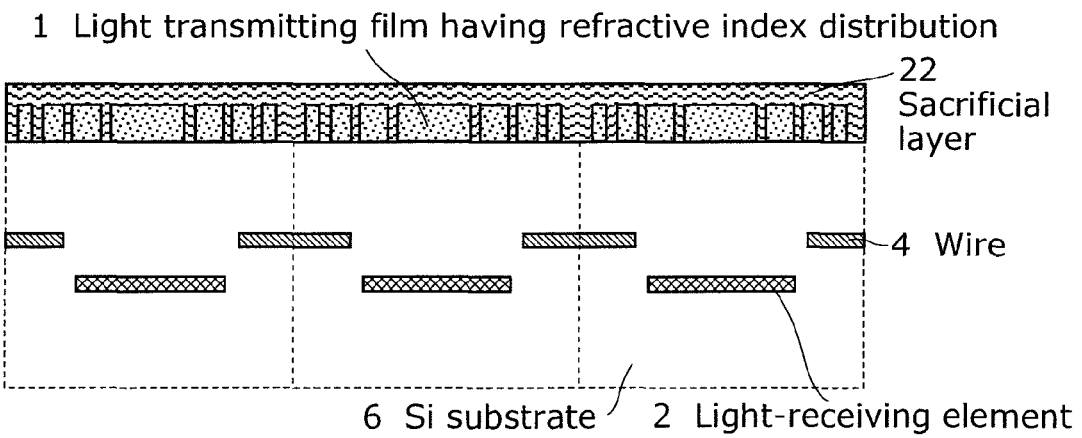
FIG. 25A is a schematic view showing a process of integrating a function for detecting infrared light on a solid-state imaging device according to the third embodiment.

FIG. 25A is a sectional view showing a sacrificial layer 22 which is formed to provide an air gap 12 between a transparent thin film 10 which is not shown in the figure and a light transmitting film 1 having a refractive index distribution.

Figure 25B:
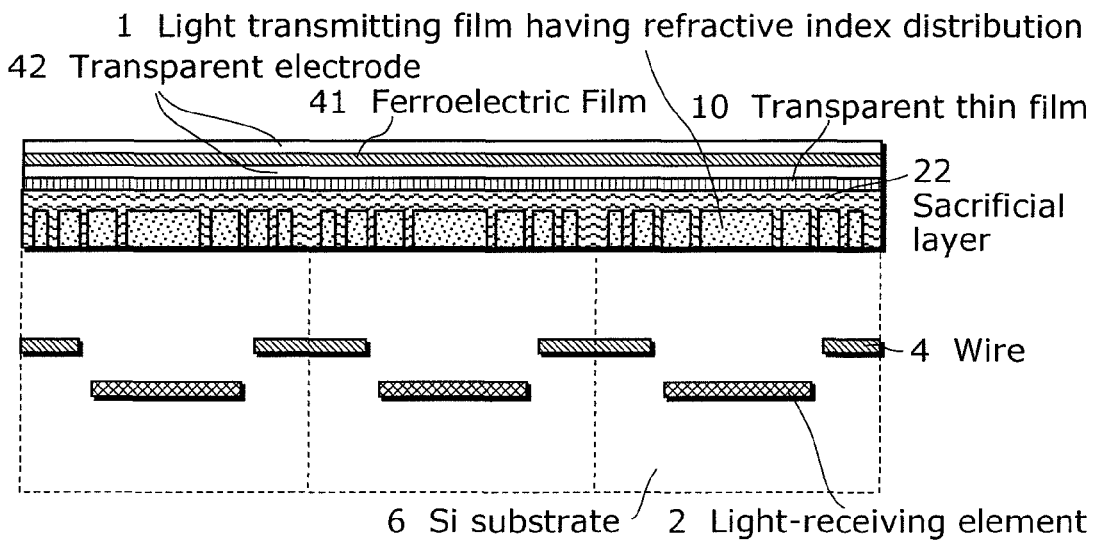
FIG. 25B is a schematic view showing a process of integrating a function for detecting infrared light on a solid-state imaging device according to the third embodiment.

Next, as shown in FIG. 25B, the transparent thin film 10, the transparent electrode 42, and the ferroelectric film 41 are formed on the sacrificial layer 22.

Figure 25C:
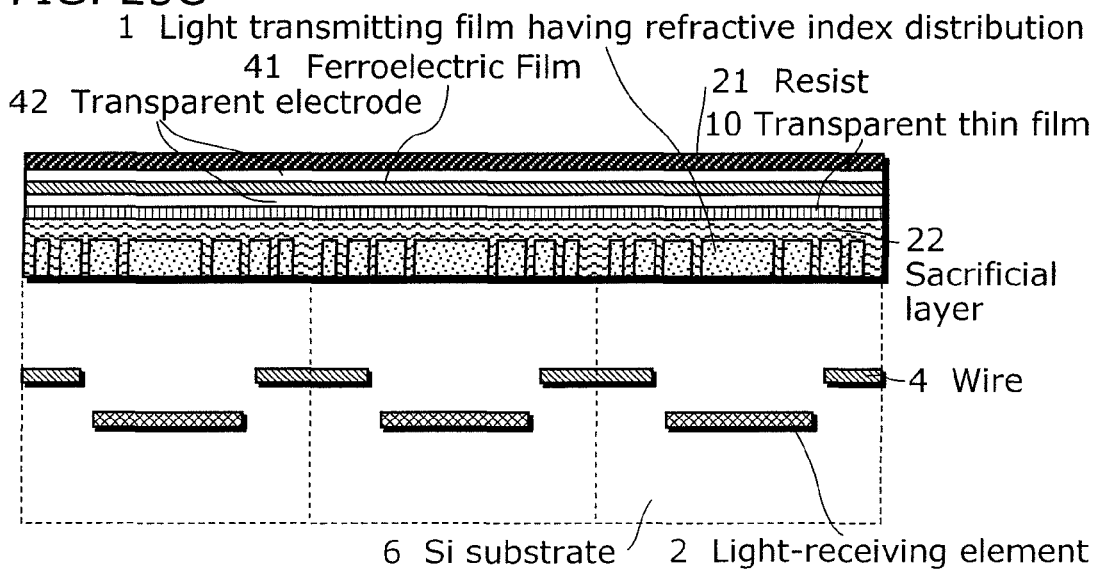
FIG. 25C is a schematic view showing a process of integrating a function for detecting infrared light on a solid-state imaging device according to the third embodiment.
Figure 25D:
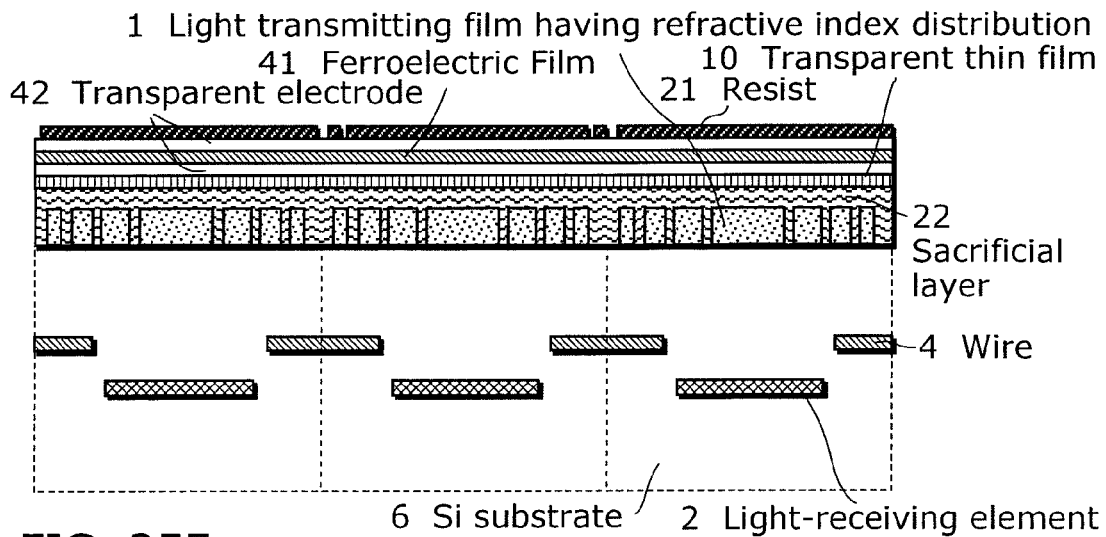
FIG. 25D is a schematic view showing a process of integrating a function for detecting infrared light on a solid-state imaging device according to the third embodiment.

Furthermore, as shown in FIG. 25C and FIG. 25D, a resist 21 is coated, and patterned by lithography.

Figure 25E:
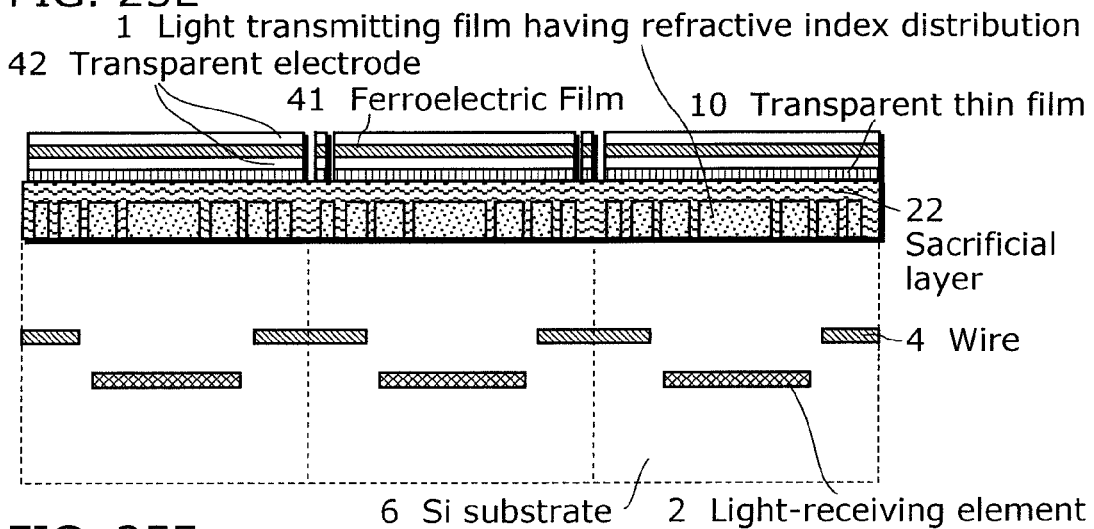
FIG. 25E is a schematic view showing a process of integrating a function for detecting infrared light on a solid-state imaging device according to the third embodiment.

In addition, as shown in FIG. 25E, support legs are formed by dry etching using the patterned resist 21 as a mask, and then the resist is removed.

Figure 25F:
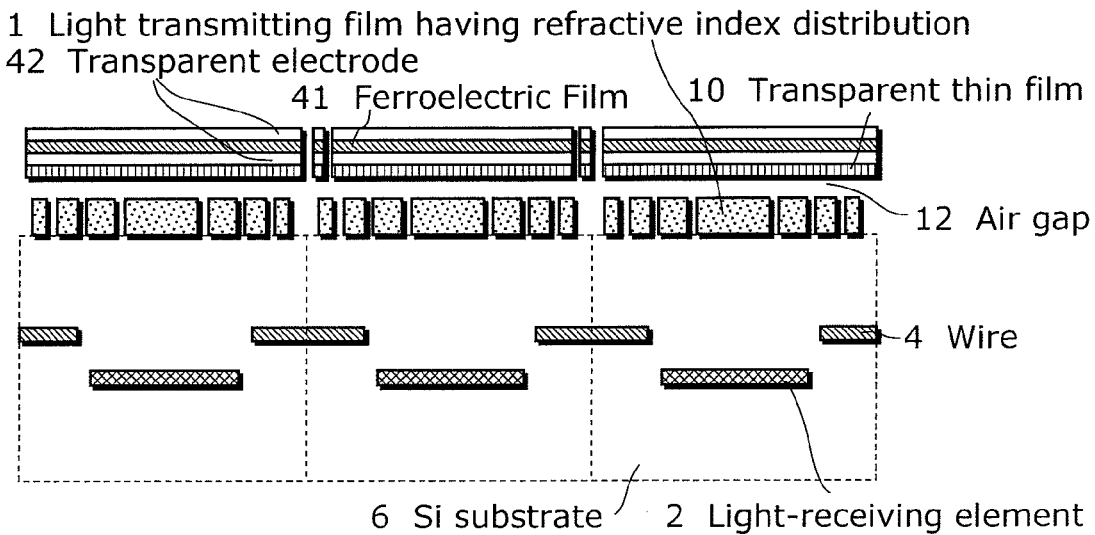
FIG. 25F is a schematic view showing a process of integrating a function for detecting infrared light on a solid-state imaging device according to the third embodiment.

After the removal of the resist 21, as shown in FIG. 25F, the sacrificial layer 22 is removed by isotropic dry etching. It is preferable that the gas used in the etching is $XeF$, $ClF_3$ or the like.

Fourth Embodiment

Now, the following will describe an embodiment, different to the above described third embodiment, in which an infrared light imaging function for capturing an image at night is added.

Figure 27:
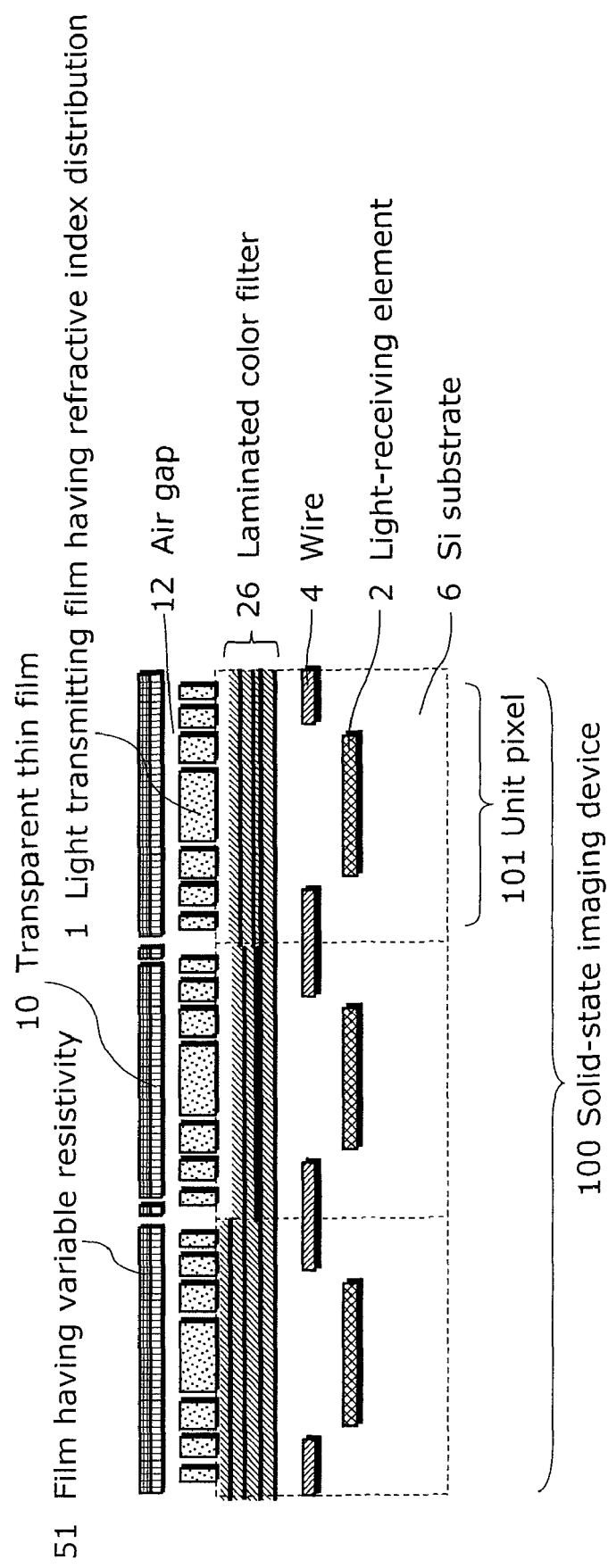
FIG. 27 is a diagram showing an example of a cross sectional view of a solid-state imaging device in which a function for detecting infrared light is integrated on the transparent thin film according to a fourth embodiment.
Figure 28:
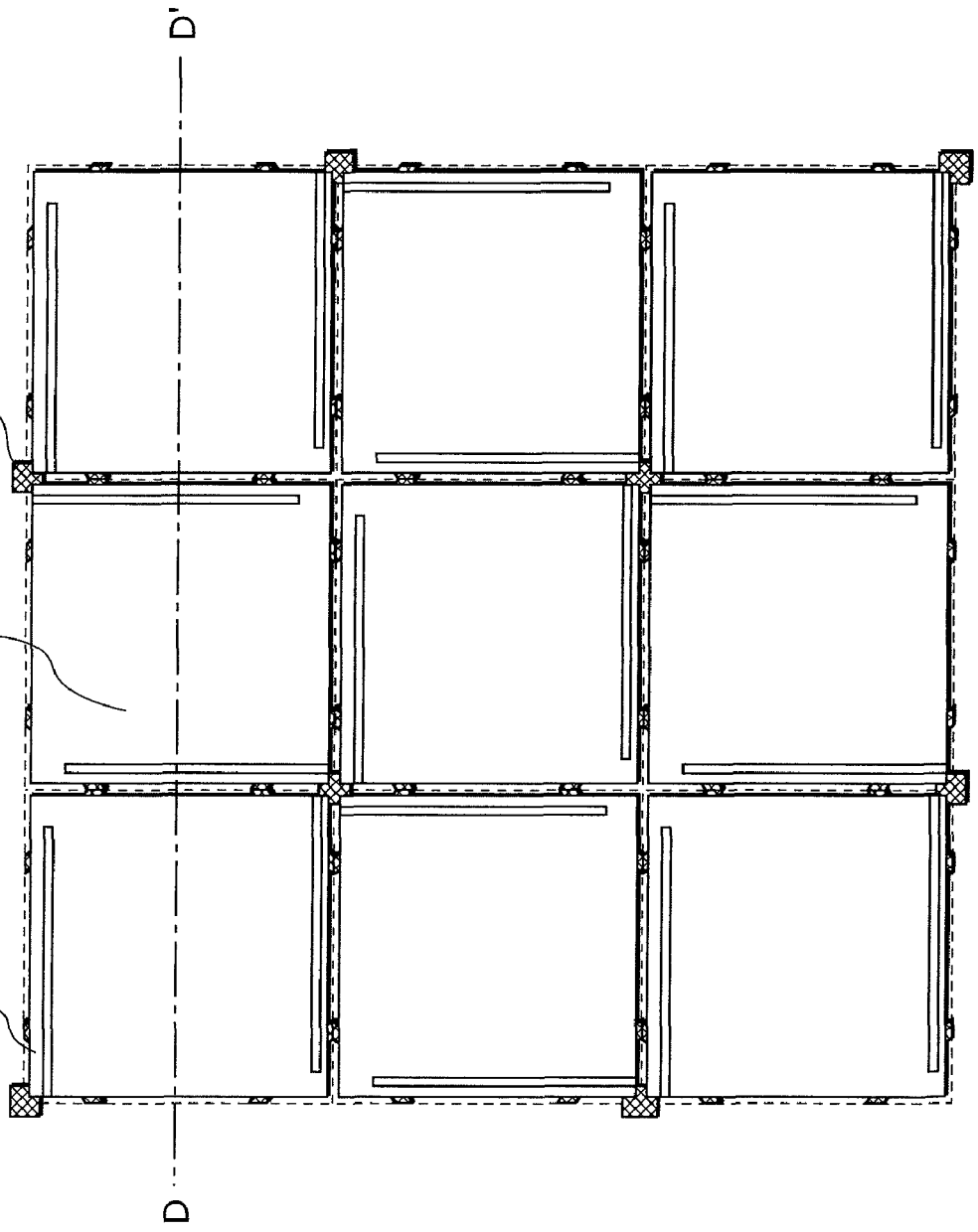
FIG. 28 is a top view showing an example of a top view of solid-state imaging devices in which a function for detecting infrared light is integrated on the transparent thin film according to the fourth embodiment.

FIG. 27 is a schematic cross-sectional view showing a solid-state imaging device 100 which has, on a transparent film 10, a film 51 having a resistivity that varies by absorbing infrared light. FIG. 28 is a top view showing unit pixels 101 which are two-dimensionally arranged. FIG. 27 is a cross-sectional view showing the solid-state imaging device 100 taken along the line D-D' in FIG. 28. The film 51 having the resistivity which varies by absorbing the infrared light has a resistivity p which changes when the temperature of the film 51 increases by absorption of infrared light. By converting the change in an electrical signal, radiation from a person in darkness (a band within 4 to 10 μm), for example, can be received, and the radiation can be recognized as an image.

However, even when infrared light which has a wavelength of 4 to 10 μm is received, with high thermal conductance between the pixel units and a substrate, the temperature of the pixel units does not increase and the resistivity p does not change much, resulting in an insufficient signal. In order to avoid this, as shown in FIG. 28, support legs 54 are provided to a pixel unit 53 to reduce the thermal conductance. Further, the supporting structures 11 have a narrow width so as to reduce the thermal conductance. In the present embodiment, as the film 51 having a resistivity which varies by absorbing infrared light, a $VO_x$ film is used. In addition, since light in a visible light region transmits the $VO_x$ film, the visible light can received by a light receiving-element (Si photodiode) 3, and thus an image both in the infrared region and in the visible light region can be captured.

Next, with reference to FIGS. 29A to 29F, the following will describe a method of forming, under the transparent thin film 10, the film 51 having the resistivity which varies by absorbing infrared light.

Figure 29A:
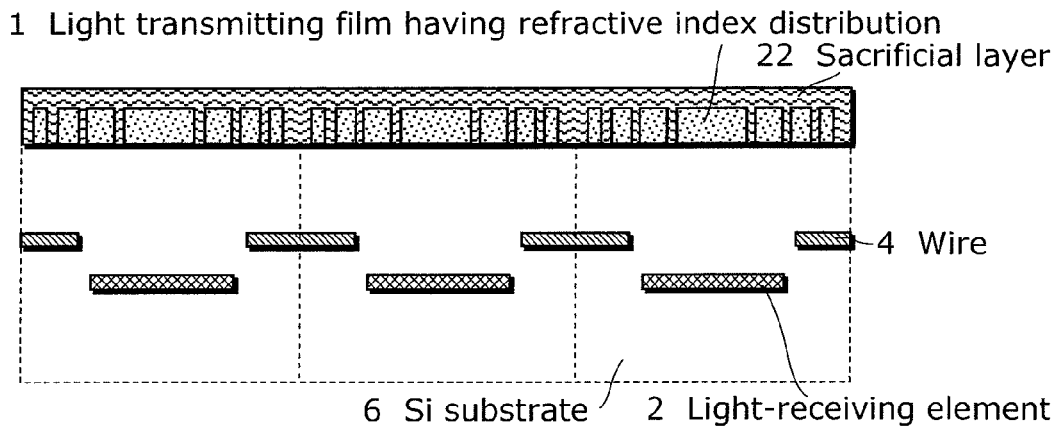
FIG. 29A is a schematic view showing a process of integrating a function for detecting infrared light on a solid-state imaging device according to the fourth embodiment.

FIG. 29A is a cross-sectional view showing a sacrificial layer 22 which is formed to provide an air gap between a film 51, not shown in the figure, having a resistivity which varies by absorbing infrared light and a light transmitting film 1 having a refractive index distribution.

Figure 29B:
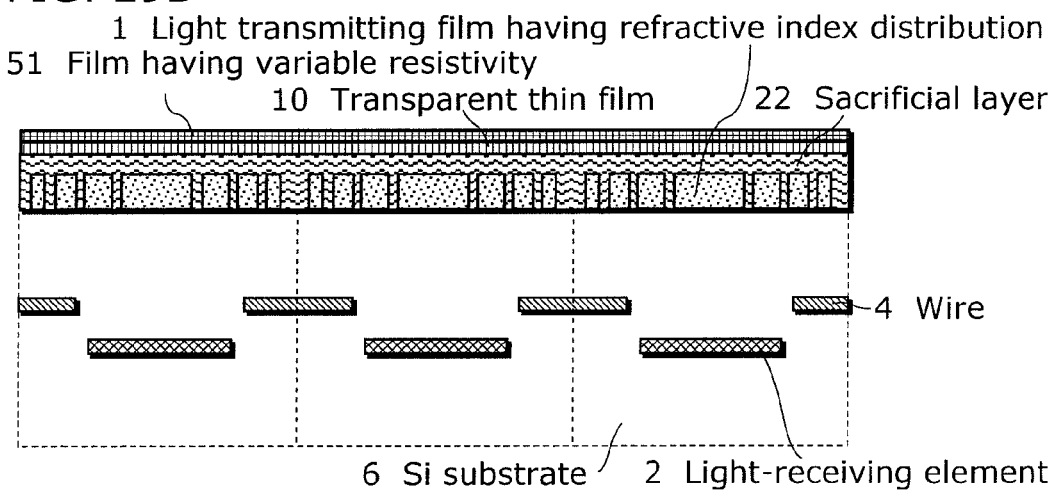
FIG. 29B is a schematic view showing a process of integrating a function for detecting infrared light on a solid-state imaging device according to the fourth embodiment.

Next, as shown in FIG. 29B, the film 51 having the resistivity which varies by absorbing infrared light, and the transparent thin film 10 are formed on the sacrificial layer 22.

Figure 29C:
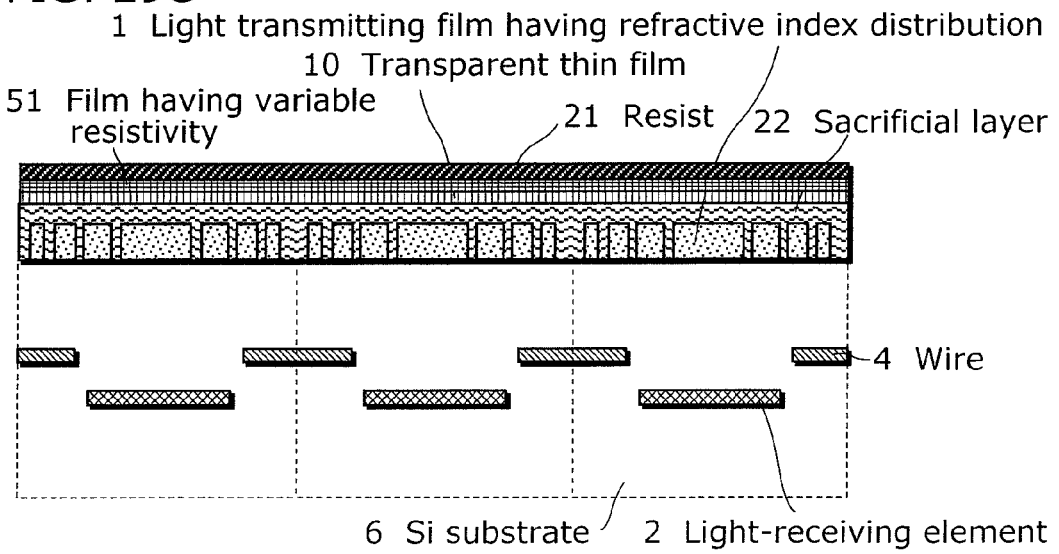
FIG. 29C is a schematic view showing a process of integrating a function for detecting infrared light on a solid-state imaging device according to the fourth embodiment.
Figure 29D:
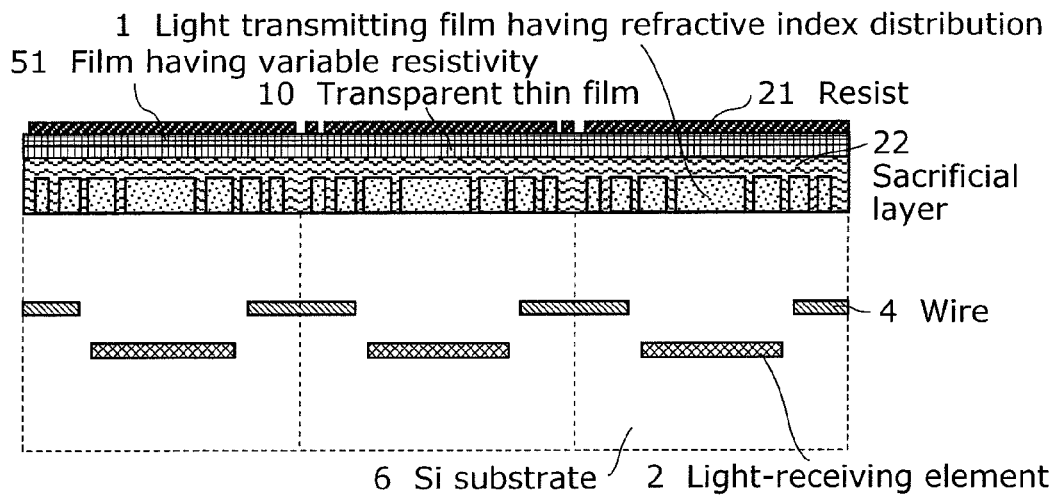
FIG. 29D is a schematic view showing a process of integrating a function for detecting infrared light on a solid-state imaging device according to the fourth embodiment.

Furthermore, as shown in FIG. 29C and FIG. 29D, the film 51 having the resistivity which varies by absorbing infrared light is coated with a resist 21, and the resist 21 is patterned by lithography.

Figure 29E:
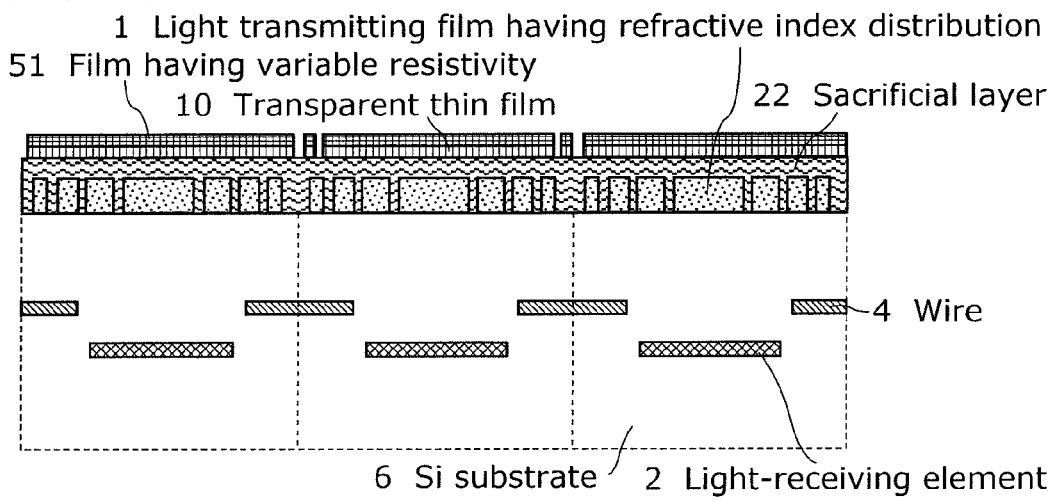
FIG. 29E is a schematic view showing a process of integrating a function for detecting infrared light on a solid-state imaging device according to the fourth embodiment.

Then, as shown in FIG. 29E, support legs are formed by dry etching the film 51 having a resistivity which varies by absorbing infrared light and the transparent thin film 10 using the patterned resist 21 as a mask, and then the resist 21 is removed.

Figure 29F:
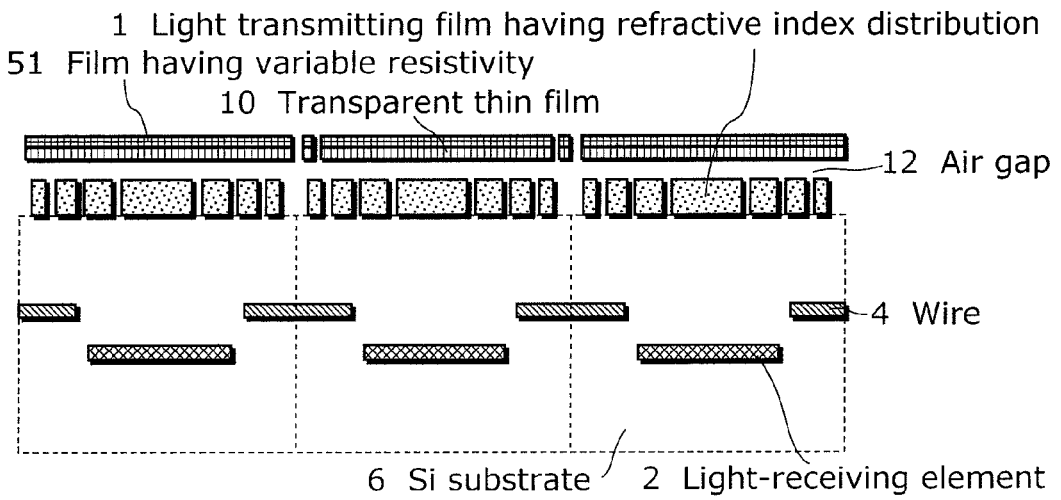
FIG. 29F is a schematic view showing a process of integrating a function for detecting infrared light on a solid-state imaging device according to the fourth embodiment.

After the removal of the resist 21, as shown in FIG. 29F, the sacrificial layer 22 is removed by isotropic dry etching. It is preferable that the gas used in the etching is $XeF$, $ClF_3$, or the like.

Fifth Embodiment

FIG. 31 is a schematic cross-sectional view showing a solid-state imaging device 100 according to the present embodiment. The solid-state imaging device 100 is an imaging device which is applied to a digital still camera or a mobile phone having a built-in camera, and includes unit pixels 101 (pixel size □ 2.2 μm) which are two-dimensionally arranged. Each of the unit pixels 101 has a light-collecting element 71, a light receiving-element (Si photodiode) 2, a wire 4, an Si substrate 6, a transparent thin film 10, and a supporting structure 11.

Figure 32:
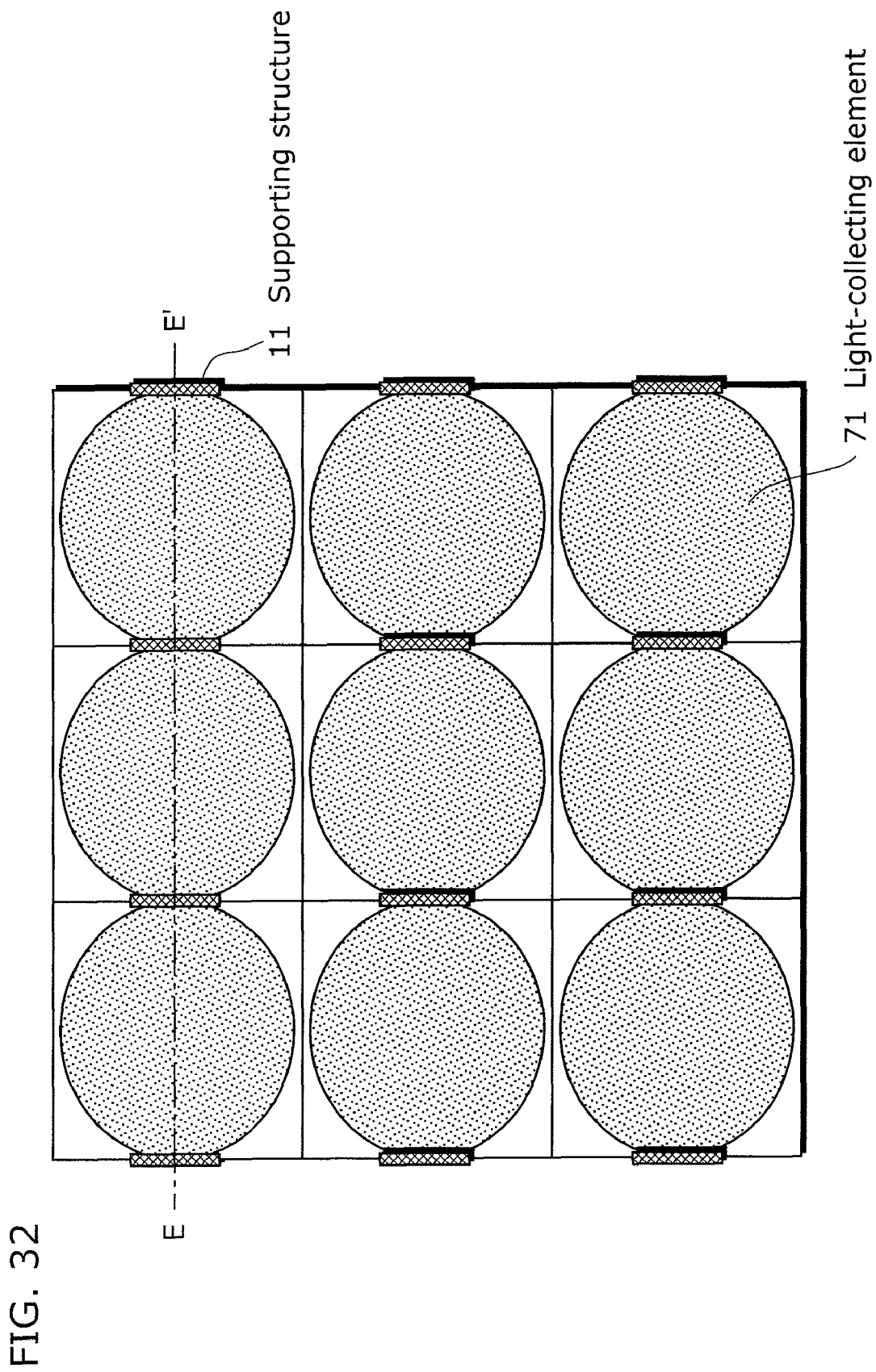
FIG. 32 is a schematic top view showing the solid-state imaging device according to the fifth embodiment.

FIG. 32 is a diagram showing the unit pixels 101 (pixel size □ 2.2 μm) which are two-dimensionally arranged. FIG. 31 is the cross-sectional view showing the solid-state imaging device 100 taken along the line E-E' in FIG. 32.

As shown in FIG. 31, the light-collecting element 71 is protected by the transparent thin film 10 so that no dust and the like adheres to the light-collecting element 71, and even when any dust adheres to the imaging apparatus at the time of equipping the solid-state imaging device 100, the dust can be removed by cleaning the transparent thin film 10. In addition, since the air gap 12 is formed between the transparent thin film 10 and the light-collecting element 71, any influence of the transparent thin film 10 onto the refractive index distribution of the light-collecting element 71 can be prevented.

In addition, since the transparent thin film 10 is formed above the light-collecting element 71, various function elements can be formed on the transparent thin film 10.

Next, with reference to FIGS. 33A to 33M, a method of forming the transparent thin film 10 on the light-collecting element 71 will be explained below.

Figure 33A:
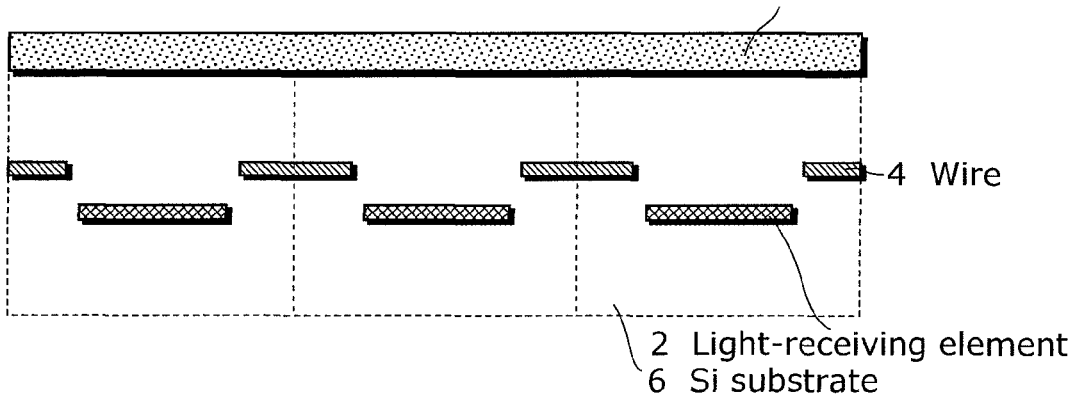
FIG. 33A is a schematic view showing a process of integrating a function element on the solid-state imaging device according to the fifth embodiment.

FIG. 33A is a diagram showing a light-collecting element material 72, which is to be the light collecting-element 71, formed on the Si substrate 6 having basic functions of the imaging device such as the light receiving-element (Si photodiode) 2 and the wire 4. As the light-collecting element material 72, a plasma TEOS ($SiO_2$) film having a thickness of 2 μm is used.

Figure 33B:
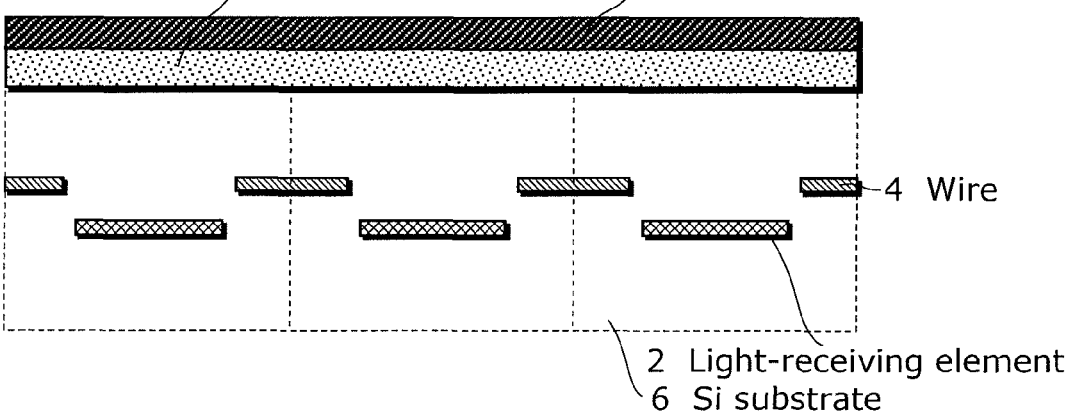
FIG. 33B is a schematic view showing a process of integrating a function element on the solid-state imaging device according to the fifth embodiment.
Figure 33C:
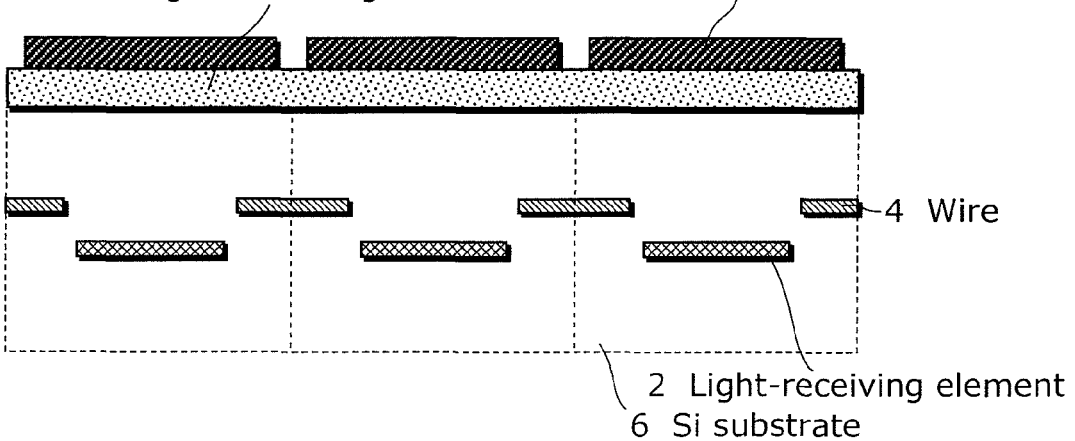
FIG. 33C is a schematic view showing a process of integrating a function element on the solid-state imaging device according to the fifth embodiment.
Figure 33D:
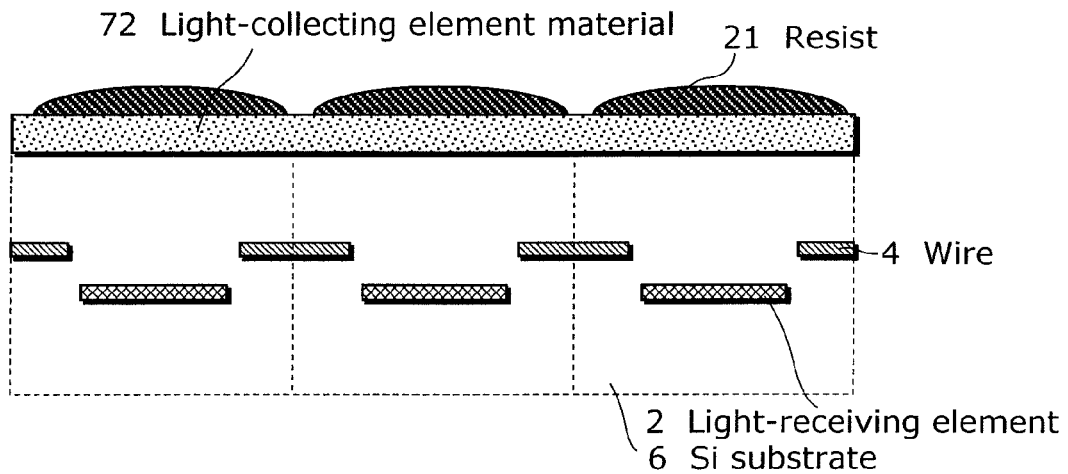
FIG. 33D is a schematic view showing a process of integrating a function element on the solid-state imaging device according to the fifth embodiment.
Figure 33E:
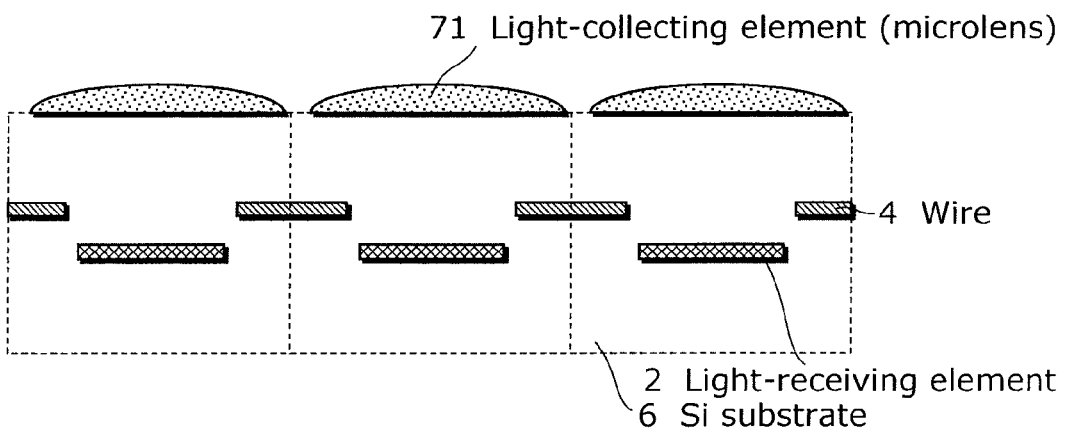
FIG. 33E is a schematic view showing a process of integrating a function element on the solid-state imaging device according to the fifth embodiment.

Next, in order to pattern the light-collecting element material 72 to form a light-collecting element 71, as shown in FIG. 33B and FIG. 33C, the light collecting-element material 72 is coated with a resist 21, and the resist 21 is patterned by lithography. Next, as shown in FIG. 33D, the resist 21 is heated to have a lens shape by reflow. Next, as shown in FIG. 33E, a plasma TEOS film ($SiO_2$) is etched back using a CF based gas with the patterned resist 21 as a mask, and then the resist 21 is removed. In this way, a light-collecting element having a desired shape can be obtained.

Figure 33F:
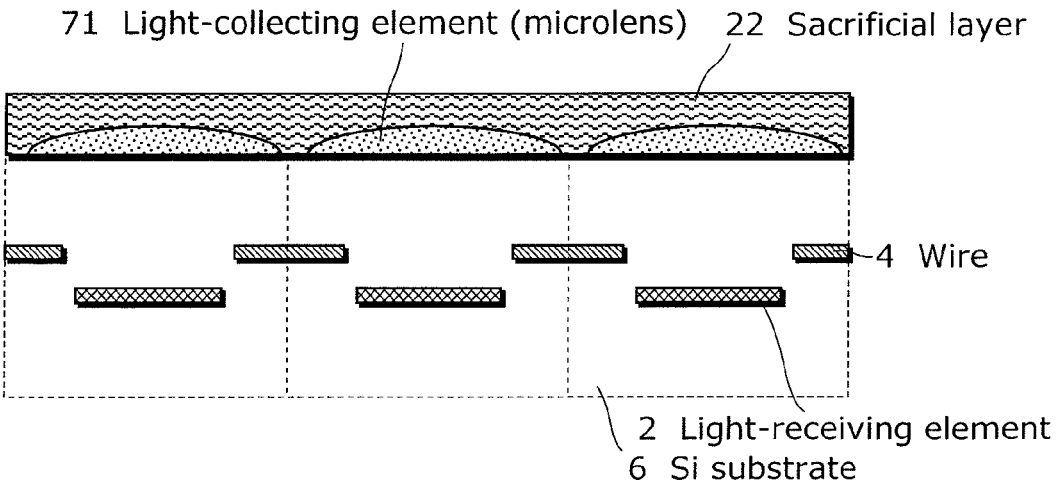
FIG. 33F is a schematic view showing a process of integrating a function element on the solid-state imaging device according to the fifth embodiment.
Figure 33G:
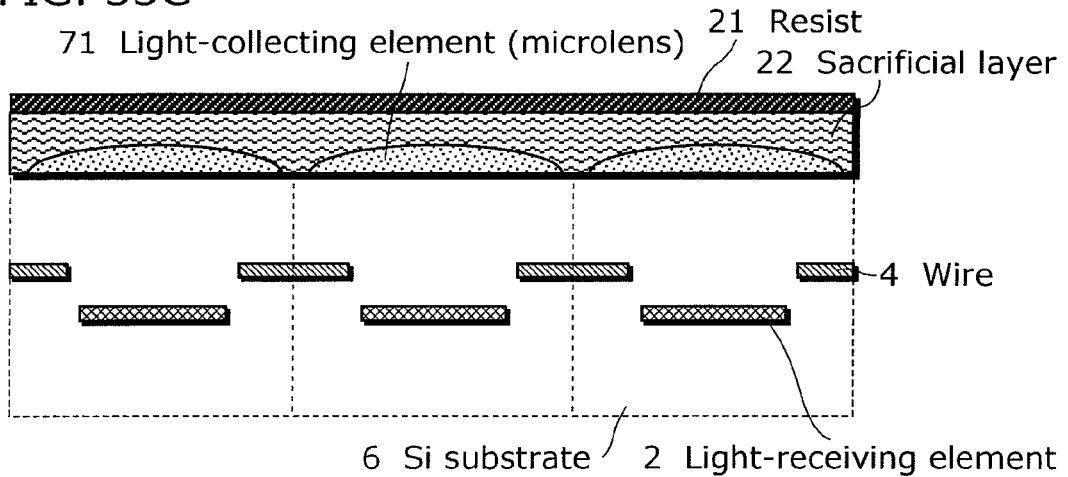
FIG. 33G is a schematic view showing a process of integrating a function element on the solid-state imaging device according to the fifth embodiment.
Figure 33H:
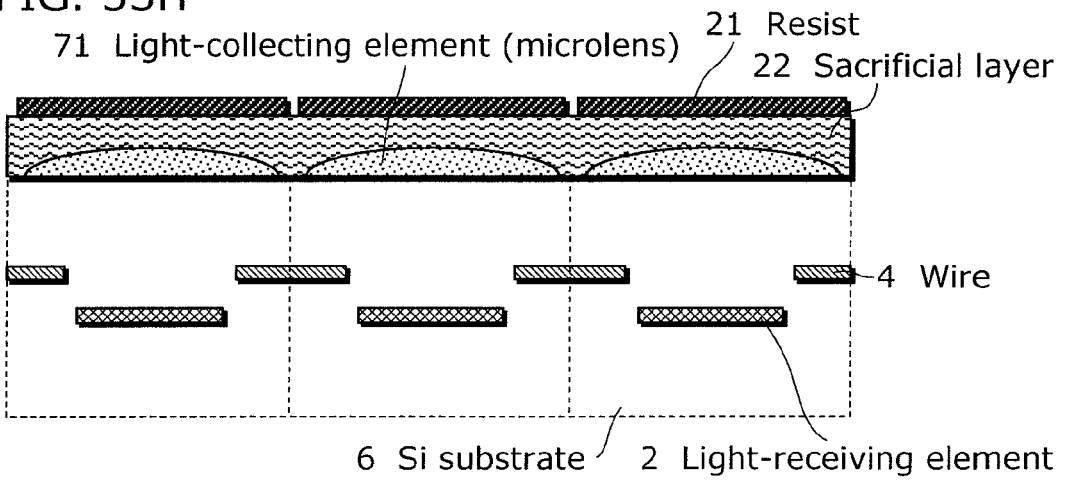
FIG. 33H is a schematic view showing a process of integrating a function element on the solid-state imaging device according to the fifth embodiment.
Figure 33I:
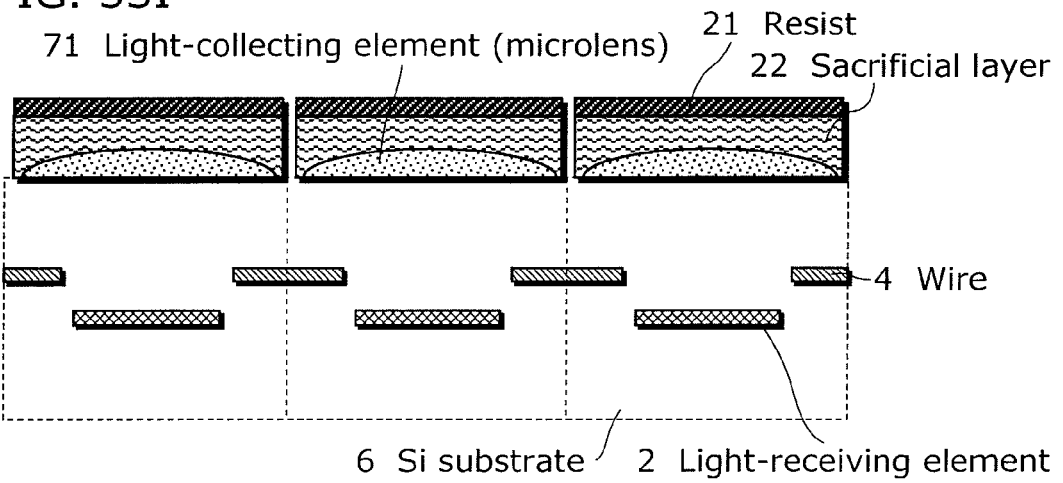
FIG. 33I is a schematic view showing a process of integrating a function element on the solid-state imaging device according to the fifth embodiment.
Figure 33J:
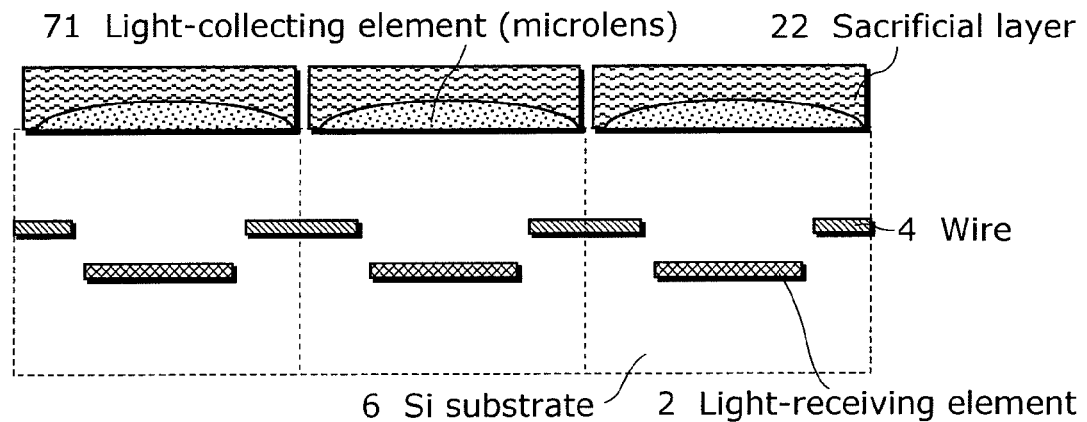
FIG. 33J is a schematic view showing a process of integrating a function element on the solid-state imaging device according to the fifth embodiment.
Figure 33K:
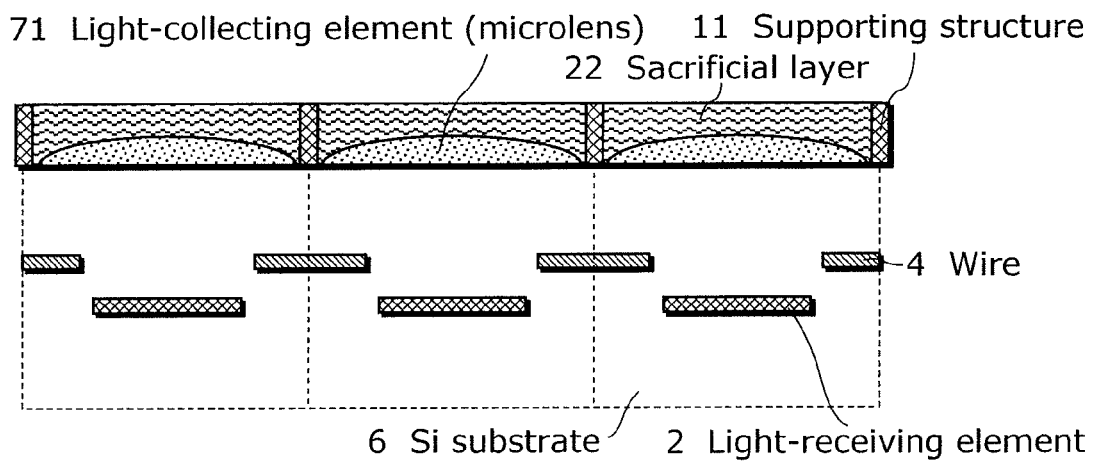
FIG. 33K is a schematic view showing a process of integrating a function element on the solid-state imaging device according to the fifth embodiment.

Furthermore, a sacrificial layer 22 is formed to provide the air gap 12 between the light-collecting element 71 and the transparent thin film 10. As the sacrificial layer, polysilicon is used. As shown in FIG. 33F, the polysilicon film is deposited, as a sacrificial layer, on the light-collecting element 71 by plasma CVD, and is planarized by CMP.

Then, in order to form the supporting structure 11, the sacrificial layer 22 is patterned. As shown in FIGS. 33G to 33J, the sacrificial layer 22 is coated with the resist 21, and the resist 21 is patterned by lithography. With the patterned resist 21 as a mask, the polysilicon film is dry etched using a Cl based gas or an HBr based gas for example, to form grooves for forming the supporting structures 11, and then the resist 21 is removed.

After the removal of the resist 21, a material, such as $SiO_2$, SiN, a metal, a dielectric material, having a high etching selection ratio to polysilicon is formed by sputtering, CVD, or deposition for example, and is planarized by CMP. In the present embodiment, as the supporting structure 11, $SiO_2$ is used. The supporting structure 11 which is to be embedded has a height higher than the thickness of the light-collecting element material 72.

Figure 33L:
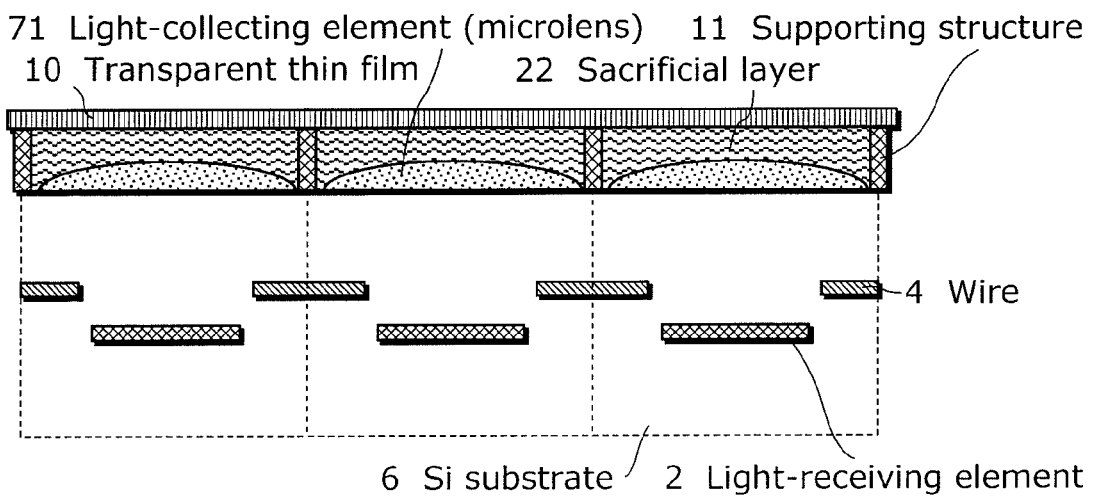
FIG. 33L is a schematic view showing a process of integrating a function element on the solid-state imaging device according to the fifth embodiment.

Next, as shown in FIG. 33L, a film which is to be the transparent thin film 10 is formed on the sacrificial layer 22.

Figure 33M:
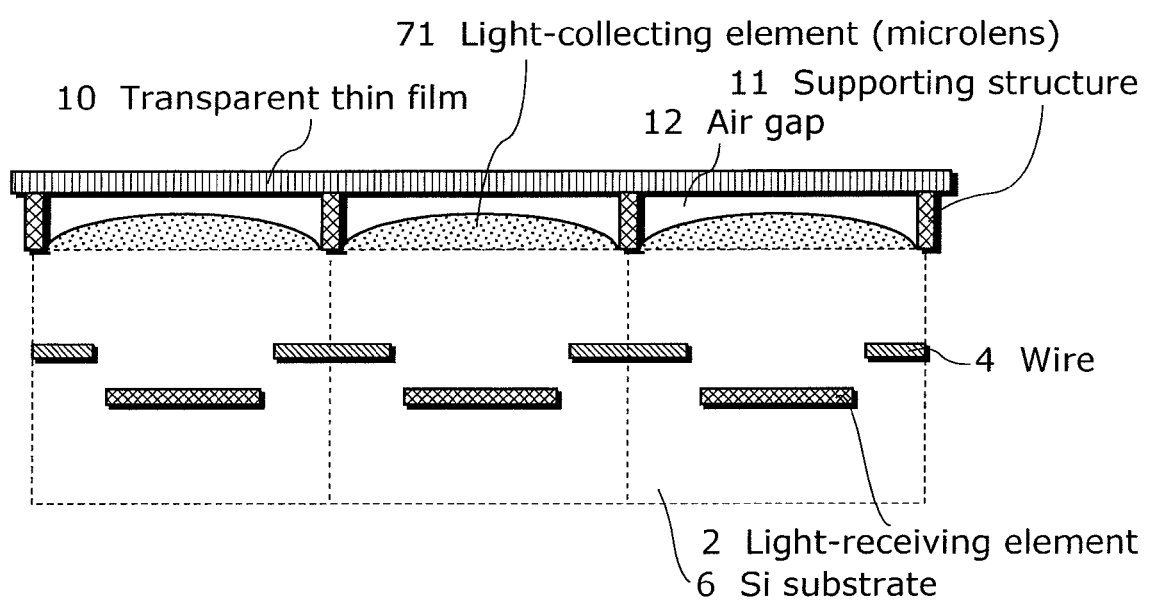
FIG. 33M is a schematic view showing a process of integrating a function element on the solid-state imaging device according to the fifth embodiment.

Furthermore, as shown in FIG. 33M, the sacrificial layer 22 is removed by isotropic dry etching. It is preferable that the gas used in the etching is $XeF$, $ClF_3$ or the like.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within scope of this invention.

INDUSTRIAL APPLICABILITY

A solid-state imaging device of the present invention can be applied to an apparatus having an imaging function such as digital video cameras, digital still cameras, or mobile phones having a built-in camera, and is useful in the industry.

What is claimed is:

1. A solid-state imaging device, comprising:
a light collector which collects incident light; and
a transparent thin film formed above said light collector, wherein
an air gap is formed between said light collector and said transparent thin film, said light-collector being a light transmitting film having a concentric structure divided by a linewidth that is one of equal to and less than a wavelength of the incident light.

2. The solid-state imaging device according to claim 1, wherein said transparent thin film further includes at least two holes through which a gas one of flows into and out of said air gap.

3. The solid-state imaging device according to claim 2, wherein said air gap is a vacuum, and
said holes of said transparent thin film are sealed.

4. The solid-state imaging device according to claim 2, wherein said air gap is filled with an inert gas, and
said holes of said transparent thin film are sealed.

5. The solid-state imaging device according to claim 1, wherein a thin film is formed on said transparent thin film, said thin film having a refractive index different from a refractive index of said transparent thin film.

6. The solid-state imaging device according to claim 1, wherein a multilayer structure is formed on said transparent thin film, said multilayer structure including at least three layers.

7. The solid-state imaging device according to claim 1, wherein cone structures are formed on said transparent thin film, said cone structures each having a diameter smaller than a wavelength of the incident light.

8. The solid-state imaging device according to claim 1, further comprising:
a supporting structure which is bonded to said transparent thin film and has a height higher than a height of said light collector.

9. The solid-state imaging device according to claim 8, wherein said supporting structure is made of metal.

10. The solid-state imaging device according to claim 8, wherein said supporting structure is made of a dielectric material.

11. The solid-state imaging device according to claim 10, wherein said supporting structure further includes a plurality of holes each having a diameter smaller than a wavelength of the incident light.

12. The solid-state imaging device according to claim 8, wherein said supporting structure is made of a piezoelectric material, and
said supporting structure is connected to an oscillator.

13. The solid-state imaging device according to claim 12, wherein the piezoelectric material is a ferroelectric material.

14. The solid-state imaging device according to claim 12, wherein a transparent electrode is formed under said transparent thin film.

15. A cameras comprising a solid-state imaging device, wherein said solid-state imaging device includes:
a light collector which collects incident light; and
a transparent thin film formed above said light collector, wherein an air gap is formed between said light collector and said transparent thin film, said light-collector being a light transmitting film having a concentric structure divided by a linewidth that is one of equal to and less than a wavelength of the incident light.

* * * * *